(12) United States Patent
Han et al.

(10) Patent No.: US 10,115,451 B2
(45) Date of Patent: *Oct. 30, 2018

(54) MEMORY DEVICE COMPRISING ELECTRICALLY FLOATING BODY TRANSISTOR

(71) Applicant: Zeno Semiconductor, Inc., Sunnyvale, CA (US)

(72) Inventors: Jin-Woo Han, San Jose, CA (US); Neal Berger, Cupertino, CA (US); Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/712,041

(22) Filed: Sep. 21, 2017

(65) Prior Publication Data

US 2018/0012646 A1  Jan. 11, 2018

Related U.S. Application Data

(60) Division of application No. 15/287,903, filed on Oct. 7, 2016, now Pat. No. 9,799,392, which is a
(Continued)

(51) Int. Cl.
*G11C 16/08* (2006.01)
*G11C 11/4096* (2006.01)
(Continued)

(52) U.S. Cl.
CPC ........ *G11C 11/4096* (2013.01); *G11C 11/401* (2013.01); *G11C 11/4076* (2013.01);
(Continued)

(58) Field of Classification Search
CPC .............. G11C 14/4096; G11C 11/401; G11C 11/4076; G11C 29/50; G11C 5/06;
(Continued)

(56) References Cited

U.S. PATENT DOCUMENTS 4,300,212 A    11/1981  Simko
4,959,812 A     9/1990  Momodomi et al.
(Continued)

OTHER PUBLICATIONS

Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
(Continued)

*Primary Examiner* — Ly D Pham
(74) *Attorney, Agent, or Firm* — Law Office of Alan W. Cannon

(57) ABSTRACT

A semiconductor memory instance is provided that includes an array of memory cells. The array includes a plurality of semiconductor memory cells arranged in at least one column and at least one row. Each of the semiconductor memory cells includes a floating body region configured to be charged to a level indicative of a state of the memory cell. Further includes are a plurality of buried well regions, wherein each of the buried well regions can be individually selected, and a decoder circuit to select at least one of the buried well regions.

11 Claims, 59 Drawing Sheets

Related U.S. Application Data continuation of application No. 14/825,268, filed on Aug. 13, 2015, now Pat. No. 9,496,053.

(60) Provisional application No. 62/058,892, filed on Oct. 2, 2014, provisional application No. 62/051,759, filed on Sep. 17, 2014, provisional application No. 62/038,188, filed on Aug. 15, 2014.

(51) Int. Cl.

| | | |
|---|---|---|
| G11C 11/401 | (2006.01) | |
| G11C 29/50 | (2006.01) | |
| G11C 11/4076 | (2006.01) | |
| H01L 27/108 | (2006.01) | |
| G11C 8/12 | (2006.01) | |
| G11C 8/10 | (2006.01) | |
| G11C 16/04 | (2006.01) | |
| G11C 8/00 | (2006.01) | |
| G11C 5/06 | (2006.01) | |

(52) U.S. Cl.
CPC ........ G11C 29/50 (2013.01); H01L 27/10802 (2013.01); *G11C 5/06* (2013.01); *G11C 8/00* (2013.01); *G11C 8/10* (2013.01); *G11C 8/12* (2013.01); *G11C 16/0416* (2013.01); *G11C 16/08* (2013.01); *G11C 2211/4016* (2013.01)

(58) Field of Classification Search
CPC .... G11C 8/00; G11C 8/10; G11C 8/12; G11C 16/0416; G11C 16/08; G11C 2211/4016; G01L 27/10802
USPC .......................................................... 365/51
See application file for complete search history.

(56) References Cited

U.S. PATENT DOCUMENTS

| | | |
|---|---|---|
| 5,365,477 A | 11/1994 | Cooper, Jr. et al. |
| 5,465,249 A | 11/1995 | Cooper, Jr. et al. |
| 5,519,831 A | 5/1996 | Holzhammer |
| 5,581,504 A | 12/1996 | Chang |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,277,689 B1 | 8/2001 | Wong |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,835,979 B1 | 12/2004 | Liu et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,030,435 B2 | 4/2006 | Gnadinger |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,376,006 B2 | 5/2008 | Bednorz et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Mathew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,281,022 B2 | 3/2016 | Louie et al. |
| 9,368,625 B2 | 6/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,460,790 B2 | 10/2016 | Widjaja |
| 9,484,082 B2 | 11/2016 | Widjaja |
| 9,490,012 B2 | 11/2016 | Widjaja |
| 9,496,053 B2 | 11/2016 | Han et al. |
| 9,514,803 B2 | 12/2016 | Widjaja et al. |
| 9,524,970 B2 | 12/2016 | Widjaja |
| 9,536,595 B2 | 1/2017 | Louie et al. |
| 9,548,119 B2 | 1/2017 | Han et al. |
| 9,576,962 B2 | 2/2017 | Widjaja et al. |
| 9,589,963 B2 | 3/2017 | Widjaja |

(56) References Cited

U.S. PATENT DOCUMENTS

| | | | |
|---|---|---|---|
| 9,601,493 B2 | 3/2017 | Widjaja |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,578 B2 | 7/2017 | Louie et al. |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,799,392 B2 | 10/2017 | Han et al. |
| 9,812,203 B2 | 11/2017 | Widjaja |
| 9,812,456 B2 | 11/2017 | Widjaja |
| 9,831,247 B2 | 11/2017 | Han et al. |
| 9,847,131 B2 | 12/2017 | Widjaja |
| 2002/0018366 A1 | 2/2002 | Von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2008/0308855 A1 | 12/2008 | El-Kareh et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081941 A1 | 4/2012 | Widjaja et al. |
| 2012/0081976 A1 | 4/2012 | Widjaja et al. |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0264656 A1 | 10/2013 | Widjaja et al. |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0016207 A1 | 1/2015 | Louie et al. |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0200005 A1 | 7/2015 | Han et al. |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0049190 A1 | 2/2016 | Han et al. |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148674 A1 | 5/2016 | Louie et al. |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025164 A1 | 1/2017 | Han et al. |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0076784 A1 | 3/2017 | Louie et al. |
| 2017/0092351 A1 | 3/2017 | Han et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |

OTHER PUBLICATIONS

Campardo G. et al., VLSI Design of Non-Volatile Memories, 2005.
Han et al. Programming/Erasing Characteristics of 45 nm NOR-Type Flash Memory Based on SOI FinFET Structure. vol. 47, Nov. 2005, pp. S564-S567.
Headland. Hot electron injection, Feb. 19, 2004.
Lanyon, et al., "Bandgap Narrowing in Moderately to Heavily Doped Silicon", pp. 1014-1018, No. 7, vol. ED-26, 1979.
Lin, et al., A new 1T DRAM Cell with enhanced Floating Body Effect, pp. 1-5, 2006.

(56) References Cited

OTHER PUBLICATIONS

Oh, et al., A 4-Bit Double SONOS memory (DSM) with 4 Storage Nodes Per Cell for Ultimate Multi-Bit Operation, pp. 1-2, 2006.
Ohsawa et al., An 18.5ns 128Mb SOI DRAM with a Floating body Cell, IEEE International Solid-State Circuits Conference, 2005, pp. 458-459, 609.
Ohsawa, et al. Autonomous refresh of floating body cell (FBC), 2008, pp. 801-804.
Ohsawa, et al. Autonomous refresh of floating-body cell due to current Anomaly of Impact Ionization, 2009, pp. 2302-2311.
Ohsawa et al., Memory Design Using One-Transistor Gain Cell on SOI, Tech. Digest, IEEE International Solid-State Circuits, vol. 37, No. 11, 2002, pp. 1510-1522.
Ohsawa, et al, "A Novel Capacitor-less DRAM Cell: Floating Body Cell", CRC Press, Taylor & Francis Group, 2012, pp. 1-7.
Okhonin, et al. A Capicitor-Less 1T-DRAM Cell, vol. 23, No. 2, Feb. 2002, pp. 85-87.
Okhonin et al. A SOI Capacitor-less 1T-DRAM Concept. 2001, pp. 153-154.
Okhonin, et al., Principles of Transient Charge Pumping on Partially Depleted SOI MOSFETs, IEEE Electron Device Letters, vol. 23, No. 5, May 2002, pp. 279-281.
Rodriguez, et al. "A-RAM: Novel capacitor-less DRAM memory." In SOI Conference, 2009 IEEE International, pp. 1-2. IEEE, 2009.
Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.
Rodriguez, et al. "A-RAM memory cell: concept and operation." Electron Device Letters, IEEE, vol. 31, No. 9 (2010), pp. 972-974.
Robert F. Pierret. Semiconductor Device Fundamentals, ISBN: 0-201-54393-1, 1996, by Addison-Wesley Publishing Company, Inc. PNPN Devices 463-476.
Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.
Rothemund, et al., The importance of being modular, vol. 485, May 2012 pp. 584-585.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitorless 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Tack, et al. "The multistable charge-controlled memory effect in SOI MOS transistors at low temperatures." Electron Devices, IEEE Transactions on 37.5 (1990): 1373-1382.
Terada, et al. "A new VLSI memory cell using capacitance coupling (CC cell)." Electron Devices, IEEE Transactions on 31.9 (1984): pp. 319-1324.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Waser, Rainer, Resistive non-volatile memory devices (Invited Paper), 2009, pp. 1925-1928.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al., "A Novel 1T-1D DRAM Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.

(56) References Cited

OTHER PUBLICATIONS

Chatterjee, et al. "A survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p- and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Kim, et al. Resistive-Memory Embedded Unified RAM (R-URAM, 2009, pp. 2670-2674.
Lu, et al., "A Floating-Body/Gate DRAM Cell Upgraded for Long Retention Time", IEEE Elec. Dev. Letters, vol. 32, No. 5, pp. 731-733, Jun. 2011.
Lu, et al., "A Simplified Superior Floating-Body/Gate DRAM Cell", IEEE Elec. Dev. Letters, vol. 30, No. 3, Mar. 2009, pp. 282-284.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982):337-344.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Mahatme, et al. "Total ionizing dose effects on ultra thin buried oxide floating body memories." Reliability Physics Symposium (IRPS), 2012 IEEE International, 2012, pp. 1-5.
Moon, et al. "An optically assisted program method for capacitorless 1T-DRAM." Electron Devices, IEEE Transactions on, vol. 57, No. 7, 2010, pp 1714-1718.
Moon, et al. "Multi-functional universal device using a band-engineered vertical structure." Electron Devices Meeting (IEDM), 2011 IEEE International. IEEE, 2011, pp. 24-6.
Moon, et al. "Fin-width dependence of BJT-based 1T-DRAM implemented on FinFET." Electron Device Letters, vol. 31, No. 9 (2010): 909-911.
Moon, et al. "Ultimately scaled 20nm unified-RAM." Electron Devices Meeting (IEDM), 2010 IEEE International. IEEE, 2010, pp. 12-2.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Pellizzer et al., A 90nm Phase Change Memory Technology for Stand-Alone Non-Volatile Memory Applications, pp. 1-1, 2006.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica et al. Scaled 1T-Bulk devices built with CMOS 90nm technology for low-cost eDRAM applications. Pascale. mazoyer@st.com, 2005, 38-39.
Reisch, "On bistable behavior and open-base breakdown of bipolar transistors in the avalanche regime-modeling and applications." Electron Devices, IEEE Transactions on 39.6 (1992): 1398-1409.

Floating Body 24 is positively charged and V(BL 18) = 0.0V

FB is neutrally charged: and V(BL 18) = V(FB 24) = 0V

Floating Body 24 is positively charged and V(SL 16) = 0.0V

FB is neutrally charged: and V(SL 16) = V(FB 24) = 0V

MEMORY DEVICE COMPRISING ELECTRICALLY FLOATING BODY TRANSISTOR

CROSS-REFERENCE

This application is a division of co-pending U.S. application Ser. No. 15/287,903, filed Oct. 7, 2016, which is a continuation of U.S. application Ser. No. 14/825,628, filed Aug. 13, 2015, now U.S. Pat. No. 9,496,053, which claims the benefit of U.S. Provisional Application Nos. 62/038,188, filed Aug. 15, 2014; 62/051,759, filed Sep. 17, 2014; and 62/058,892, filed Oct. 2, 2014, each of which applications and patent are hereby incorporated herein, in their entireties, by reference thereto.

FIELD OF THE INVENTION

The present invention relates to semiconductor memory technology. More specifically, the present invention relates to a semiconductor memory device comprising an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "dRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), all of which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002, (all of which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), which are hereby incorporated herein, in their entireties, by reference thereto).

Widjaja and Or-Bach describes a bi-stable SRAM cell incorporating a floating body transistor, where more than one stable state exists for each memory cell (for example as described in U.S. Pat. No. 8,130,548 to Widjaja et al., titled "Semiconductor Memory Having Floating Body Transistor and Method of Operating" ("Widjaja-1"), U.S. Pat. No. 8,077,536, "Method of Operating Semiconductor Memory Device with Floating Body Transistor Using Silicon Controlled Rectifier Principle" ("Widjaja-2"), U.S. Patent Application Publication No. 2013/0264656 A113/746,523, "Memory Device Having Electrically Floating Body Transistor" ("Widjaja-3"), all of which are hereby incorporated herein, in their entireties, by reference thereto). This bi-stability is achieved due to the applied back bias which causes impact ionization and generates holes to compensate for the charge leakage current and recombination.

SUMMARY OF THE INVENTION

A semiconductor memory cell comprising an electrically floating body having two stable states is disclosed. A method of operating the memory cell is disclosed.

In one aspect of the present invention, a semiconductor memory instance is provided that includes an array of memory cells, including a plurality of semiconductor memory cells arranged in at least one column and at least one row. Each semiconductor memory cell includes a floating body region configured to be charged to a level indicative of a state of the memory cell; a plurality of buried well regions, wherein each of the buried well regions can be individually selected; and a decoder circuit to select at least one of the buried well regions.

In at least one embodiment, each memory cell is configured to provide at least two stable states.

In at least one embodiment, each memory cell further comprises a first region in electrical contact with the floating body region and a second region in electrical contact with the floating body region.

In at least one embodiment, each memory cell further comprises a gate positioned between the first and second regions.

In at least one embodiment, an address signal is provided as an input to the decoder circuit to select the buried well region.

In at least one embodiment, a bias to one or more of the buried well regions may be removed, while maintaining bias to others of the buried well regions.

In at least one embodiment, a signal generator circuit is provided to supply bias conditions for operations of the array.

In at least one embodiment, the signal generator circuit provides different ramp rates for read and write operations.

In at least one embodiment, the ramp rates for the read operations are lower than the ramp rates for the write operations.

In another aspect of the present invention, a semiconductor memory instance includes: an array of semiconductor memory cells, the array comprising at least one memory sub-array, each memory sub-array comprising: a plurality of the semiconductor memory cells arranged in at least one column and at least one row, each the semiconductor memory cell comprising: a floating body region configured to be charged to a level indicative of a state of the semiconductor memory cell; a buried well region; and a decoder circuit to select at least one of the at least one memory sub-array.

In at least one embodiment, at least one of the at least one memory sub-array may be selectively disabled.

In at least one embodiment, a bias to the buried well region within one of the at least one memory sub-array may be applied to maintain the states of the semiconductor memory cells in the one of the at least one memory sub-array during a high portion of a clock cycle and turned-off during a low portion of the clock cycle.

In at least one embodiment, each semiconductor memory cell is configured to provide at least two stable states.

In another aspect of the present invention, an integrated circuit device includes an array of semiconductor memory cells, the array comprising: a plurality of the semiconductor memory cells arranged in at least one column and at least one row, each semiconductor memory cell comprising: a floating body region configured to be charged to a level indicative of a state of the semiconductor memory cell, respectively; a plurality of buried well regions, wherein each buried well region can be individually selected; and a decoder circuit to select at least one of the buried well regions.

In at least one embodiment, the integrated circuit device further includes a supply generator circuitry.

In at least one embodiment, each semiconductor memory cell is configured to provide at least two stable states.

In at least one embodiment, the integrated circuit device further includes an address signal as an input to the decoder circuit to select at least one of the buried well regions.

In at least one embodiment, a bias to at least one of the buried well regions may be removed, while maintaining bias to at least one other of the buried well regions.

In at least one embodiment, the integrated circuit device further includes a signal generator circuit to provide bias conditions for operations of the array.

In at least one embodiment, the signal generator circuit provides different ramp rates for read and write operations.

These and other features of the invention will become apparent to those persons skilled in the art upon reading the details of the devices and methods as more fully described below.

DETAILED DESCRIPTION OF THE INVENTION

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a terminal" includes a plurality of such terminals and reference to "the cell" includes reference to one or more cells and equivalents thereof known to those skilled in the art, and so forth.

The publications discussed herein are provided solely for their disclosure prior to the filing date of the present application. The dates of publication provided may be different from the actual publication dates which may need to be independently confirmed.

Figure 1A:
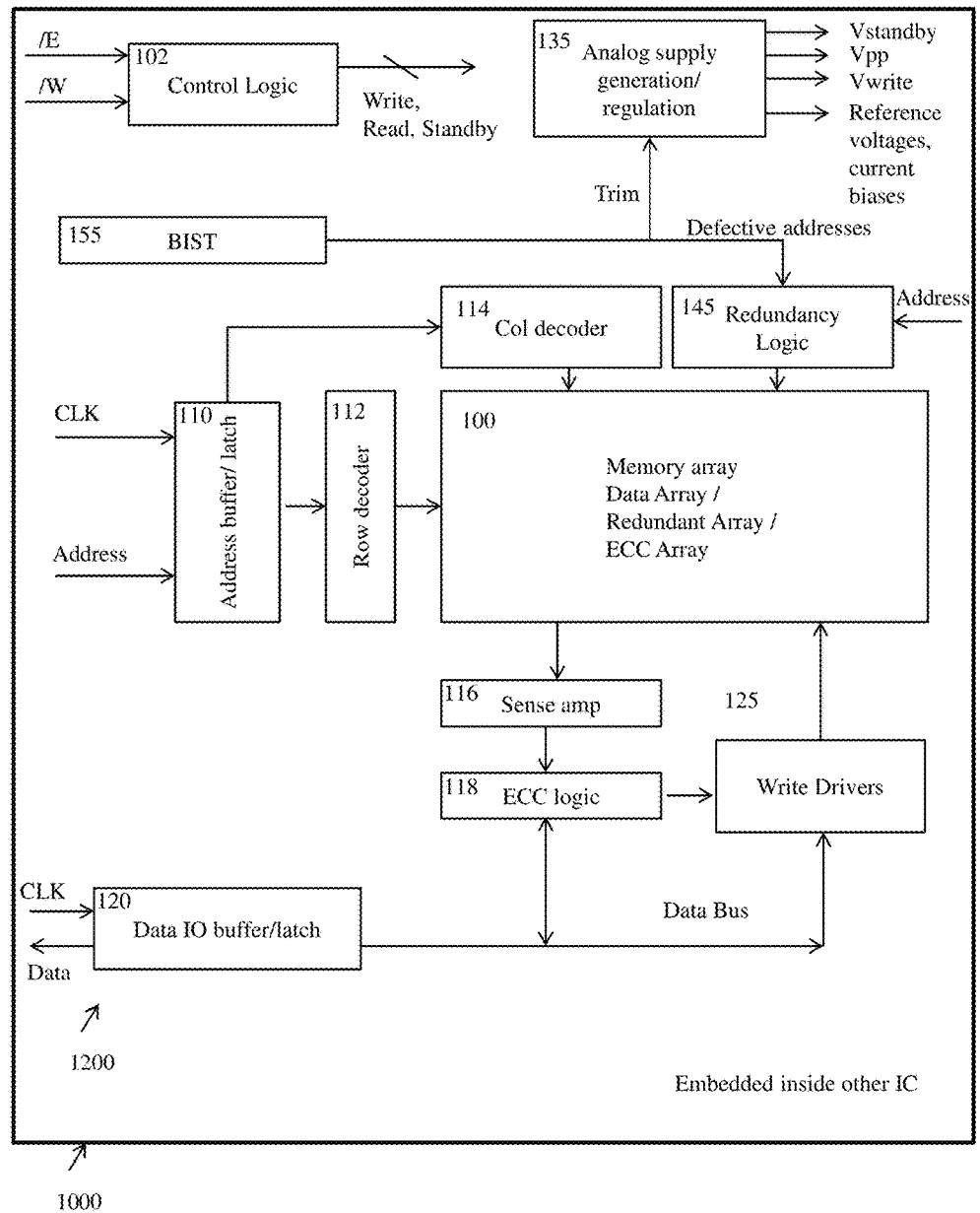
FIG. 1A is a block diagram for a memory instance according to an embodiment of the present invention.

FIG. 1A illustrates a memory instance 1200, comprising memory array 100 and periphery circuitries associated with the memory array 100. Examples of the periphery circuitries are shown in FIG. 1A: control logic 102 which receives for example enable (/E) and write (/W) signals and controls the operation of the memory array; address buffer 110, which transmits the address received to row decoder 112 and column decoder 114; reading circuitry such as sense amplifier 116 and error correction circuit (ECC) 118; data buffer 120, which outputs the read data or transmits the write data into write drivers 125; analog supply generators and/or regulators 135 which provide additional voltage levels needed for the memory array operation; redundancy logic 145 which may be used to increase the yield of the memory instance; built-in-self-test (BIST) 155 which may be used to set the trim levels for the supply generators 135 and/or replace the defective units with redundant array. The memory instance 1200 may be a discrete memory component or it may be embedded inside another integrated circuit device 1000.

Figure 1B:
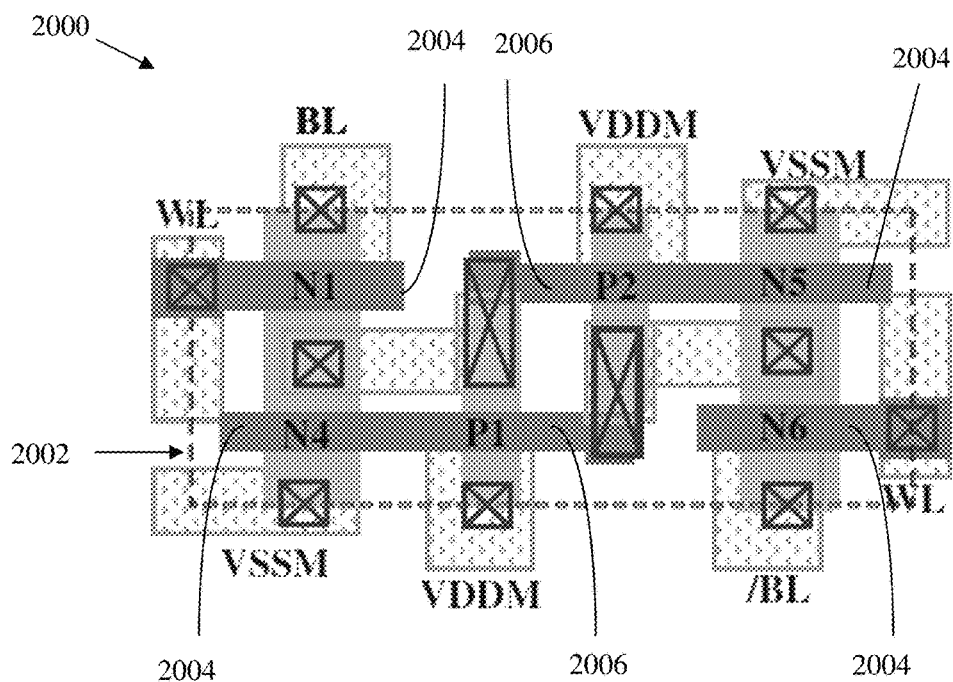
FIG. 1B is a schematic layout view of a prior art 6-transistor SRAM memory cell.

FIG. 1B is a layout view of a six-transistor SRAM cell 2000 (for example as described in "Embedded Memories for Nano-Scale VLSI, K. Zhang (ed.), p. 42). The SRAM unit cell (the basic repeating cell) 2002 is shown inside the dashed line. The SRAM unit cell 2002 comprises 4 n-type transistors 2004 and 2 p-type transistors 2006. The transistors 2004, 2006 are defined by the DIFF layer and the POLY gate. The DIFF layer represents the active area of the transistor (which typically covers the channel region and the source and drain junctions) while the POLY layer represents the region of the materials forming the gate electrode. The area where DIFF and POLY intersects defines the channel region as well as the gate region of the transistors. The POLY layers defining the n-type transistors are labeled as N1, N4, N5, and N6, while the POLY layers defining the p-type transistors are labeled as P1 and P2. As the example in FIG. 1B illustrates, the transistor width (defined by the width of the DIFF layer) varies between the n-type and p-type transistors. The width of the n-type transistors may also be different in another SRAM design to improve the stability and performance of the SRAM cell.

Figure 1C:
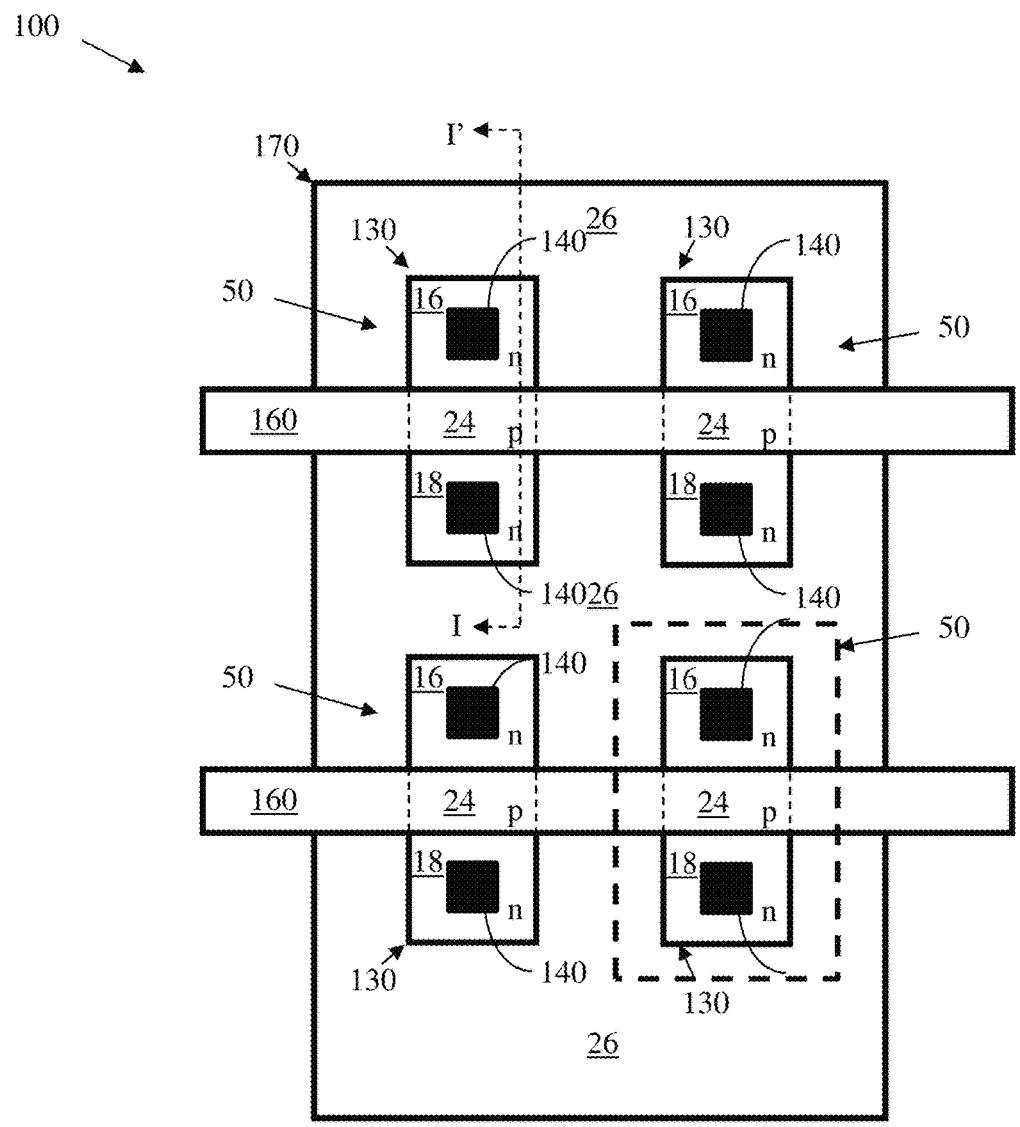
FIG. 1C schematically illustrates a layout view of a memory array according to an embodiment of the present invention.

FIG. 1C illustrates a layout view of an exemplary memory array 100 according to an embodiment of the present invention. The exemplary memory array 100 in FIG. 1C comprises two rows and two columns, where one direction (for example the row direction) is defined by the POLY layers 160 and another direction (for example the column direction) is defined by the long direction of the DIFF layers 130 (or the METAL2 layers 146 in FIG. 4D). There are four memory cells 50 shown in FIG. 1C and the unit cell (the basic repeating cell) is enclosed in dashed lines. Also shown in the layout view of FIG. 1C are CONTACT layer 140, source and drain regions 16 and 18, and floating body region 24 as well as buried well layer 170.

Figure 2:
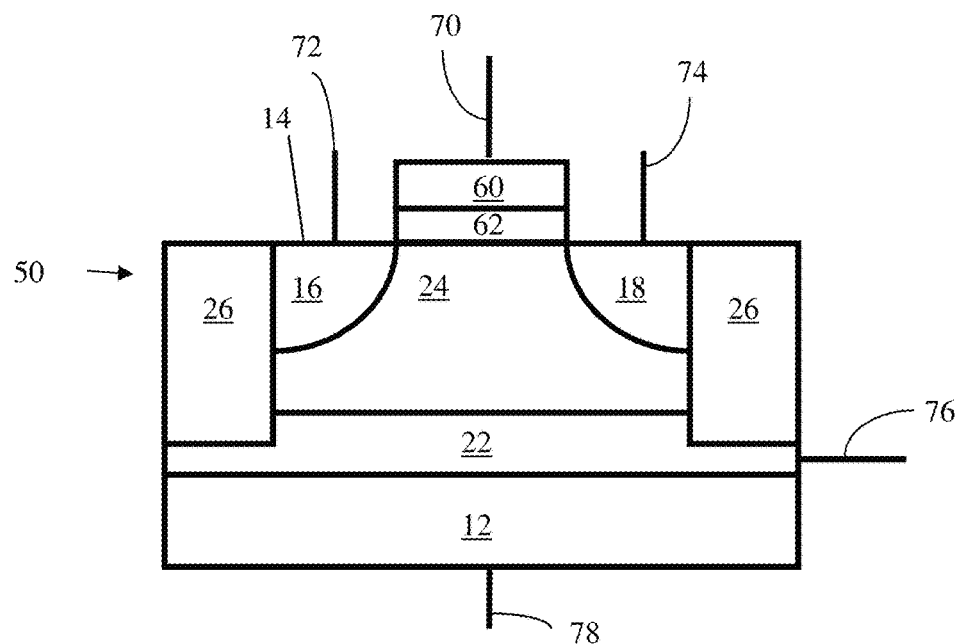
FIGS. 2 and 3 schematically illustrate cross-sectional views of a memory cell according to an embodiment of the present invention.

Referring to FIG. 2, a memory cell 50 according to an embodiment of the present invention is shown. A plurality of memory cells 50 constitute memory array 100 as shown in FIG. 1C. Memory cell 50 includes a substrate 12 of a first conductivity type such as p-type, for example. Alternatively, the first conductivity type can be n-type. Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment shown in FIG. 3, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type), where region 29 represents bulk semiconductor substrate having second conductivity type. These arrangements allow for segmentation of the substrate terminal, which is connected to region 12A. To simplify the description, the substrate 12 will usually be drawn as the semiconductor bulk material as it is in FIG. 2.

Memory cell 50 also includes a buried layer region 22 of a second conductivity type, such as n-type, for example (or p-type, when the first conductivity type is n-type); a floating body region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The floating body region 24 of the first conductivity type is bounded on top by source line region 16, drain region 18, and insulating layer 62 (or by surface 14 in general), on the sides by insulating layer 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

A source line region 16 having a second conductivity type, such as n-type, for example (or p-type, when the first conductivity type is n-type), is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example (or p-type, when the first conductivity type is n-type), is also provided in floating body region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Figure 3:
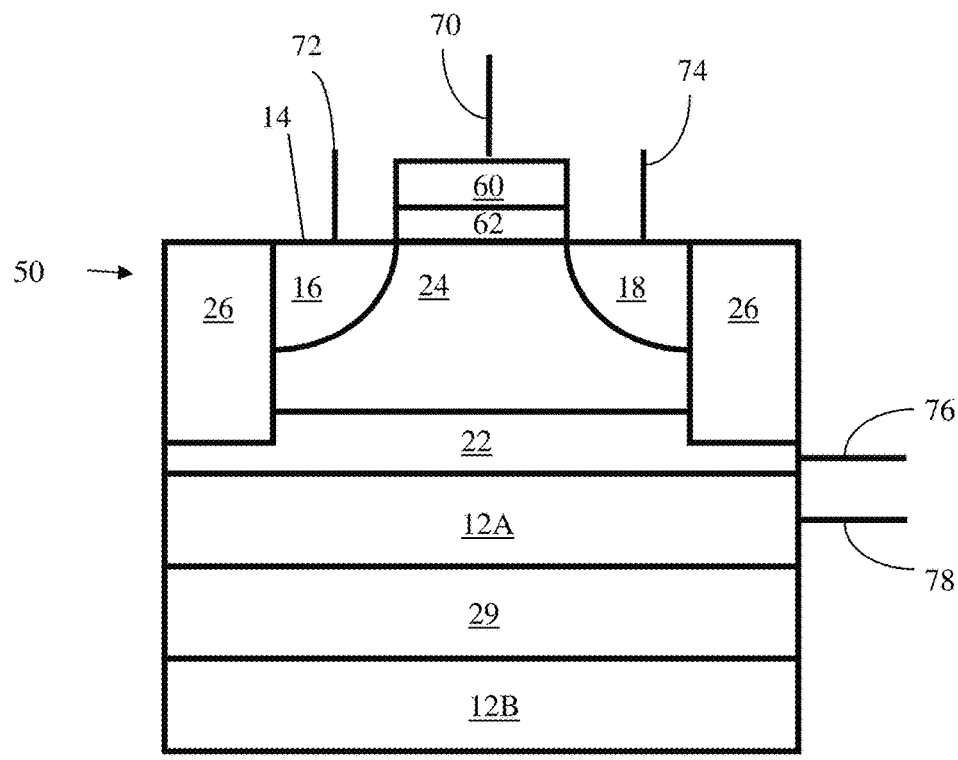
Figure 4A:
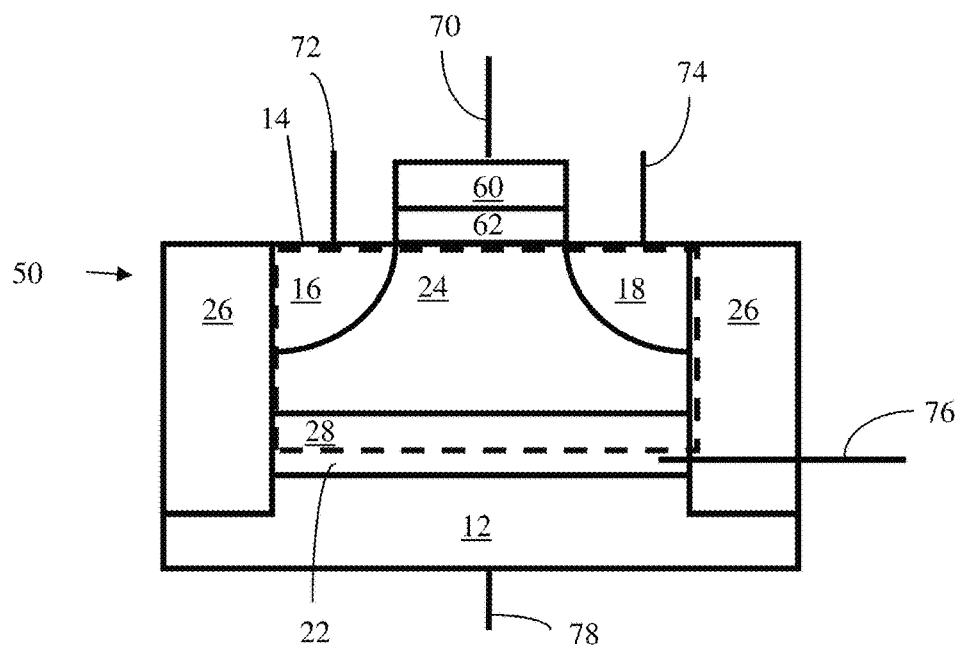
FIG. 4A is a schematic, cross-sectional illustration of a memory cell according to another embodiment of the present invention.
Figure 4B:
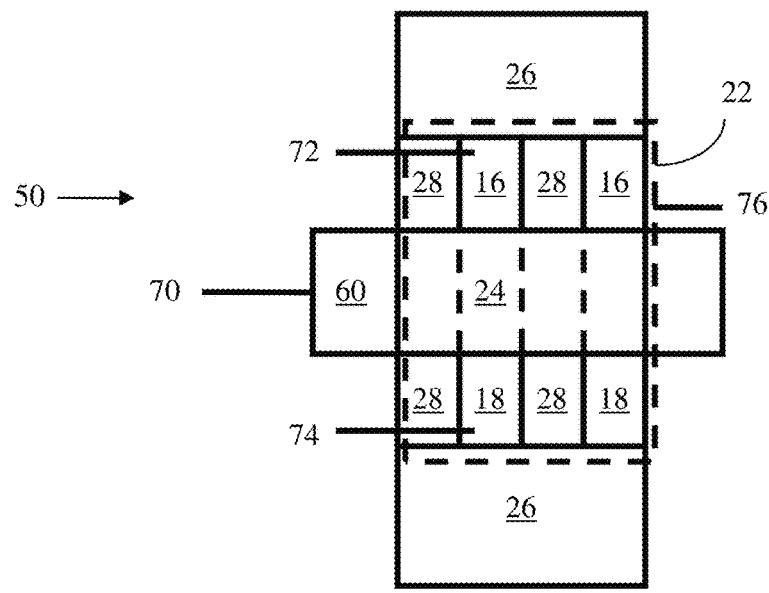
FIG. 4B is a schematic, top-view illustration of the memory cell shown in FIG. 4A.

Insulating layers 26 (like, for example, shallow trench isolation (STI)), may be made of silicon oxide, for example, though other insulating materials may be used. Insulating layers 26 insulate memory cell 50 from adjacent memory cell 50. The bottom of insulating layer 26 may reside inside the buried region 22 allowing buried region 22 to be continuous as shown in FIGS. 2 and 3. Alternatively, the bottom of insulating layer 26 may reside below the buried region 22 as in FIGS. 4A and 4B (shown better in FIG. 4A). This requires a shallower insulating layer 28, which insulates the floating body region 24, but allows the buried layer 22 to be continuous in the perpendicular direction of the cross-sectional view shown in FIG. 4A. For simplicity, only memory cell 50 with continuous buried region 22 in all directions will be shown from hereon.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) or deep n-well (DNWL) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Figure 4C:
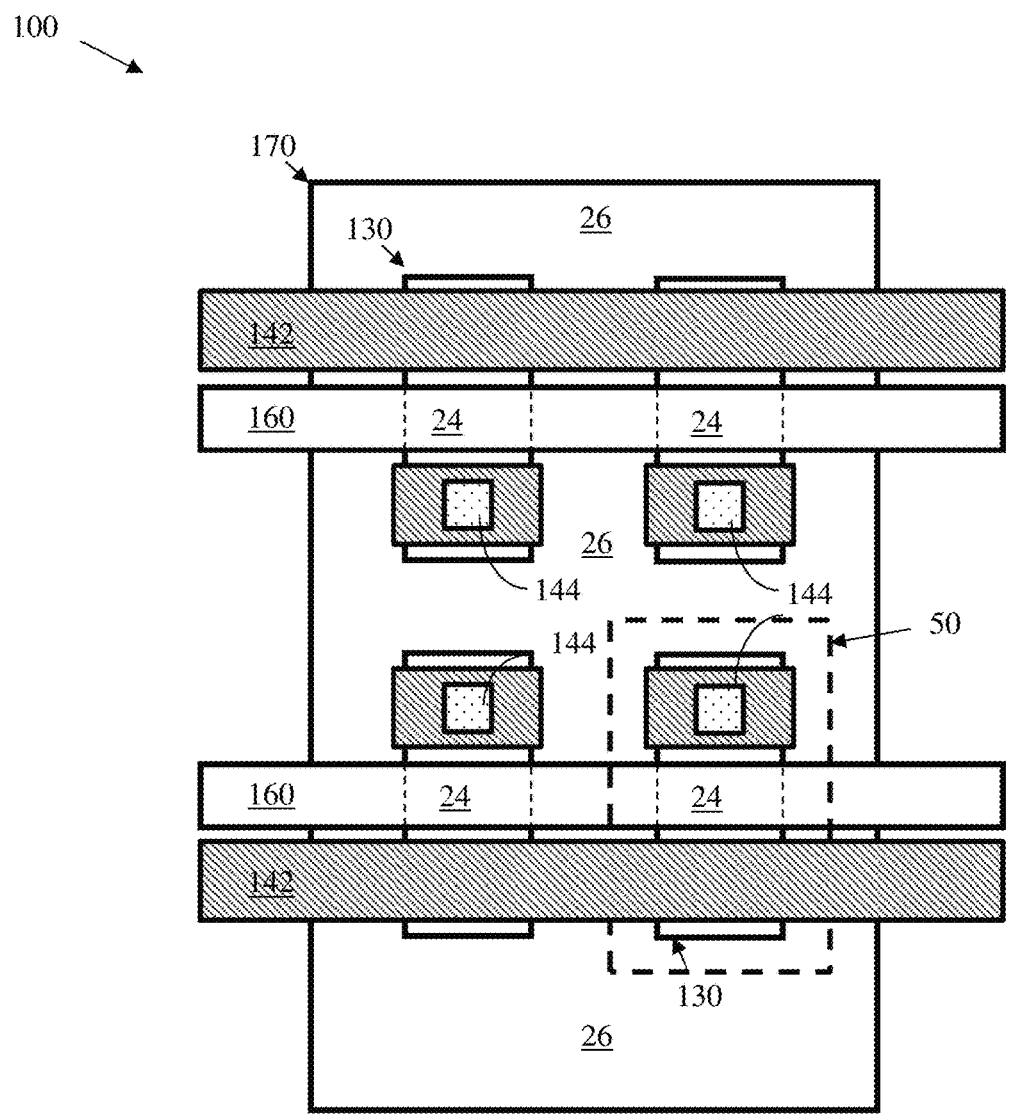
FIGS. 4C and 4D schematically illustrate a layout view of a memory array according to an embodiment of the present invention.
Figure 4D:
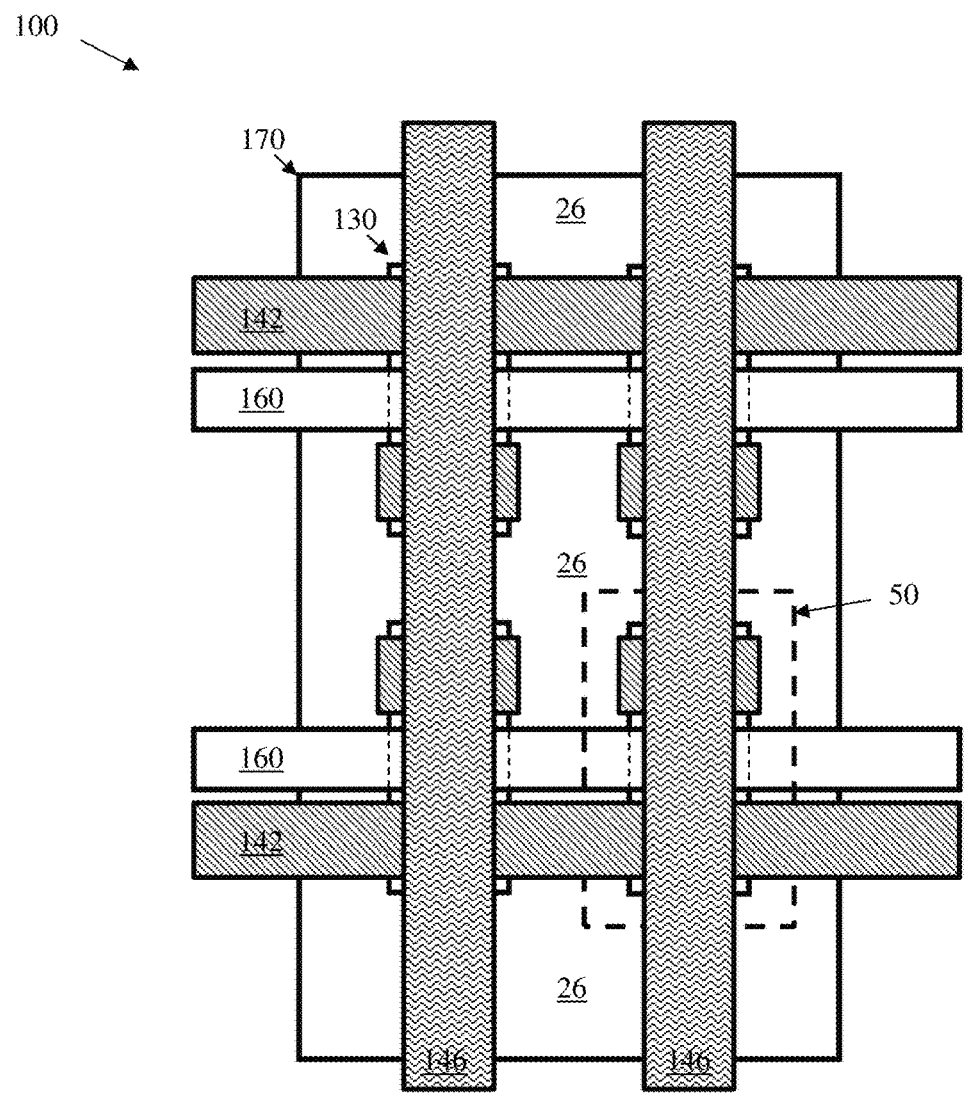

FIG. 4C further illustrates the conductive or metal lines which form connections to the terminals of the memory cells 50 in the array 100. METAL1 layers 142 form metal lines which are connected to the source/drain regions 16 and 18 through the CONTACT layers 140 (located underneath the METAL1 layers 142 and is not shown in FIG. 4C). Also shown in FIG. 4C are VIA1 layers 144, which later form connections between METAL1 layer and METAL2 layer 146 as shown in FIG. 4D. As illustrated in FIG. 4D, the direction of METAL1 layer 142 and POLY layer 160 define one direction of the memory array (for example the row direction) and METAL2 layer 146 defines another direction of the memory array (for example the column direction).

Figure 5:
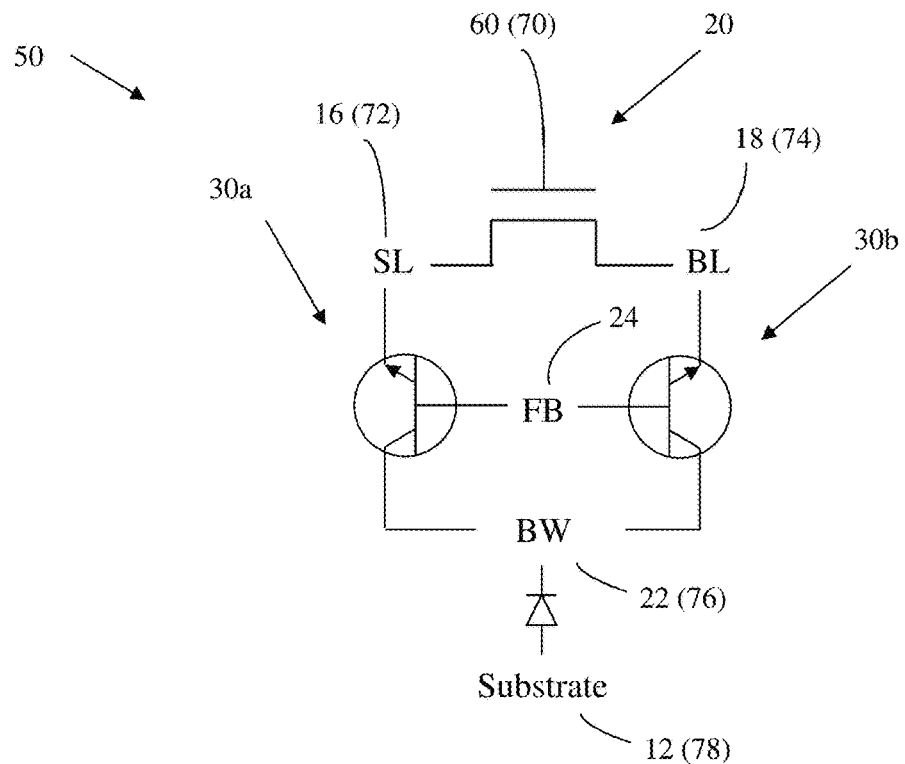
FIGS. 5 and 6 schematically illustrate equivalent circuit representations of the memory cells shown in FIGS. 2-4.

FIG. 5 illustrates an equivalent circuit representation of memory cell 50. Inherent in memory cell 50 are metal-oxide-semiconductor (MOS) transistor 20, formed by source line region 16, gate 60, bit line region 18, and floating body region 24, and bipolar devices 30a and 30b, formed by buried well region 22, floating body region 24, and source line region 16 or bit line region 18, respectively.

Figure 6:
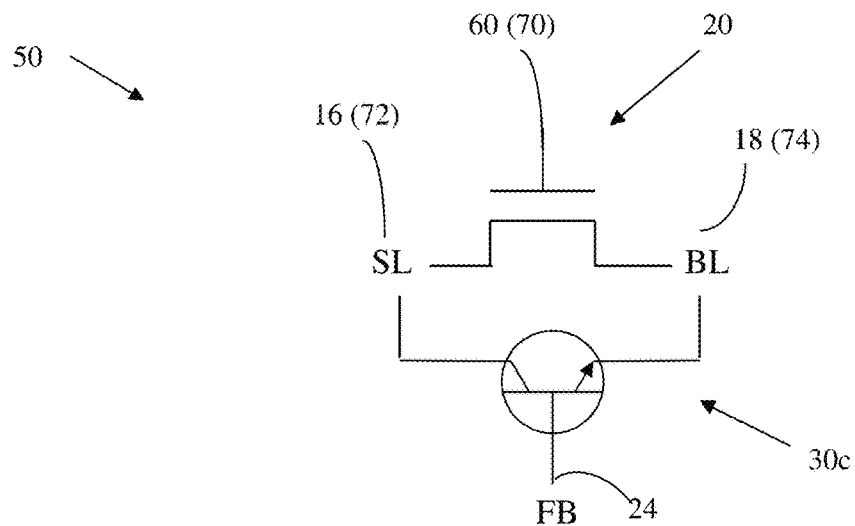

Also inherent in memory device 50 is bipolar device 30c, formed by source line region 16, floating body 24, and bit line region 18. For drawings clarity, bipolar device 30c is shown separately in FIG. 6.

Figure 7:
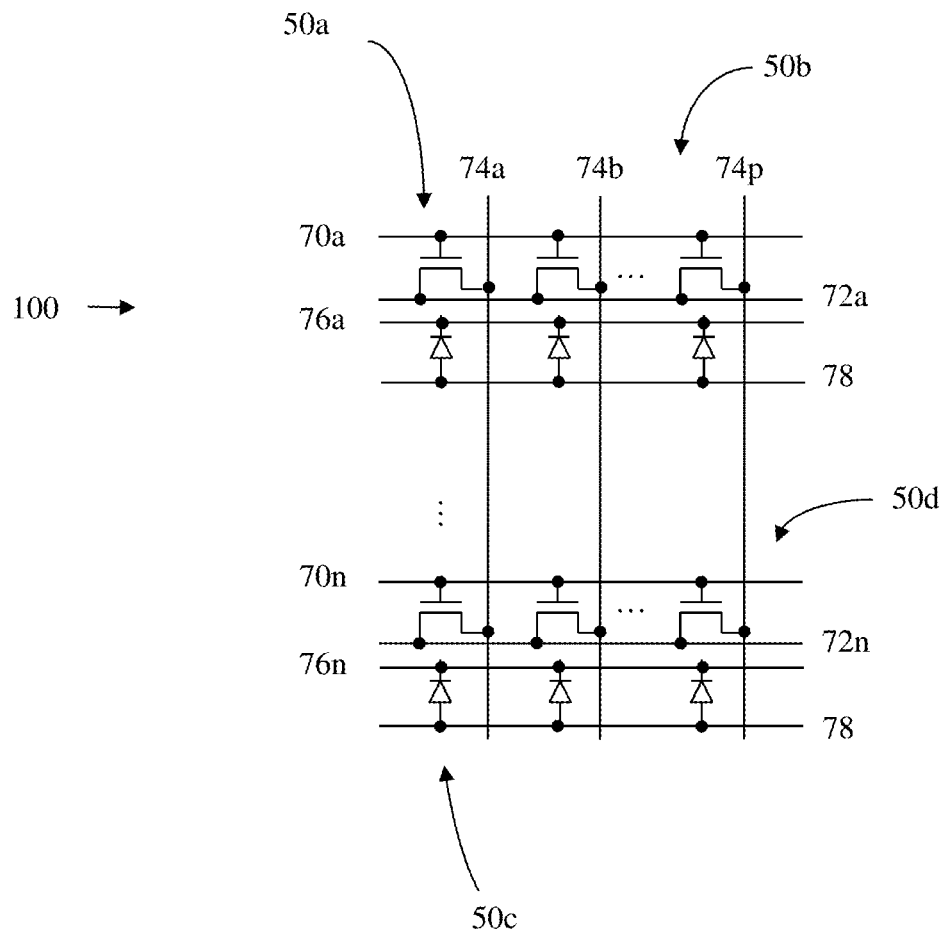
FIG. 7 schematically illustrates multiple cells of the type shown in FIGS. 2-4 joined to make a memory array, according to an embodiment of the present invention.

FIG. 7 schematically illustrates an exemplary embodiment of a memory array 100 of memory cells 50 (four exemplary instances of memory cell 50 being labeled as 50a, 50b, 50c and 50d) arranged in rows and columns. In many, but not all, of the figures where array 100 appears, representative memory cell 50a will be representative of a "selected" memory cell 50 when the operation being described has one (or more in some embodiments) selected memory cell(s) 50. In such figures, representative memory cell 50b will be representative of an unselected memory cell 50 sharing the same row as selected representative memory cell 50a, representative memory cell 50c will be representative of an unselected memory cell 50 sharing the same column as selected representative memory cell 50a, and representative memory cell 50d will be representative of an unselected memory cell 50 sharing neither a row or a column with selected representative memory cell 50a.

Several operations can be performed by memory cell 50 such as holding, read, write logic-1 and write logic-0 operations, and have been described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto.

Figure 8A:
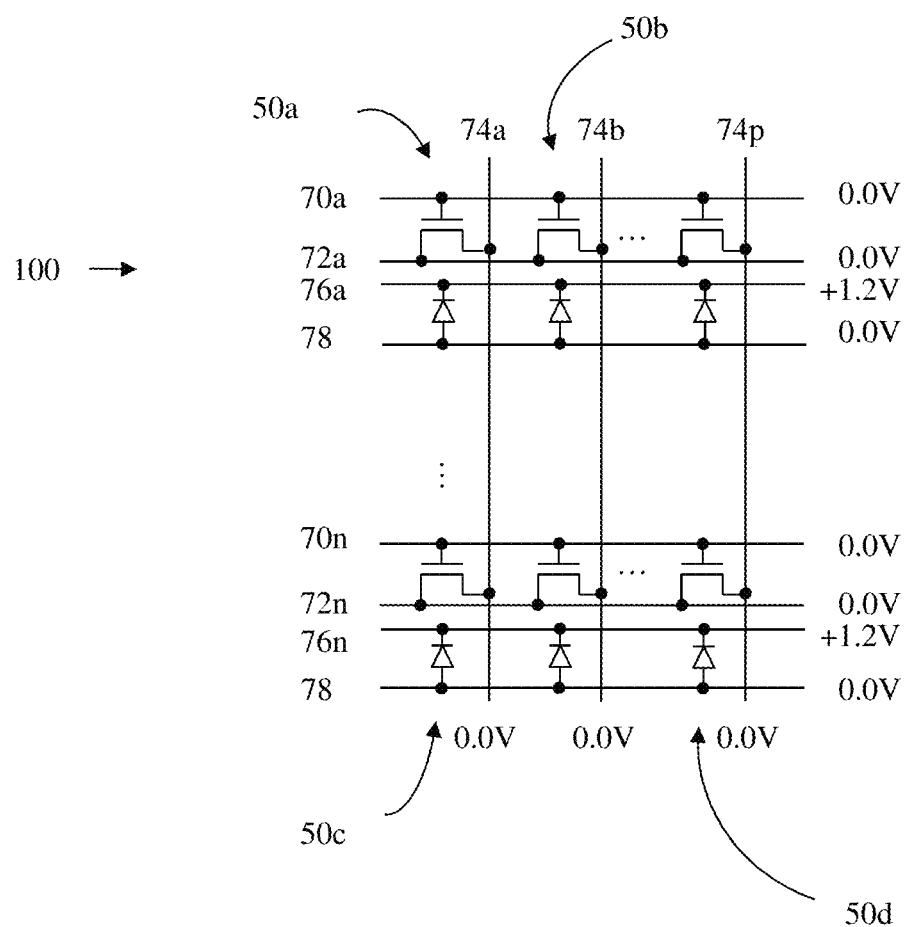
FIG. 8A schematically illustrates a holding operation performed on a memory array according to an embodiment of the present invention.
Figure 8B:
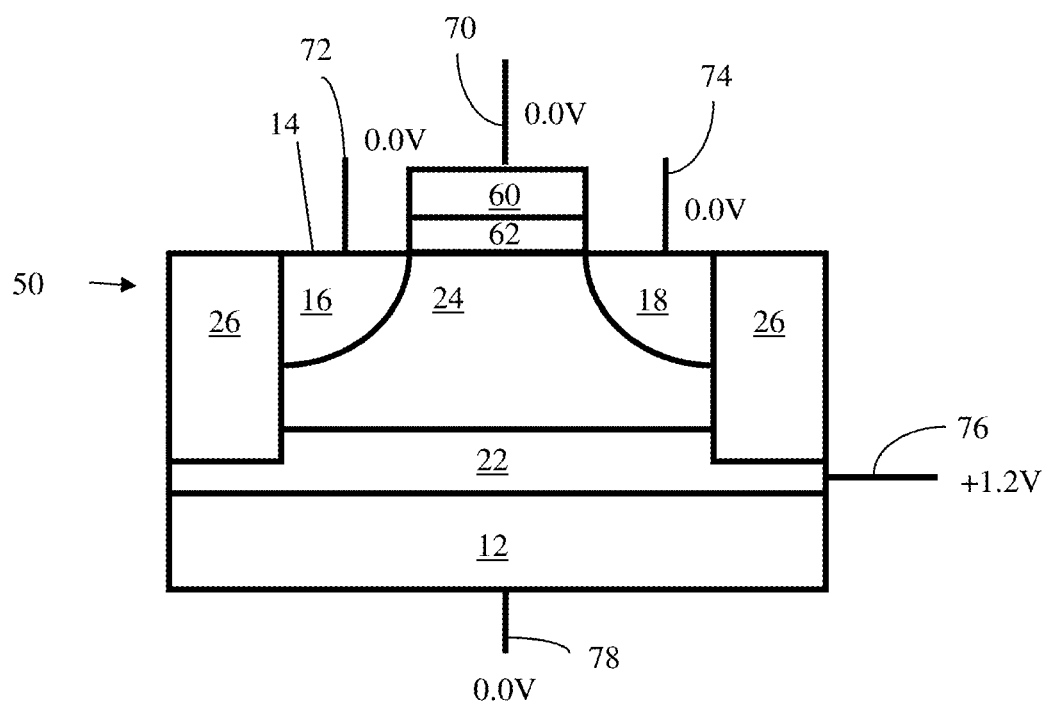
FIG. 8B illustrates exemplary bias conditions applied on the terminals of a memory cell of the array of FIG. 8A.

FIG. 8A schematically illustrates performance of a holding operation on memory array 100, while FIG. 8B shows an example of bias conditions applied on the terminals of a memory cell 50 during a holding operation, according to an exemplary, non-limiting embodiment. A holding operation is performed by applying a positive back bias to the BW terminal 76, zero or negative bias on the WL terminal 70, zero bias on the BL terminal 74, SL terminal 72, and substrate terminal 78. Alternatively, the substrate terminal 78 may be left floating. In another embodiment, one of the SL terminal 72 or BL terminal 74 may be left floating. The positive back bias applied to the buried layer region 22 connected to the BW terminal 76 will maintain the state of the memory cell 50 that it is connected to. The positive bias applied to the BW terminal 76 needs to generate an electric field sufficient to trigger an impact ionization mechanism when the floating body region 24 is positively charged, as will be described through the band diagrams shown in FIGS. 9A and 9B. The impact ionization rate as a function of the electric field is for example described in "Physics of Semiconductor Devices", Sze S. M. and Ng K. K. ("Sze"), which is hereby incorporated herein, in its entirety, by reference thereto.

In one embodiment the bias conditions for the holding operation on memory cell 50 are: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 50 and the exemplary voltages described are not limiting.

Figure 9A:
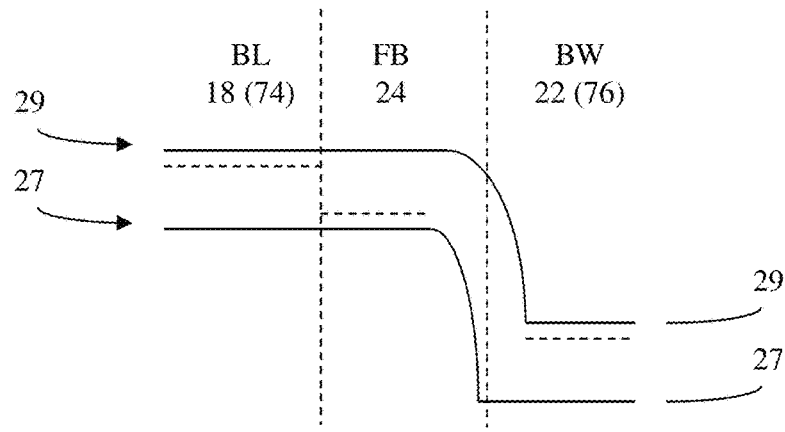
FIG. 9A shows an energy band diagram characterizing an intrinsic bipolar device when a floating body region is positively charged and a positive bias is applied to a buried well region of a memory cell according to an embodiment of the present invention.

FIG. 9A shows an energy band diagram characterizing the intrinsic n-p-n bipolar device 30b when the floating body region 24 is positively charged and a positive bias voltage is applied to the buried well region 22. The vertical dashed lines mark the different regions of the bipolar device 30b. The energy band diagram of the intrinsic n-p-n bipolar device 30a can be constructed in a similar manner, with the source line region 16 (connected to the SL terminal 72) in place of the bit line region 18 (connected to the BL terminal 74). The horizontal dashed lines indicate the Fermi levels in the various regions of the n-p-n transistor 30b. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic "1", the bipolar transistors 30a and 30b will be turned on as the positive charge in the floating body region lowers the energy barrier of electron flow (from the source line region 16 or bit line region 18) into the base region (floating body region 24). Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. When the following condition is met: $\beta \times (M-1) \approx 1$—where $\beta$ is the forward common-emitter current gain of the bipolar transistors 30a or 30b and M is the impact ionization coefficient—the amount of holes injected into the floating body region 24 compensates for the charge lost due to p-n junction forward bias current between the floating body region 24 and the source line region 16 or bit line region 18 and due to holes recombination. This process maintains the charge (i.e. holes) stored in the floating body region 24 which will keep the n-p-n bipolar transistors 30a and 30b on for as long as a positive bias is applied to the buried well region 22 through BW terminal 76.

The region where the product $\beta \times (M-1)$ approaches 1 and is characterized by hole current moving into the base region of a bipolar transistor is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), all of which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 "("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 50, the state of the memory cell is maintained due to the vertical bipolar transistors 30a and 30b, while the remaining cell operations (i.e. read and write operations) are governed by the lateral bipolar transistor 30c and MOS transistor 20. Hence, the holding operation does not require any interruptions to the memory cell 50 access.

If floating body 24 is neutrally charged (the voltage on floating body 24 being equal to the voltage on grounded bit line region 18), a state corresponding to logic-0, no (or low) current will flow through the n-p-n bipolar devices 30a and 30b. The bipolar devices 30a and 30b will remain off and no impact ionization occurs. Consequently memory cells in the logic-0 state will remain in the logic-0 state.

Figure 9B:
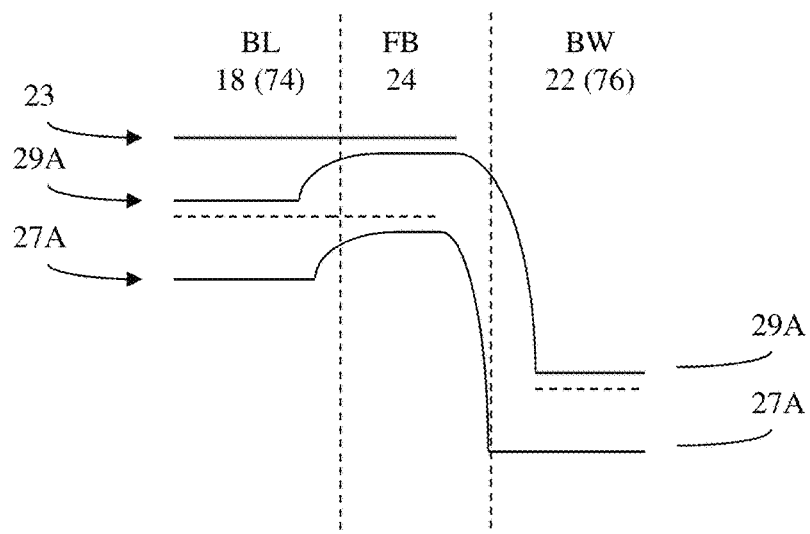
FIG. 9B shows an energy band diagram of an intrinsic bipolar device when a floating body region is neutrally charged and a positive bias is applied to a buried well region of a memory cell according to an embodiment of the present invention.

FIG. 9B shows an energy band diagram of the intrinsic bipolar device 30a when the floating body region 24 is neutrally charged and a bias voltage is applied to the buried well region 22. In this state the energy level of the band gap bounded by solid lines 27A and 29A is different in the various regions of n-p-n bipolar device 30b. Because the potential of the floating body region 24 and the bit line region 18 is equal, the Fermi levels are constant, resulting in an energy barrier between the bit line region 18 and the floating body region 24. Solid line 23 indicates, for reference purposes, the energy barrier between the bit line region 18 and the floating body region 24. The energy barrier prevents electron flow from the bit line region 18 (connected to BL terminal 74) to the floating body region 24. Thus the n-p-n bipolar device 30a and 30b will remain off.

Sakui-1 and Sakui-2 describe a memory cell based on the reverse base current effect, where the base of a n-p-n bipolar transistor is connected to a p-type MOS transistor. Reisch describes the challenges with the memory cell described in Sakui-1 and Sakui-2, which includes the requirement for the current of the p-type MOS transistor. Because the collector terminal of the bipolar transistor also serves as the channel of the p-type MOS transistor, any changes in operating conditions or process conditions will affect both the bipolar transistor and the p-type MOS transistor. For example, increasing the doping level of the collector region will improve the impact ionization efficiency. However, it will also increase the doping level of the p-type MOS transistor channel region, and reduces the drive current of the p-type MOS transistor.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 "Data Storage Device and Refreshing Method for Use with Such Device", Fazan et al. ("Fazan"), which are hereby incorporated herein, in their entireties, by reference thereto. Ohsawa and Fazan teach an autonomous refresh method by applying periodic gate and drain voltage pulses, which interrupt access to the memory cells being refreshed. In memory cell 50, more than one stable state is achieved because of the vertical bipolar transistors 30a and 30b. The read and write operations of the memory cell 50 are governed by the lateral bipolar transistor 30c and MOS transistor 20. Hence, the holding operation does not require any interruptions to the memory cell 50 access.

In the holding operation described with regard to FIG. 8A, there is no individually selected memory cell. Rather the holding operation will be performed at all cells connected to the same buried well terminal 76. In addition, the holding operation does not interrupt read or write access to the memory cell 50.

Figure 10:
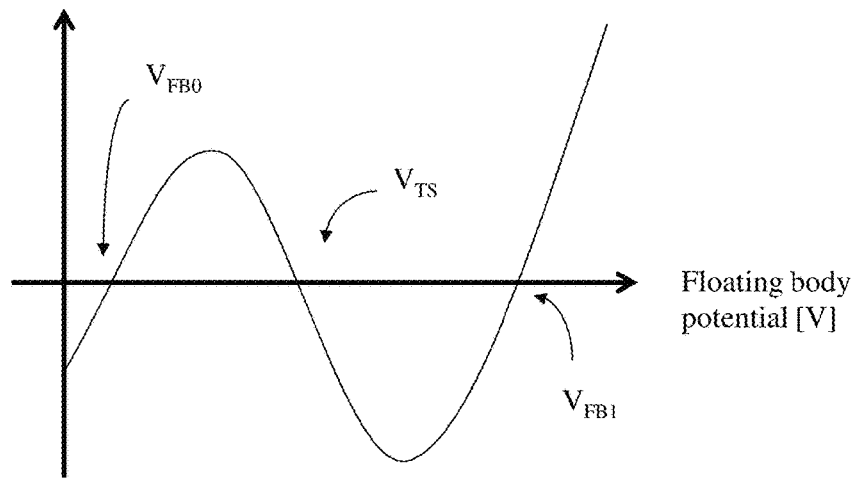
FIG. 10 shows a graph of the net current I flowing into or out of a floating body region as a function of the potential V of the floating body, according to an embodiment of the present invention.

FIG. 10 shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 10, the net current is flowing into the floating body region 24 as a result of the p-n diode formed by the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the bit line region 18/source line region 16, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current formed by the floating body region 24 and the bit line region 18/source line region 16. When the floating body 24 potential is higher than $V_{FB1}$, the net current will be out of the floating body region 24. This is because the p-n diode leakage current formed by the floating body region 24 and the bit line region 18/source line region 16 is once again greater than the base current of the bipolar devices 30a and 30b.

Figure 11:
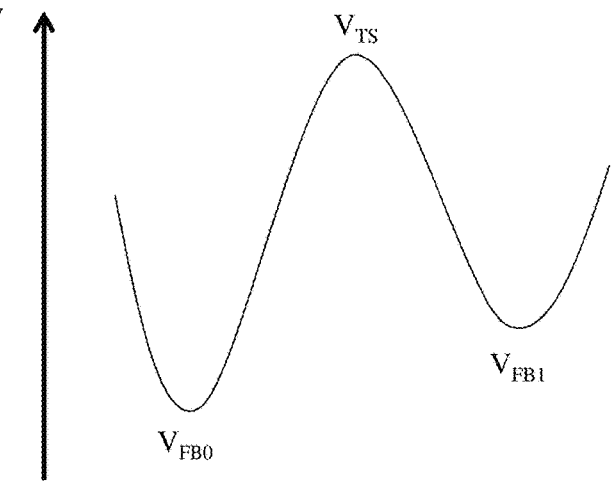
FIG. 11 shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 11 shows a schematic curve of a potential energy surface (PES) of the memory cell 50, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 12:
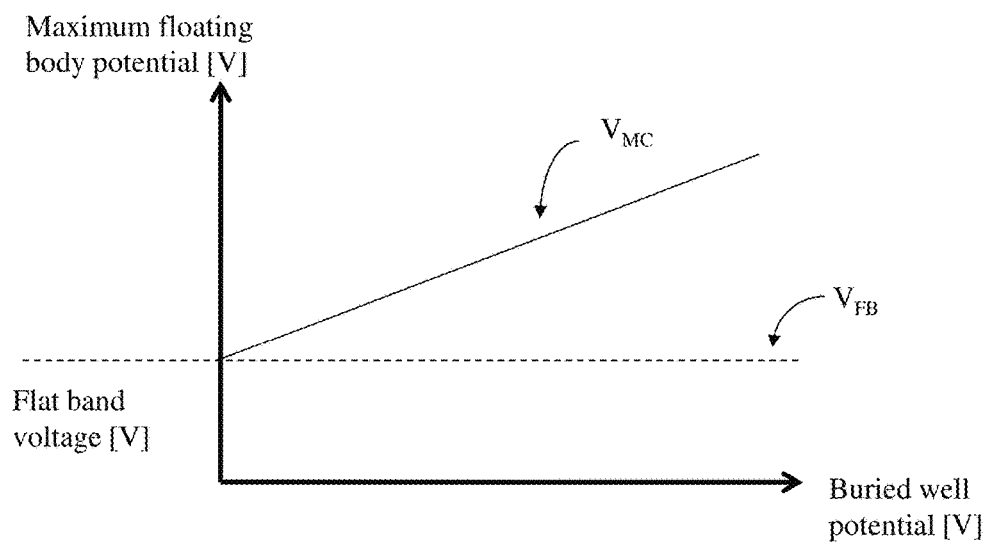
FIG. 12 illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 12. The increase in the maximum charge stored in the floating body 24 results in a larger memory window.

Floating body DRAM cells described in Ranica-1, Ranica-2, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

Figure 13A:
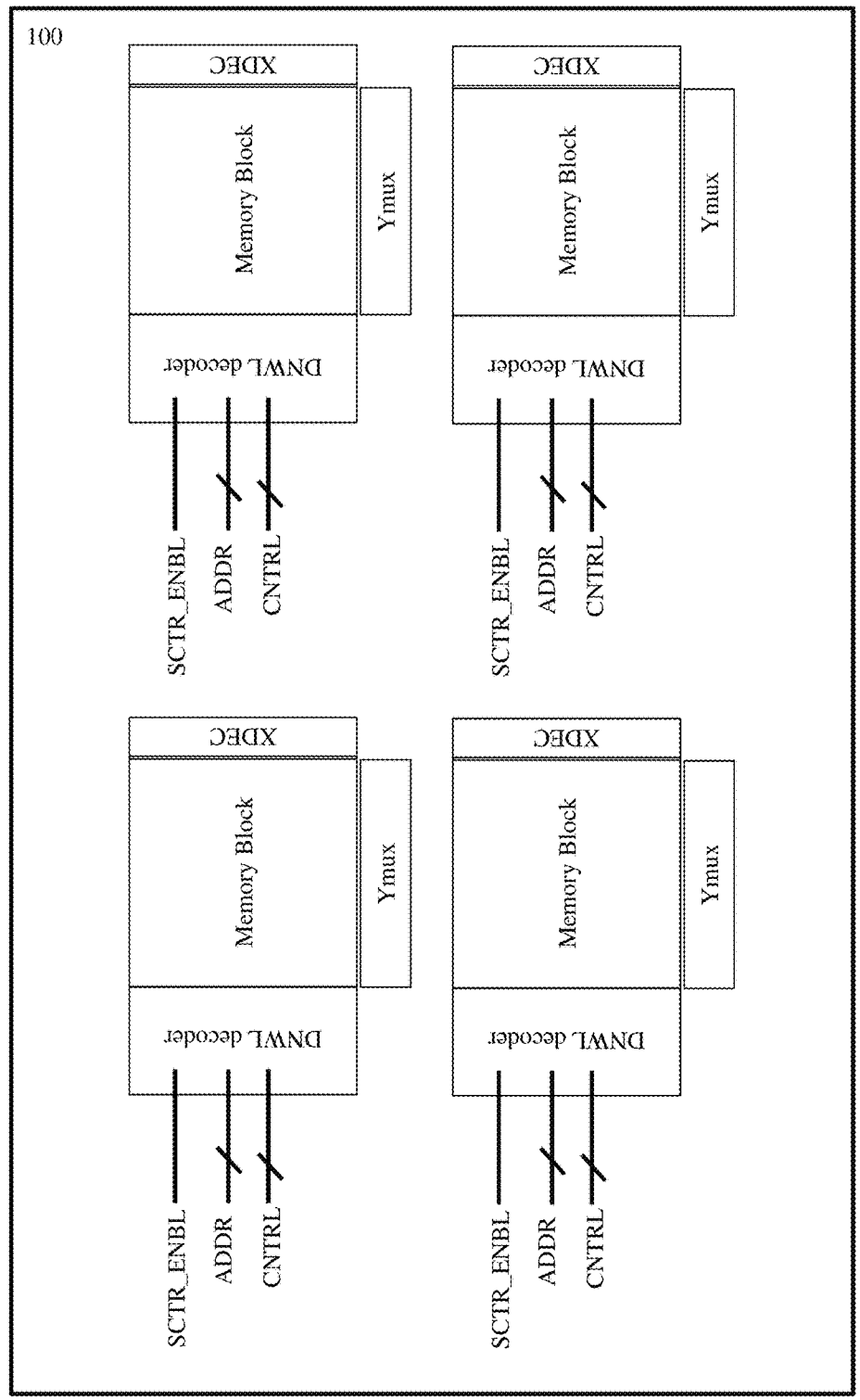
FIG. 13A illustrates memory array segmentation with multiple memory sub-arrays. The BW terminals may be controlled independently for each memory sub-array according to an embodiment of the present invention.

Memory array 100 may be broken/segmented into multiple sub-arrays. For example, the buried layer region 22 may be segmented to allow for independent memory operation. In one embodiment of the present invention, if the content of a memory sub-array is no longer needed, the holding/standby operation may be terminated by removing the positive bias applied to the BW terminal 76 of that memory sub-array. FIG. 13A is a schematic illustration of the BW segmentation, where memory array 100 is segmented into 4 sub-arrays. Address (ADDR) and control (CNTRL) signals are used to control the operation (and the bias conditions) of the BW terminal 76 of each memory sub-array. A memory sub-array may also be disabled for example if it has been inactive for a certain period of time. A sector enable signal (SCTR_ENBL) may be used to selectively enable or disable a memory sub-array. Inactive sectors will have their associated SCTR_ENBL signals low. Active sectors have their associated SCTR_ENBL signals high.

Figure 13B:
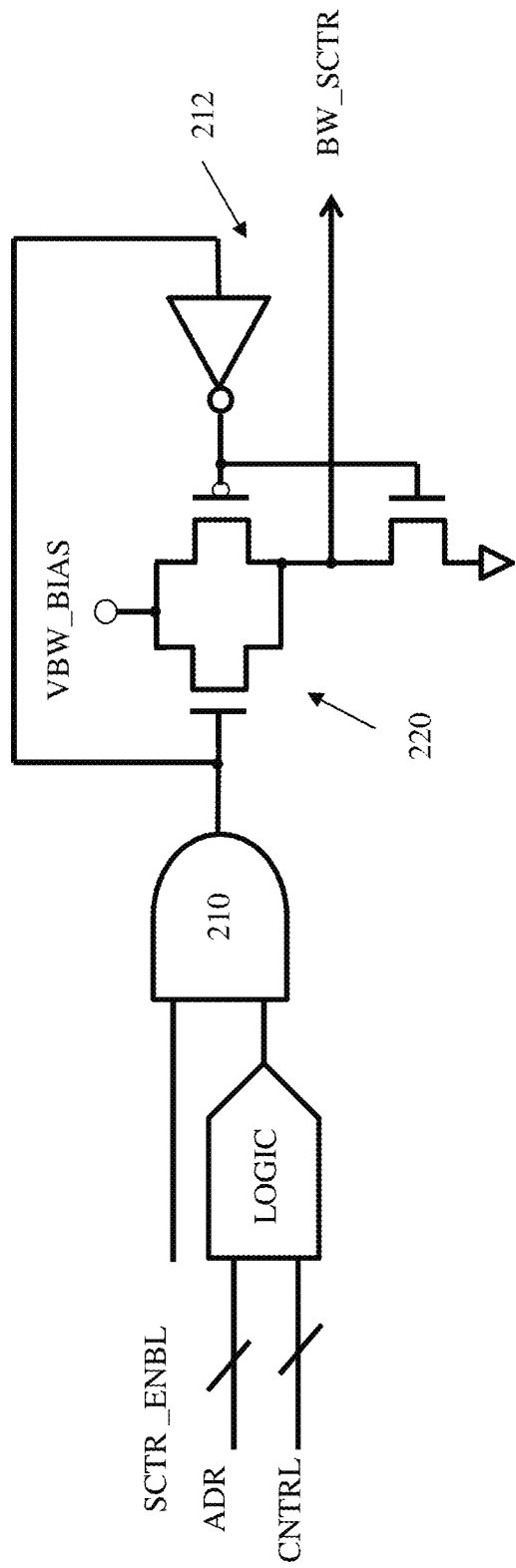
FIG. 13B illustrates an exemplary BW terminal decoder circuitry, according to an embodiment of the present invention.

FIG. 13B illustrates an exemplary BW decoder shown in a sub-array in FIG. 13A. Address (ADDR) and control (CNTRL) signals (for example read operation signal, write operation signal, and standby operation signal) along with a sector enable (SCTR_ENBL) signal provide inputs to the AND gate 210. The output of the AND gate 210 (along with its complementary signal, which is generated by the inverter gate 212) drives the transmission gate 220. The transmission gate 220 selects between VBW_BIAS (for example a positive voltage such as +1.2V) and GND signals as the output to the BW terminal 76 of the memory sub-array (BW_SCTR signal).

As an example, to optimize power management, the SCTR_ENBL signal may be governed by a clock signal. This circuitry would be designed to save power during the low portion of the clock cycle, yet with optimized duty cycle to maintain data integrity during the cycle high time. In another embodiment of the present invention, the BW_SCTR (connected to the BW terminal 76 of the memory sub-array) needs to be set high during certain memory access (for example read and write logic-1 operation). In another example, the BW_SCTR may be set low during other memory operation (for example write logic-0 operation).

Figure 14:
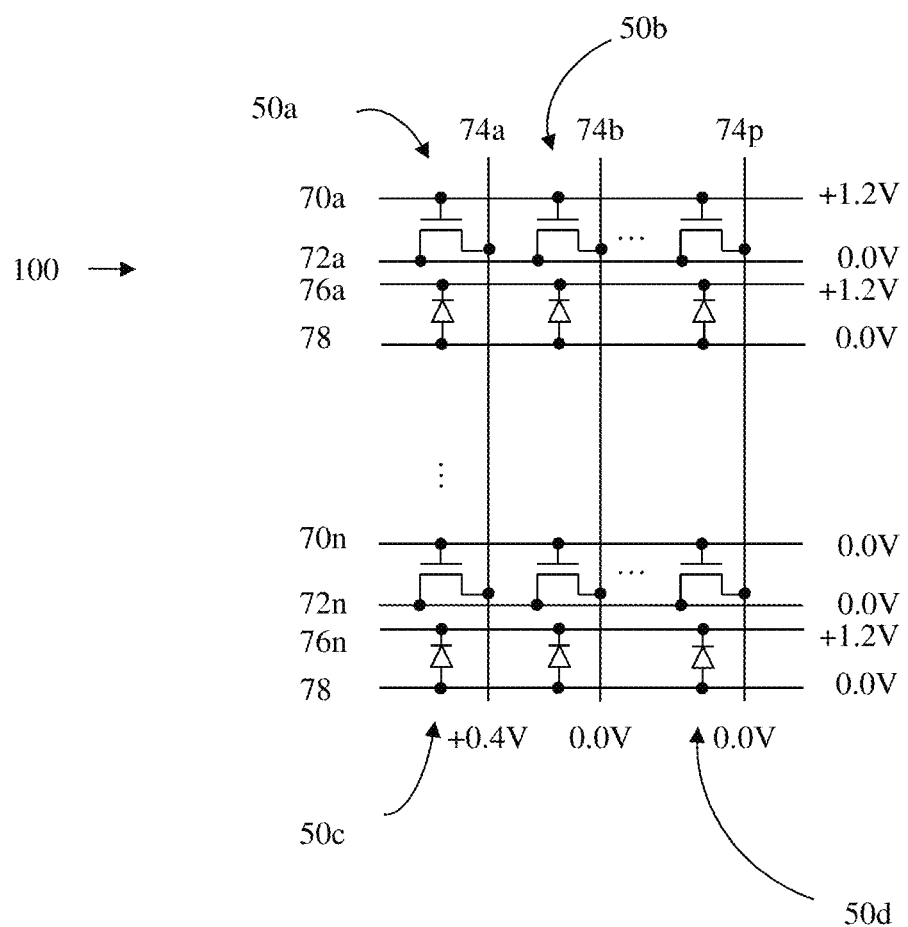
FIG. 14 schematically illustrates a read operation performed on a memory array according to an embodiment of the present invention.
Figure 15:
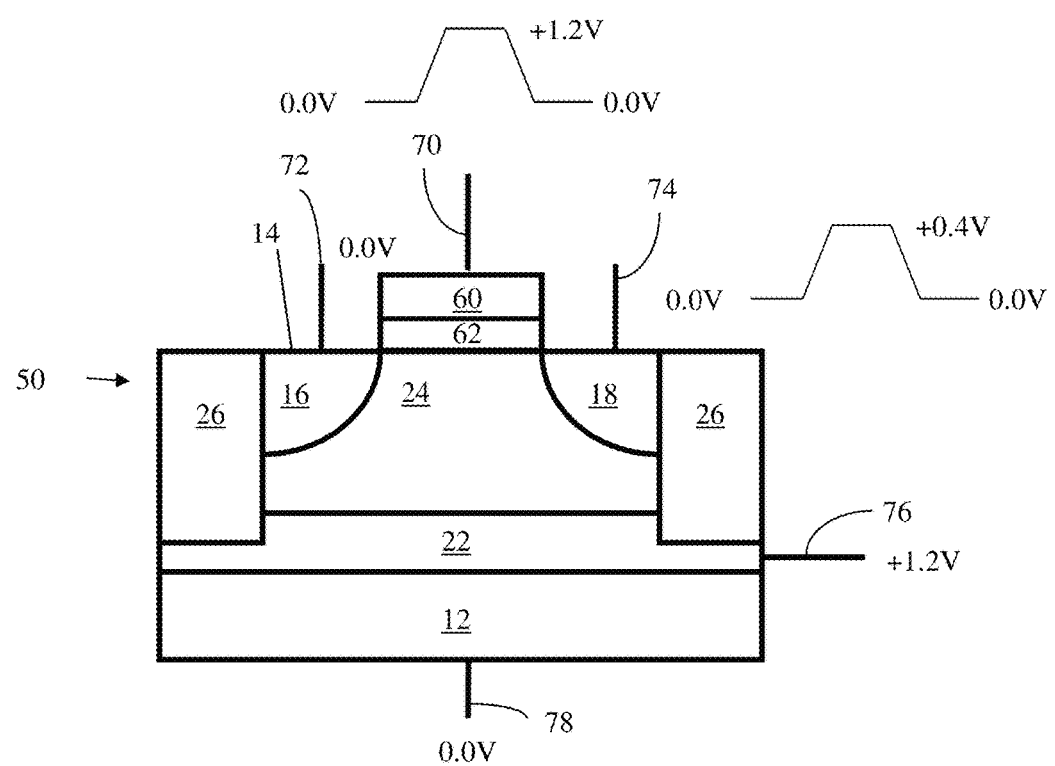
FIG. 15 illustrates bias conditions applied on the terminals of a selected memory cell to perform a read operation, according to an embodiment of the present invention.

The read and write operations of the memory cell have been described, for example, in Widjaja-1 and Widjaja-2. FIGS. 14 and 15 illustrate a read operation performed on an exemplary memory array 100 by applying the following bias conditions: a positive voltage is applied to the selected BW terminal 76a, a positive voltage is applied to the selected BL terminal 74a, zero voltage is applied to the selected SL terminal 72a, a positive voltage applied to the selected WL terminal 70a, while zero voltage is applied to the substrate terminal 78. The positive voltage applied to BL terminal 74 may be less than the positive voltage applied to WL terminal 70, in which the difference in the threshold voltage of the memory cell 50 is employed to represent the state of the memory cell 50. The positive voltage applied to BL terminal 74 may alternatively be greater than or equal to the positive voltage applied to WL terminal 70 and may generate sufficiently high electric field to trigger the bipolar read mechanism. The unselected BL terminals will remain at zero voltage and the unselected WL terminals will remain at zero or negative voltage.

In one particular non-limiting embodiment, about 0.0 volts is applied to selected SL terminal 72a, about +0.4 volts is applied to the selected BL terminal 74a, about +1.2 volts is applied to the selected WL terminal 70a, about +1.2 volts is applied to selected BW terminal 76a, and about 0.0 volts is applied to terminal 78. The unselected terminals 74 remain at 0.0 volts and the unselected terminals 70 remain at 0.0 volts. FIG. 14 shows the bias conditions for the selected memory cell 50a and unselected memory cells 50b, 50c, and 50d in memory array 100. However, these voltage levels may vary.

During a read operation, the selected WL terminal 70a (electrically connected to gate 60) is raised from the initial/standby condition (for example 0.0V) to the read voltage (for example +1.2V). During the rise time of the gate 60 voltage, the surface 14 channel potential will be in non-equilibrium condition as there will be a delay for electrons from source and/or drain regions to drift into the channel region, for example as described in "Substrate Response of a Floating Gate n-Channel MOS Memory Cell Subject to a Positive Linear Ramp Rate", Han-Sheng Lee and David Scott Lowrie, Solid-State Electronics 24(3), 1981, pp. 267-273, which is hereby incorporated herein, in its entirety, by reference thereto. The coupling ratio between the gate voltage and the floating body 24 is affected by the rise time of the gate voltage, where a higher ramp rate will result in a higher coupling ratio between the gate 60 voltage and the floating body region 24 potential. During the read operation, the rise time of the gate voltage needs to be controlled so that the increase of the floating body 24 potential by gate 60 to floating body 24 coupling is less than the difference between the transition voltage and the logic-0 voltage (i.e. $V_{TS}-V_{FB0}$) to avoid undesired writing of memory cells 50 in logic-0 state into logic-1 state. The ramp rate during the read operation may be designed to be slower than the ramp rate during the write logic-1 operation, for example by designing the timing of the signals generated by analog supply generation/regulation block 135 (see FIG. 1). The ramp rate may be optimized for different process technology depending on the capacitance between the gate region 60 and the floating body region 24. In one particular non-limiting embodiment, the ramp rate of the gate 60 voltage is designed to be about +1.2V/500 ps. However, this ramp rate may vary, while maintaining a lower ramp rate for the read operation compared to that of the write operation. For example, the ramp rate of the gate 60 voltage may be in the range of about +1.2V/100 ps to +1.2V/2 ns.

During the read operation, the selected BL terminal 74a is also increased from the initial/standby condition (e.g. about 0.0V) to the read voltage (e.g. about +0.4V). During the rise time of the drain region 18, hole current (from the minority carrier of the drain region 18) will flow to the floating body region 24. The hole current is relatively small as it holes are minority carriers. Nevertheless, the rise time of the BL terminal 74a needs to be controlled so that the injected hole can flow out of the floating body region 24 (to the source region 16) to avoid undesired writing of memory cells 50 from logic-0 state to logic-1 state. The ramp rate during the read operation may be designed to be slower than the ramp rate during the write logic-1 operation, for example by designing the timing of the signals generated by analog supply generation/regulation block 135 (see FIG. 1). The ramp rate may be optimized for different process technology depending on the capacitance between the drain region 18 and the floating body region 24. In one particular non-limiting embodiment, the ramp rate of the drain region 18 voltage is designed to be about +0.4V/500 ps. However, this ramp rate may vary, while maintaining a lower ramp rate for the read operation compared to that of the write operation. For example, the ramp rate of the gate 60 voltage may be in the range of about +0.4V/100 ps to +0.4V/2 ns.

The minority hole current (when the drain region 18 is raised to a positive voltage) is inversely proportional to the concentration of a lower-doped region of the p-n junction. The hole current can therefore be reduced by optimizing the concentration of the lower-doped region of the p-n junction. This can be achieved through the optimization of the process steps to form the doping profile of the floating body region 24 and/or the drain region 18, for example through the optimization of the ion implantation dose and energy and/or the subsequent thermal process to activate the dopant. Epitaxial growth process may also be used to form the floating body region 24 and/or the drain region 18.

Figure 16:
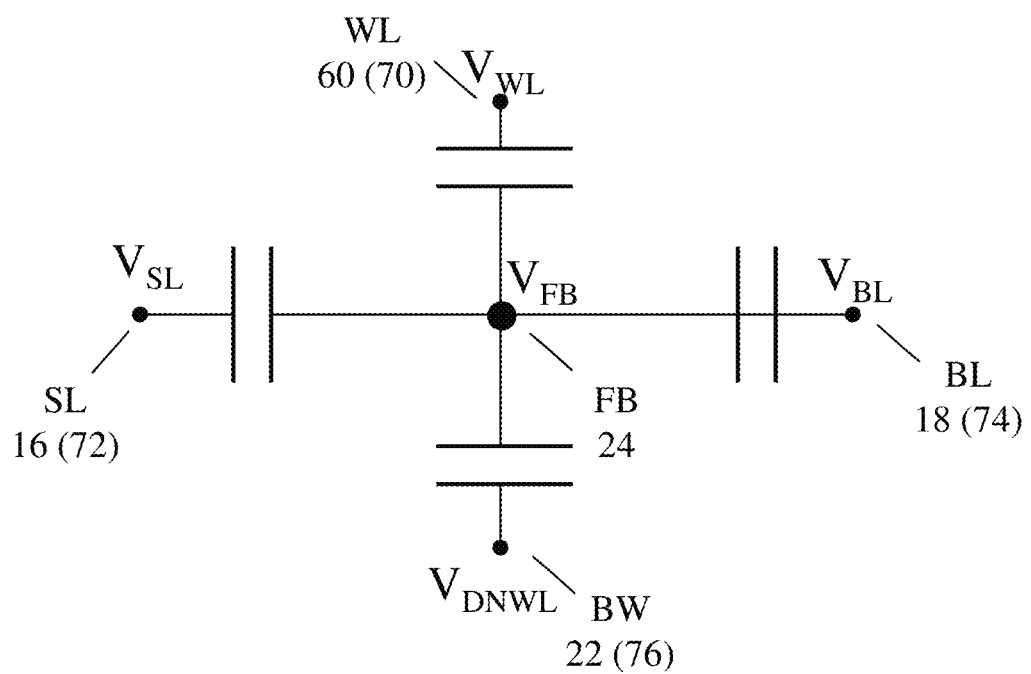
FIG. 16 schematically illustrate an equivalent capacitor circuit representation of the memory cells shown in FIGS. 2-4.

FIG. 16 schematically illustrates an equivalent capacitor circuit representation of the memory cells shown in FIGS. 2-4. The floating body potential ($V_{FB}$) is capacitively coupled with gate oxide capacitance, source side junction capacitance, drain side junction capacitance, and deep n-well junction capacitance. Therefore, the floating body potential ($V_{FB}$) can be perturbed by the WL voltage, SL voltage, BL voltage, and BW voltage. As explained in FIG. 10, if the floating body potential $V_{FB}$ becomes higher than $V_{TS}$, $V_{FB}$ will reach $V_{FB1}$ at steady state. If the $V_{FB}$ becomes less than $V_{TS}$, $V_{FB}$ will reach $V_{FB0}$ at steady state. When the gate oxide capacitance and the drain side junction capacitance are relatively larger than the deep n-well junction capacitance, $V_{FB}$ is preferentially controlled by $V_{WL}$ and $V_{BL}$. In this case, $V_{FB}$ can become higher than $V_{TS}$ without impact ionization process in the channel as well as $V_{FB}$ can become lower than $V_{TS}$ without supplying the forward junction current to the floating body or flowing significantly low forward junction current to the floating body. Therefore, the writing logic-1 and writing logic-0 can be accomplished by capacitive coupling between $V_{WL}$ and $V_{BL}$. The writing mechanism using the capacitive coupling features that the writing logic-1 voltage of $V_{BL}$ does not exceed the impact ionization threshold voltage, which is, in case of silicon semiconductor, 1.2V and the writing logic-0 voltage of $V_{BL}$ is zero or slightly negative voltage.

Figure 17:
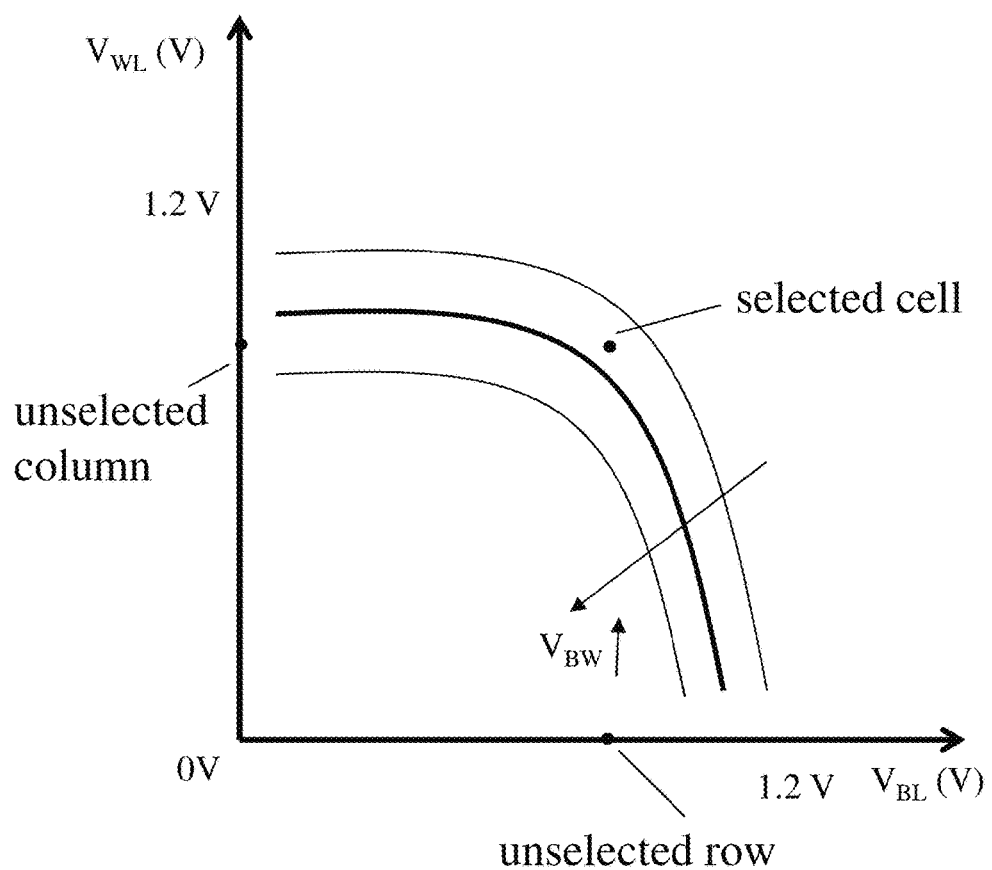
FIG. 17 shows a schematic map of word line voltage and bit line voltage that enables a floating body potential to be higher than a transition voltage for write logic-1, according to an embodiment of the present invention.

FIG. 17 shows a schematic map of word line voltage and bit line voltage that enables $V_{FB}$ to be higher than $V_{TS}$ for writing logic-1 for different $V_{BW}$. If $V_{BW}$ is increased, the depletion width between deep n-well and floating body is increased and BW junction capacitance is decreased. Therefore, the transition voltage $V_{TS}$ is decreased. Consequently, when $V_{BW}$ is increased, a relatively lower $V_{WL}$ and $V_{BL}$ can write logic-1 by capacitive coupling, compared to $V_{WL}$ and $V_{BL}$ levels that are required to write logic-1 when $V_{BW}$ is relatively lower. At a given $V_{BW}$, the bias conditions located to the right of the curve represents a write logic-1 bias condition.

Figure 18A:
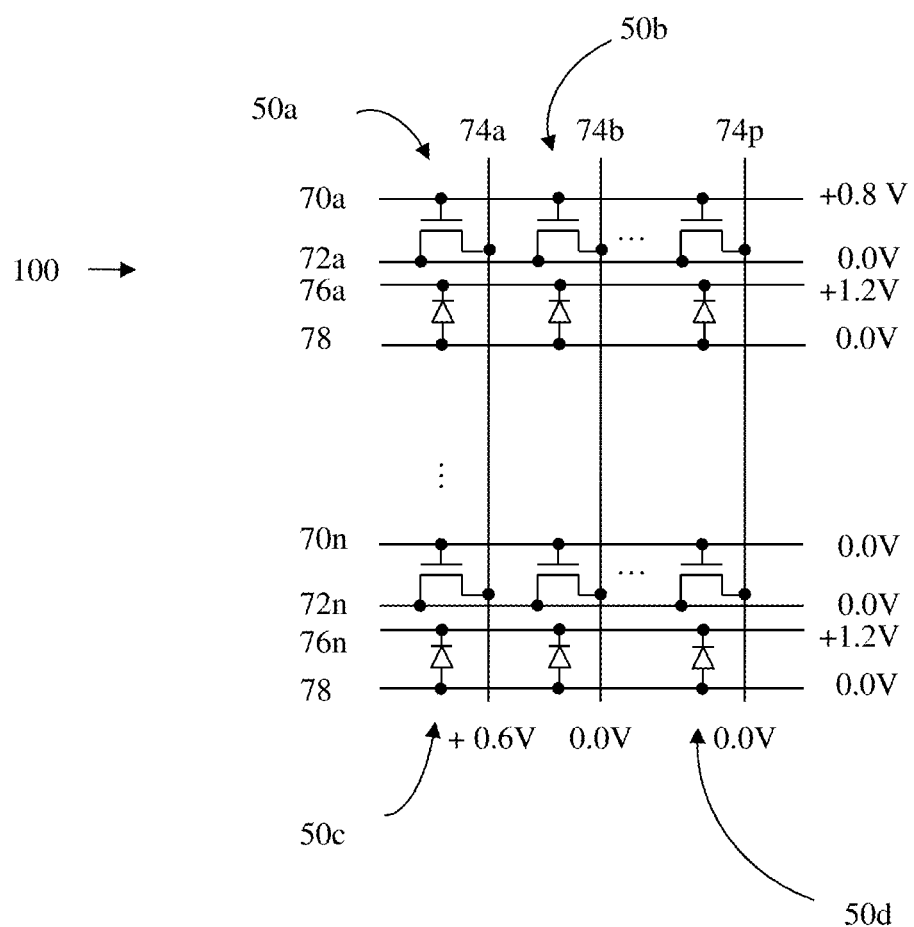
FIGS. 18A and 18B schematically illustrate a write logic-1 operation performed on a memory array according to an embodiment of the present invention.
Figure 18B:
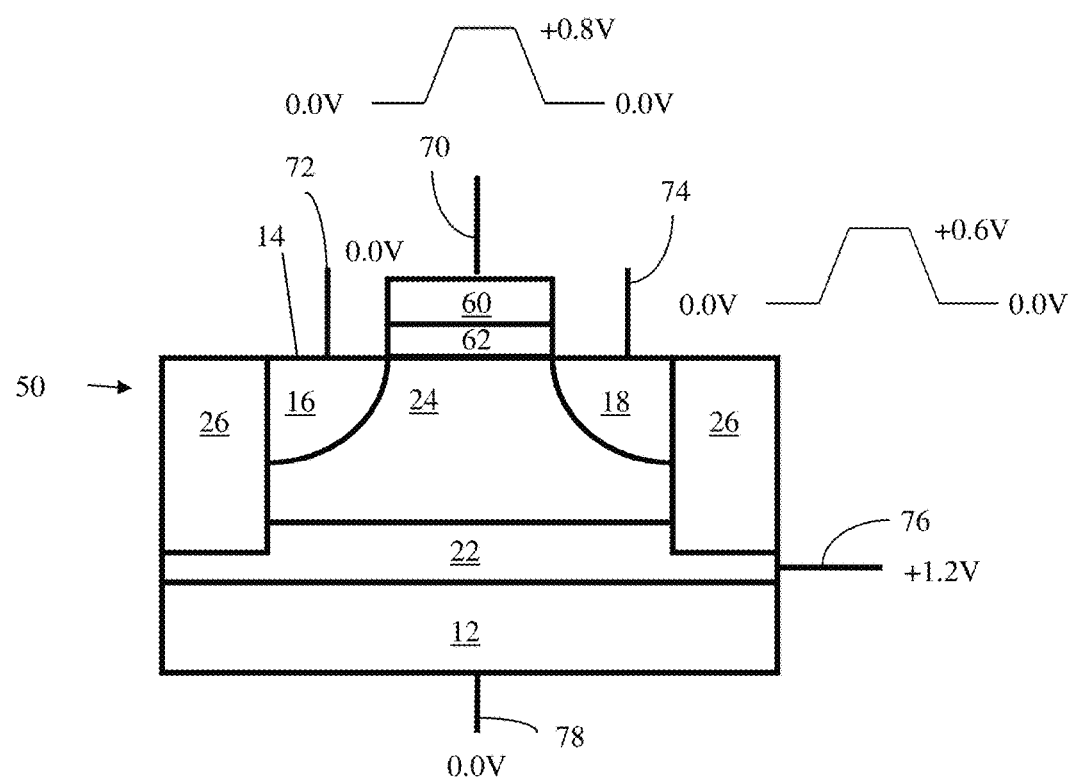

FIGS. 18A and 18B illustrate a schematic illustration of a memory array 100, showing a write logic-1 operation which may be performed by applying the following bias conditions: a positive voltage is applied to the selected BW terminal 76a, a positive voltage is applied to the selected BL terminal 74a, zero voltage is applied to the selected SL terminal 72a, a positive voltage is applied to the selected WL terminal 70a, while zero voltage is applied to the substrate terminal 78. The combined capacitive coupling by the positive voltage applied to the selected BL terminal 74a and the positive voltage applied to the selected WL terminal 70a can be sufficiently high enough to raise the $V_{FB}$ higher than $V_{TS}$ so as to trigger an impact ionization mechanism of vertical bipolar transistors 30a and 30b. But the positive voltage applied to the selected BL terminal 74a and the positive voltage applied to the WL selected terminal 70a may not be sufficiently high to trigger an impact ionization mechanism of the lateral bipolar transistor 30c and MOS transistor 20. The combined capacitive coupling by the positive voltage applied to the selected BL terminal 74a and the zero voltage applied to the unselected WL terminals 70n can be insufficient to write logic-1. The combined capacitive coupling by the zero voltage applied to the unselected BL terminal 74n and the positive voltage applied to the selected WL terminals 70a can be insufficient to write logic-1.

In one particular non-limiting embodiment, the selected WL terminal 70a (electrically connected to gate 60) is increased from the initial/standby condition (e.g. about 0.0V) to the write condition (e.g. about +0.8V). The selected BL terminal 74a (electrically connected to drain 18) is increased from the initial/standby condition (e.g. about 0.0V) to the write condition (e.g. about +0.6V). Similar to that of the read operation, the coupling ratio between the gate electrode 60 and the floating body region 24 is a function of the ramp rate. As a result, a higher ramp rate may assist the write logic-1 operation. However, the voltage ramp rate of the WL terminal 70a also has to be controlled to avoid undesired writing of unselected memory cells 50 in the selected row from logic-0 state to logic-1 state. Similarly, the voltage ramp rate of the BL terminal 74a may also assist the write logic-1 operation. However, the voltage ramp rate of the BL terminal 74a also has to be controlled to avoid undesired writing of unselected memory cells 50 in the selected column from logic-0 state to logic-1 state.

Figure 19A:
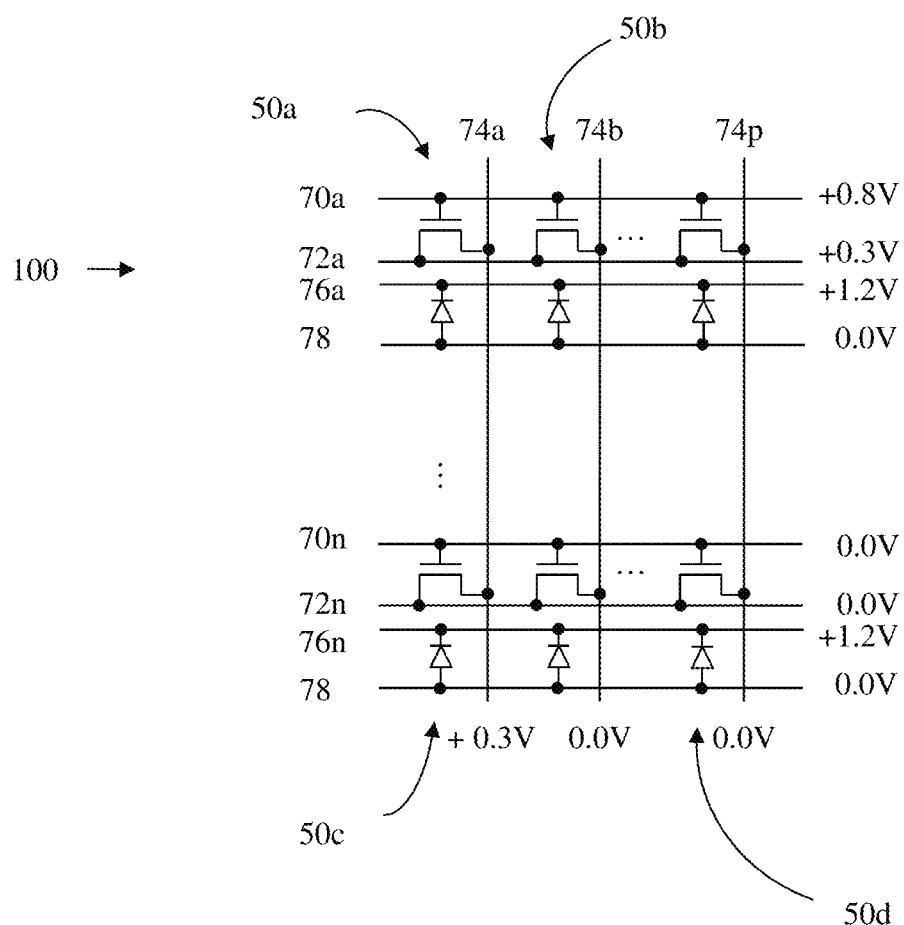
FIGS. 19A and 19B schematically illustrate a write logic-1 operation performed on a memory array according to another embodiment of the present invention.
Figure 19B:
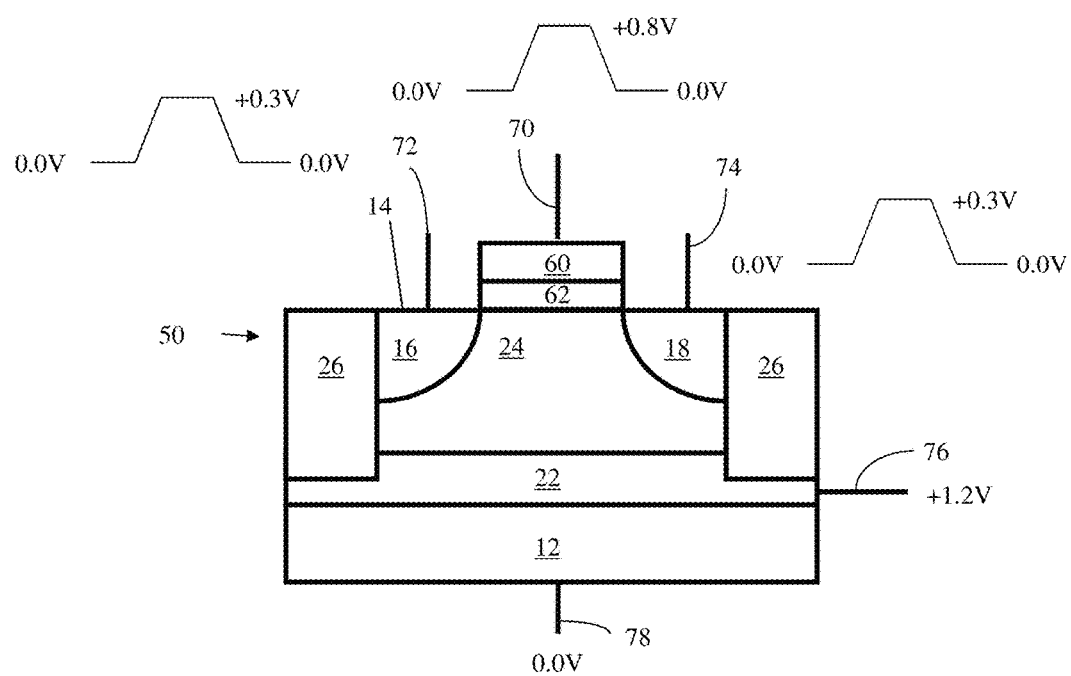

FIGS. 19A and 19B show a write logic-1 operation according to another embodiment of the present invention, where the following bias conditions are applied to the memory array 100: a positive voltage is applied to the selected BW terminal 76a, a positive voltage is applied to the selected BL terminal 74a, a positive voltage is applied to the selected SL terminal 72a, a positive voltage is applied to the selected WL terminal 70a, while zero voltage is applied to the substrate terminal 78. The combined capacitive coupling by the positive voltage applied to the selected BL terminal 74a, selected SL terminal 72, and the selected WL terminal 70a can be sufficiently high to raise the $V_{FB}$ higher than $V_{TS}$ so as to trigger impact ionization mechanism of vertical bipolar transistors 30a and 30b.

In one particular non-limiting embodiment, the selected WL terminal 70a (electrically connected to gate 60) is increased from the initial/standby condition (e.g. about 0.0V) to the write condition (e.g. about +0.8V), while the selected BL terminal 74a (electrically connected to drain 18) and selected SL terminal 72a (electrically connected to source 16) is increased from the initial/standby condition (e.g. about 0.0V) to the write condition (e.g. about +0.3V). As described, the coupling ratio between the gate electrode 60 and the floating body region 24 is a function of the ramp rate. As a result, a higher ramp rate may assist the write logic-1 operation. However, the voltage ramp rate of the WL terminal 70a also has to be controlled to avoid undesired writing of unselected memory cells 50 in the selected row from logic-0 state to logic-1 state. Similarly, the voltage ramp rate of the BL terminal 74a and SL terminal 72a may also assist the write logic-1 operation. However, the voltage ramp rate of the BL terminal 74a and SL terminal 72a also have to be controlled to avoid undesired writing of unselected memory cells 50 in the selected column from logic-0 state to logic-1 state, for example by designing the timing of the signals generated by analog supply generation/regulation block 135 (see FIG. 1). The ramp rate may be optimized for different process technology depending on the capacitance between the drain region 18 and the floating body region 24. In one particular non-limiting embodiment, the ramp rate of the drain region 18 voltage is designed to be about +0.8V/200 ps. However, this ramp rate may vary, while maintaining a lower ramp rate for the read operation compared to that of the write operation. For example, the ramp rate of the gate 60 voltage may be in the range of about +0.8V/20 ps to +0.8V/2 ns.

Figure 20:
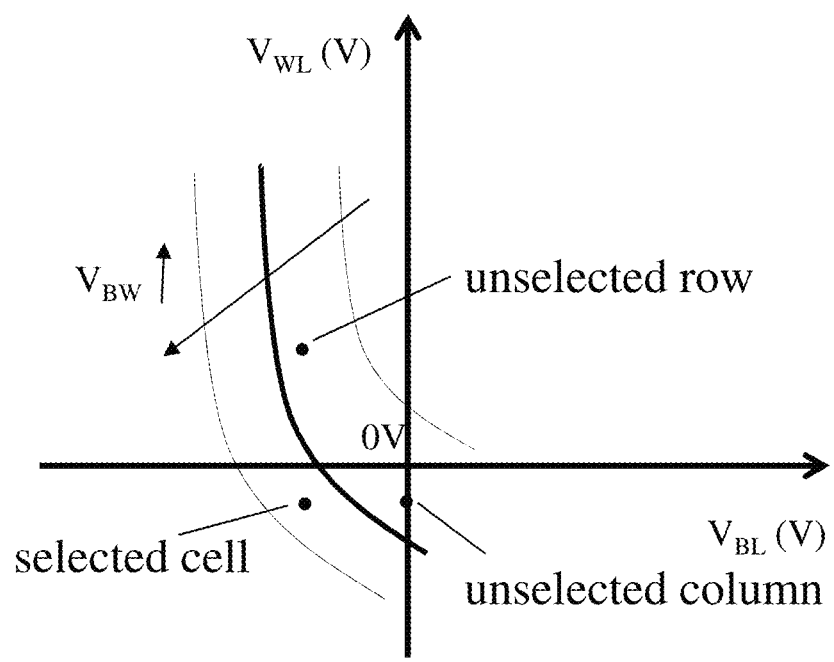
FIG. 20 shows a schematic map of word line voltage and bit line voltage that enables a floating body potential to be lower than a transition voltage for write logic-0, according to an embodiment of the present invention.

FIG. 20 shows a schematic map of word line voltage and bit line voltage that enables a floating body potential to be lower than a transition voltage for write logic-0. At given $V_{BW}$, the writing logic-0 can be accomplished by application of the voltage from left and down side of the curve. If $V_{BW}$ is increased, the positive floating body charge density becomes higher due to the impact ionization of vertical bipolar transistors 30a and 30b. Therefore the higher forward-biased junction current and thus a more negative $V_{BL}$ is necessary to write logic-0. When $V_{BL}$ is highly negative such as −1V, then the forward-biased junction current is predominant so that the all cells connected to the BL shall be written logic-0 regardless of WL voltage. However, if $V_{BL}$ is negative and reasonably small such as −0.2V, the gate capacitive coupling can influence the write logic-0 process. At a fixed $V_{BW}$, when $V_{WL}$ is decreased, $V_{FB}$ becomes lowered due to the capacitive coupling. In this case, the less forward-biased junction current can pull down $V_{FB}$ below $V_{TS}$, which implies that a lower $V_{WL}$ can be used to write logic-0. Conversely, when $V_{WL}$ is increased, $V_{FB}$ becomes increased and the same forward-biased junction current may not sufficient to pull down $V_{FB}$ below $V_{TS}$. Therefore, the bit-selective write logic-0 can be accomplished at fixed negative $V_{BL}$ by choosing a $V_{WL}$ lower than the curve for a selected row and a $V_{WL}$ higher than the curve for the unselected row(s).

Figure 21:
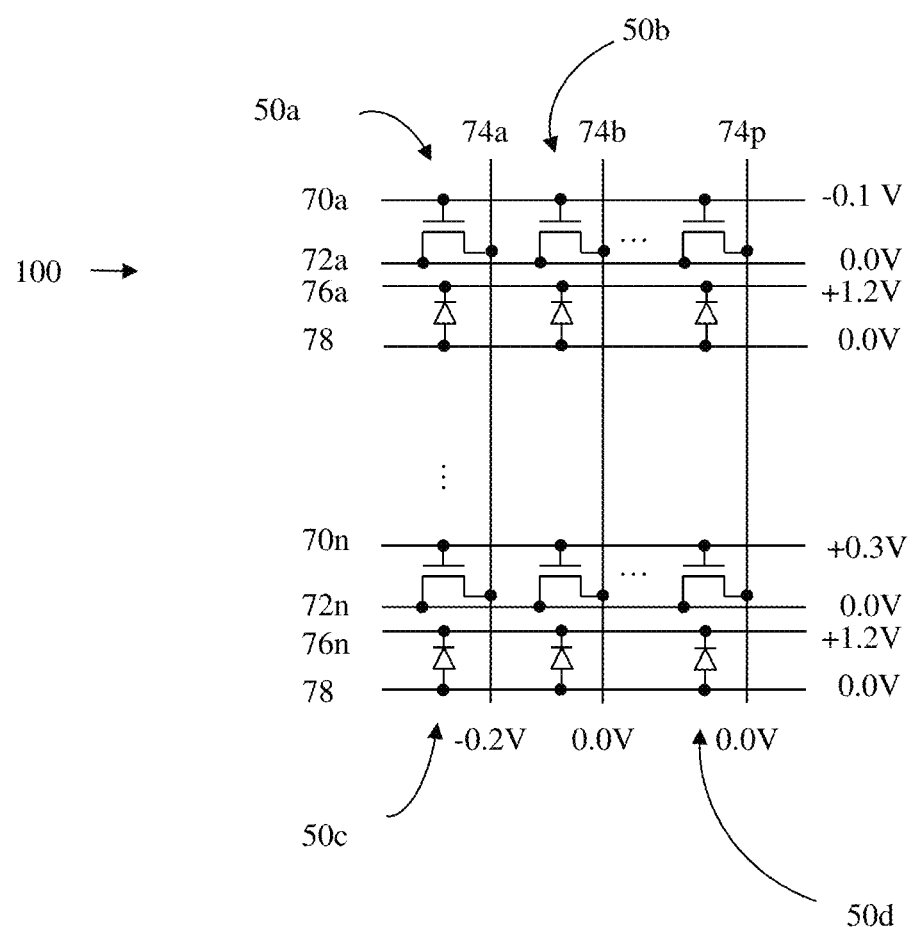
FIG. 21 schematically illustrates a write logic-0 operation performed on a memory array according to an embodiment of the present invention.
Figure 22:
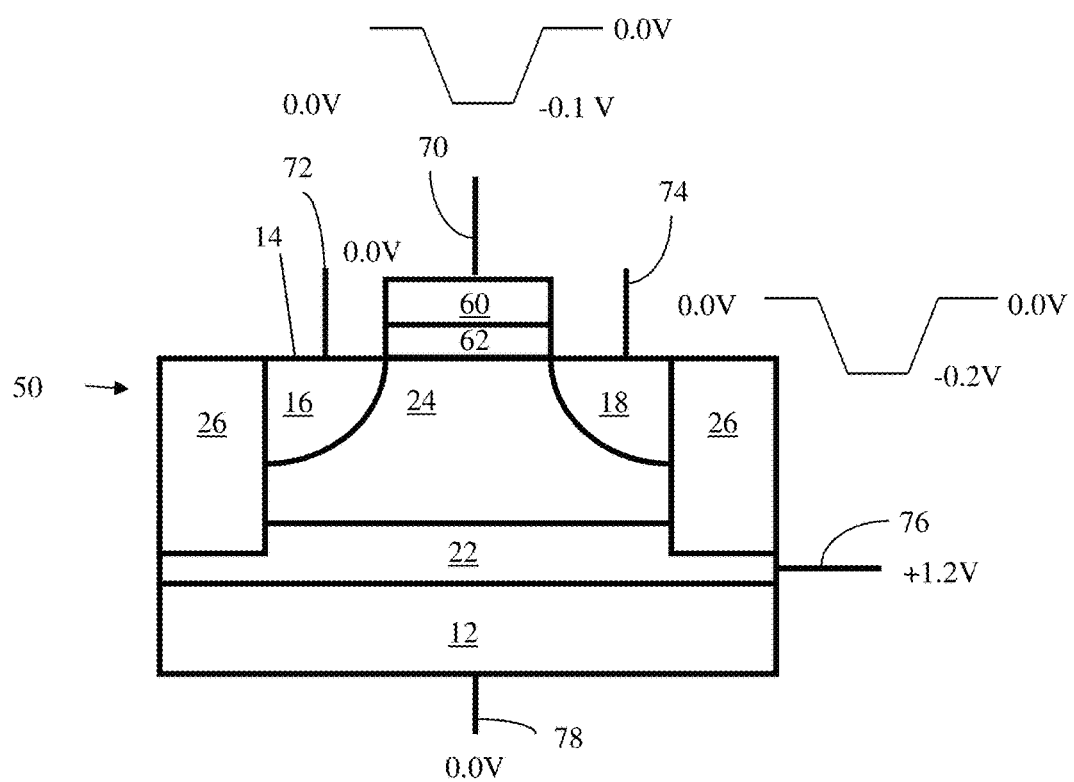
FIG. 22 illustrates bias conditions applied on the terminals of a selected memory cell to perform a write logic-0 operation, according to an embodiment of the present invention.

FIGS. 21 and 22 are schematic illustrations of a memory array 100 and selected memory cell 50, respectively, showing a write logic-0 operation which may be performed through an application of a zero or negative voltage to the selected WL terminal 70a, a negative voltage to selected BL terminal 74a, zero or a positive voltage to the selected BW terminal 76a, zero voltage to the selected SL terminal 72a, and zero or positive voltage to substrate terminal 78. Under these conditions, the floating body 24 potential will decrease through capacitive coupling from the zero or negative voltage applied to the WL terminal 70a. The decrease of floating body 24 potential facilitates the forward junction current by the negative voltage applied to the BL terminal 74, which facilitates pulling the floating body potential below bit transition voltage and thus the cessation of the impact ionization mechanism of vertical bipolar transistors 30a and 30b. Despite the negative voltage applied to the selected BL terminal 74a, the positive voltage applied to the unselected WL terminals 70n can increase floating body potential and thus the forward junction current by the negative voltage applied to the BL terminal 74 may be insufficient to write logic-0. The capacitive coupling from zero voltage applied to the unselected BL terminal 74n and the zero or negative voltage applied to the selected WL terminals 70a can be insufficient to write logic-0.

The selected WL terminal 70a (electrically connected to gate 60) is decreased from the initial/standby condition (e.g. about 0.0V) to the write condition (e.g. about −0.1V). The selected BL terminal 74a (electrically connected to drain 18) is increased from the initial/standby condition (e.g. about 0.0V) to the write condition (e.g. about −0.2V). The unselected WL terminals 70n (electrically connected to gate) are increased from initial/standby condition (e.g. about 0.0V) to the write inhibit condition (e.g. about +0.3V). Similar to that of the read operation, the coupling ratio between the gate electrode 60 and the floating body region 24 is a function of the ramp rate. The voltage ramp rate of the unselected WL terminal 70n also has to be controlled to avoid undesired writing of unselected memory cells 50 in the unselected row from logic-0 state to logic-1 state. The ramp rate may be optimized for different process technology depending on the capacitance between the gate region 60 and the floating body region 24. In one particular non-limiting embodiment, the ramp rate of the gate 60 voltage is designed to be about +0.3V/200 ps. However, this ramp rate may vary, while maintaining a lower ramp compared to that of the write logic-1 operation. For example, the ramp rate of the gate 60 voltage may be in the range of about +0.3V/20 ps to +0.3V/2 ns.

Figure 23:
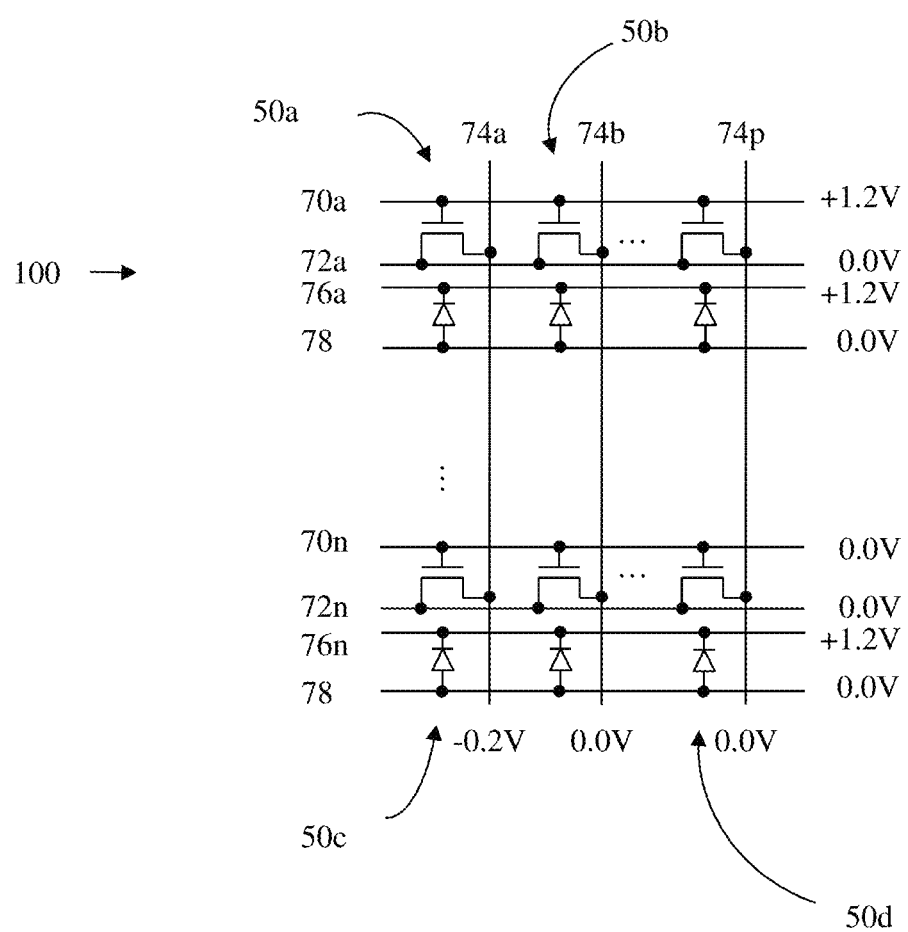
FIG. 23 schematically illustrates a write logic-0 operation performed on a memory array according to another embodiment of the present invention.
Figure 24:
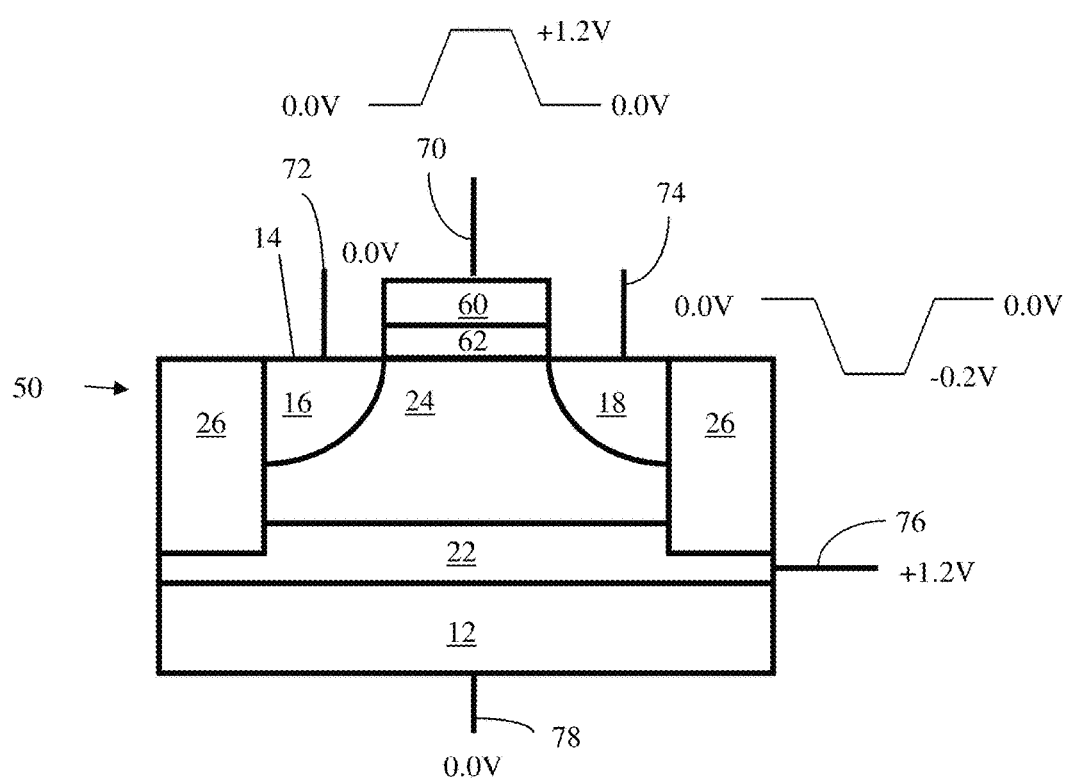
FIG. 24 illustrates bias conditions applied on the terminals of a selected memory cell to perform a write logic-0 operation according to another embodiment of the present invention.

FIGS. 23 and 24 illustrate a schematic illustration of a memory array 100, showing a write logic-0 operation according to another embodiment of the present invention, which may be performed through an application of a positive voltage to the selected WL terminal 70a, a negative voltage to selected BL terminal 74a, zero or a positive voltage to the selected BW terminal 76a, zero voltage to the selected SL terminal 72a, and zero or positive voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and 18 is forward-biased, evacuating any holes from the floating body 24.

The selected WL terminal 70a (electrically connected to gate 60) is raised from the initial/standby condition (for example 0.0V) to the write logic-0 voltage (for example +1.2V). As has been described above, the coupling ratio between the gate electrode 60 and the floating body region 24 is a function of the ramp rate. As a result, a higher ramp rate may assist the write logic-0 operation. However, the voltage ramp rate of the WL terminal 70a also has to be controlled to avoid undesired writing of unselected memory cells 50 in the selected row from logic-0 state to logic-1 state. The ramp rate may be optimized for different process technology depending on the capacitance between the gate region 60 and the floating body region 24. In one particular non-limiting embodiment, the ramp rate of the gate 60 voltage is designed to be about +1.2V/200 ps. However, this ramp rate may vary, while maintaining a lower ramp compared to that of the write logic-1 operation. For example, the ramp rate of the gate 60 voltage may be in the range of about +1.2V/20 ps to +1.2V/2 ns.

After the write logic-0 operation is finished, the potential of the BL terminal 74 is raised from the negative voltage (e.g. about −0.2V) to its standby condition (e.g. about 0.0V). The ramp rate of the BL terminal 74 needs to be controlled to avoid undesired writing of unselected memory cells 50 in the selected column from logic-0 state to logic-1 state as well as undesired reverting of written bit state of the selected memory cell.

Figure 25:
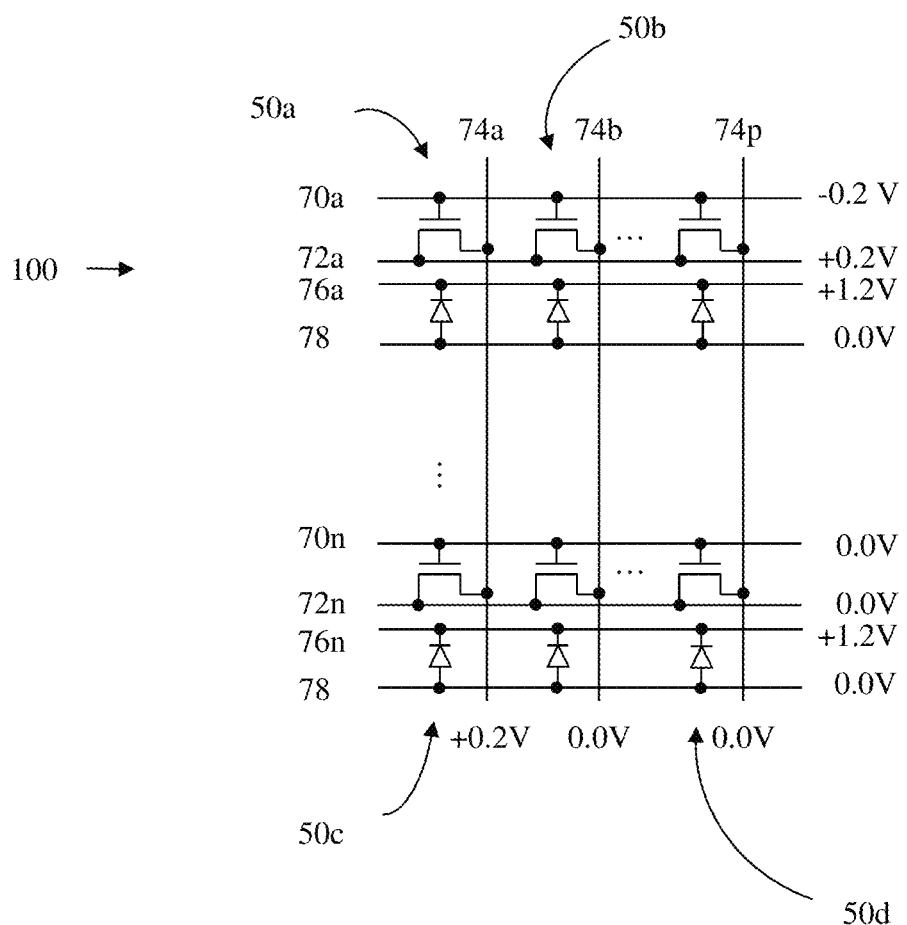
FIG. 25 schematically illustrates a write logic-0 operation performed on a memory array according to another embodiment of the present invention.
Figure 26:
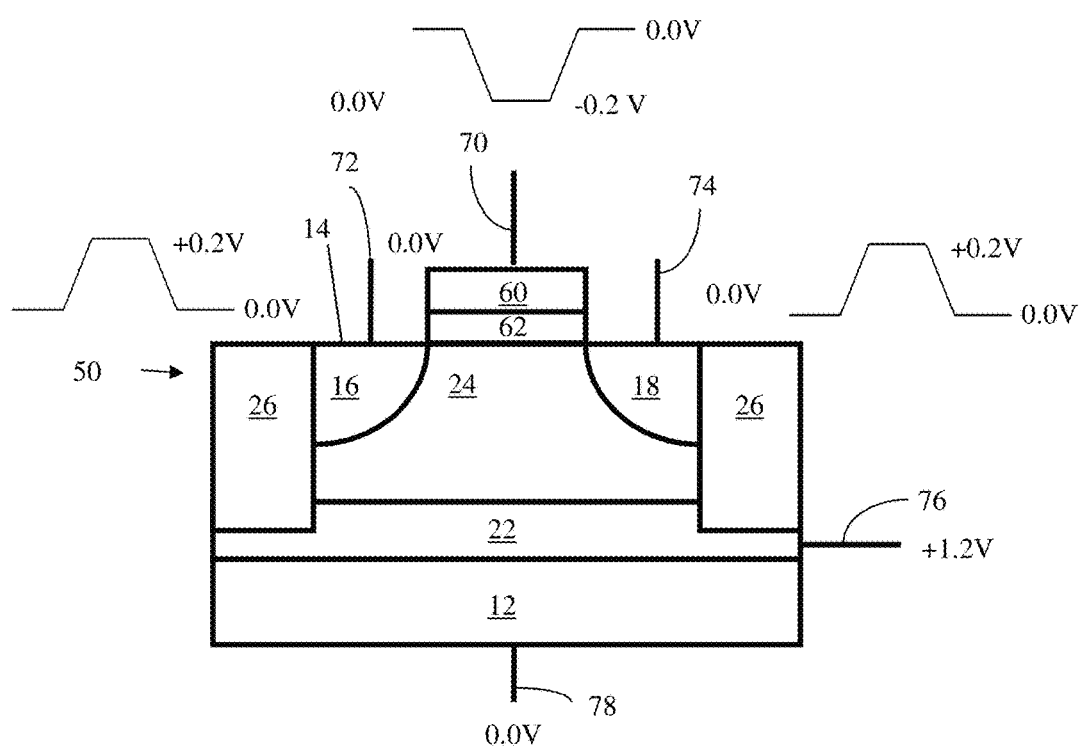
FIG. 26 illustrates bias conditions applied on the terminals of a selected memory cell to perform a write logic-0 operation according to another embodiment of the present invention.

FIGS. 25 and 26 illustrate a write logic-0 operation according to another embodiment of the present invention. A slight positive voltage is applied to the selected BL terminal 74a and SL terminal 72a. This achieves a similar effect as reducing the $V_{BW}$ as this reduces the potential difference between the BW terminal 76 and the SL and BL terminals 72a and 74a, respectively. A write logic-0 can then be performed to the selected memory cell 50 by lowering the voltage of selected WL terminal 70a, which will lower $V_{FB}$ through capacitive coupling.

In one embodiment, the following bias conditions are applied: the selected WL terminal 70a is decreased from the initial/standby condition (e.g. about 0.0V) to the write condition (e.g. about −0.2V). The selected SL terminal 72a and BL terminal 74a are increased to the write condition (e.g. about +0.2V) from the initial/standby condition (e.g. about 0.0V).

Figure 27:
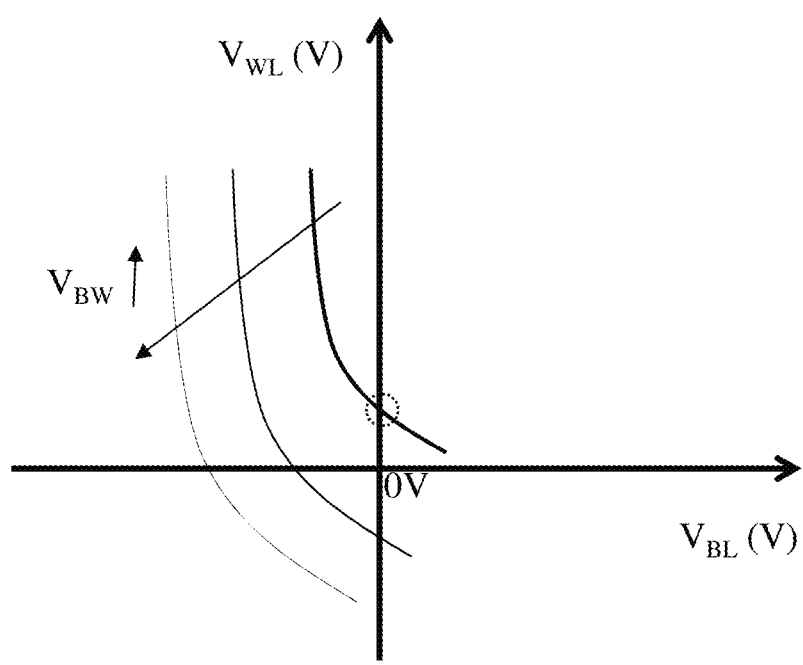
FIG. 27 shows a schematic map of word line voltage and bit line voltage for holding logic-1 states, according to an embodiment of the present invention.

FIG. 27 shows a schematic map of word line voltage and bit line voltage for holding logic-1 states. At given $V_{BW}$, if the bias voltage is formed from left and down side of the curve, the logic-1 states turned to logic-0 state by writing logic-0 mechanism. In practice, the BL voltage for holding is zero in order to not flow BL current. Likewise, the WL voltage for holding tends to be zero in order to shut-off the unselected bit cells. However, if the $V_{DNWL}$ is sufficiently decreased while keeping the data retention capability, the zero voltage to WL may lose logic-1 state even without involving the forward-biased junction current because the capacitive coupling from the gate 60 is solely sufficient to pull down $V_{FB}$ below $V_{TS}$. However, the DNWL current to hold logic-1 at low positive $V_{DNWL}$ and positive $V_{WL}$ can be less than that at high $V_{DNWL}$ and zero $V_{WL}$. With this regards, low $V_{DNWL}$ holding and positive $V_{WL}$ for holding condition can be applied for low-power stand-by mode.

Figure 28:
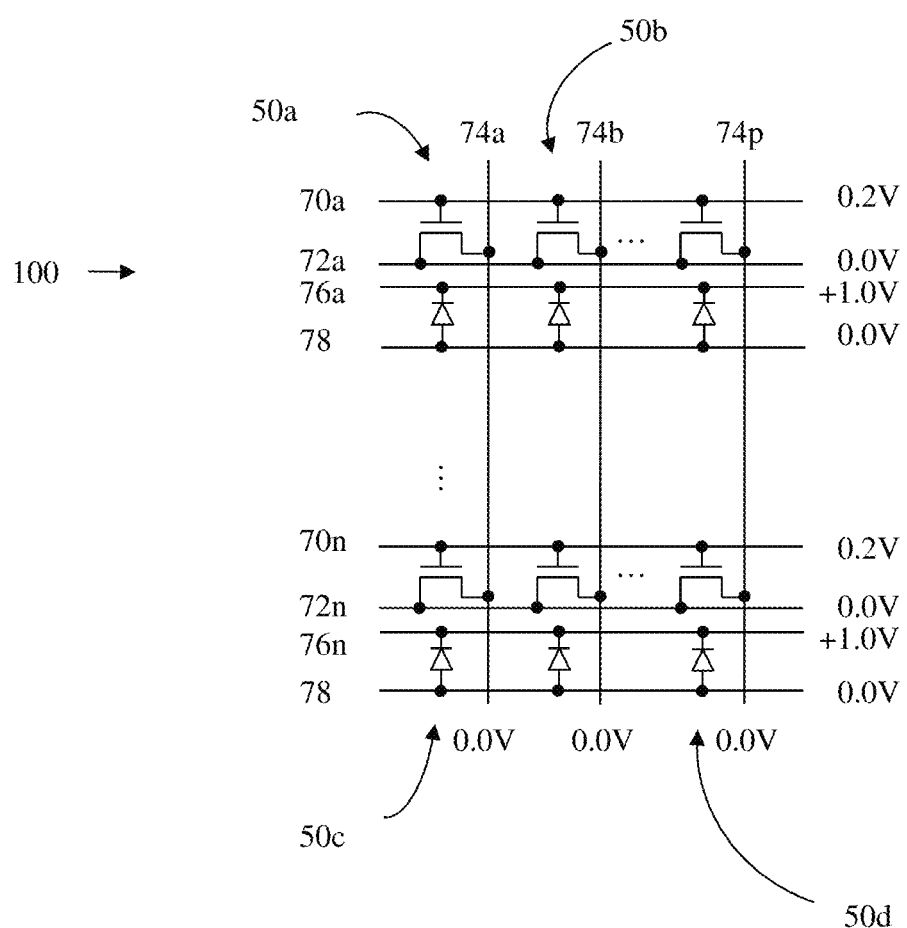
FIG. 28 schematically illustrates a holding operation performed on a memory array according to another embodiment of the present invention.

FIG. 28 schematically illustrates a holding operation performed on a memory array according to another embodiment of the present invention. In one embodiment the bias conditions for the holding operation on memory cell 50 are: +0.2 volts is applied to WL terminal 70, 0 volts is applied to BL terminal 74, 0 volts is applied to SL terminal 72, a positive voltage, for example, +1.0 volts is applied to BW terminal 76, and 0 volts is applied to the substrate terminal 78. In other embodiments, different voltages may be applied to the various terminals of memory cell 50 and the exemplary voltages described are not limiting.

Figure 29A:
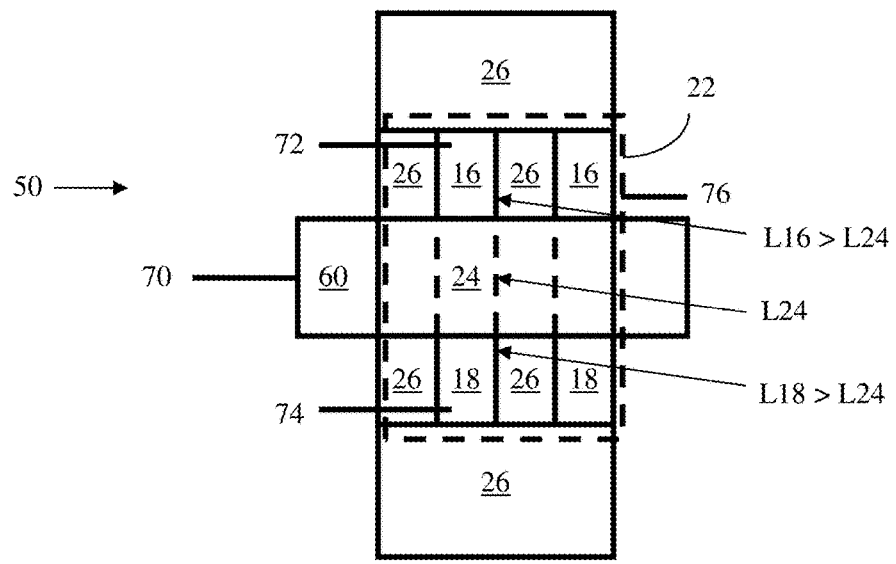
FIGS. 29A and 29B are schematic, top-view illustrations of the memory cell shown in FIGS. 2-4 having increased capacitive coupling from source/drain regions to the floating body region.
Figure 29B:
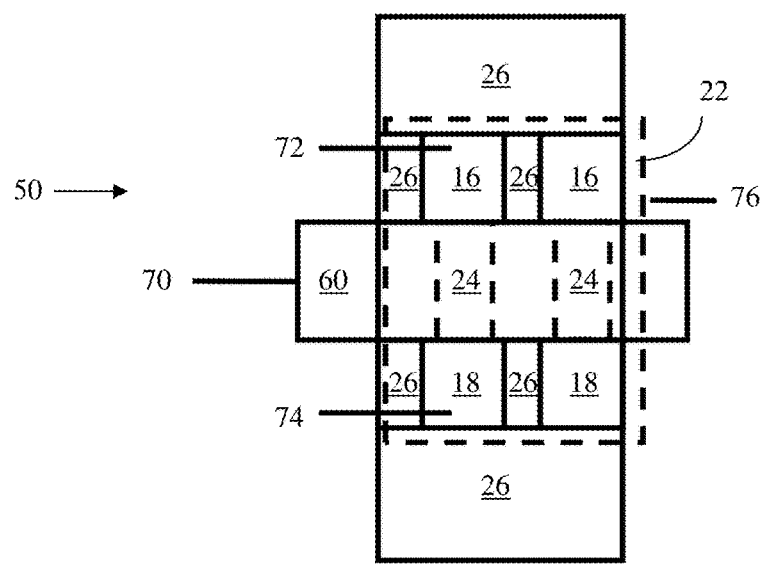

The source and drain capacitance may be increased to improve the coupling of the source and drain potential to the floating body potential. FIGS. 29A and 29B illustrate exemplary layout views of memory cells 50 with increased source and drain capacitive coupling to the floating body region 24. The length of the source and drain regions 16 and 18 (L16 and L18) may be drawn longer than the length of the floating body region 24 (L24) (underneath the gate region 60). In one embodiment, the ratio of the L16 (and L18) and L24 may be greater than two. The ratio may be optimized for different process technology depending on the capacitance between the source/drain region 16/18 and the floating body region 24.

FIG. 29B illustrates another layout view of memory cells 50, where the source/drain regions are drawn wider than the floating body region 24.

Figure 30:
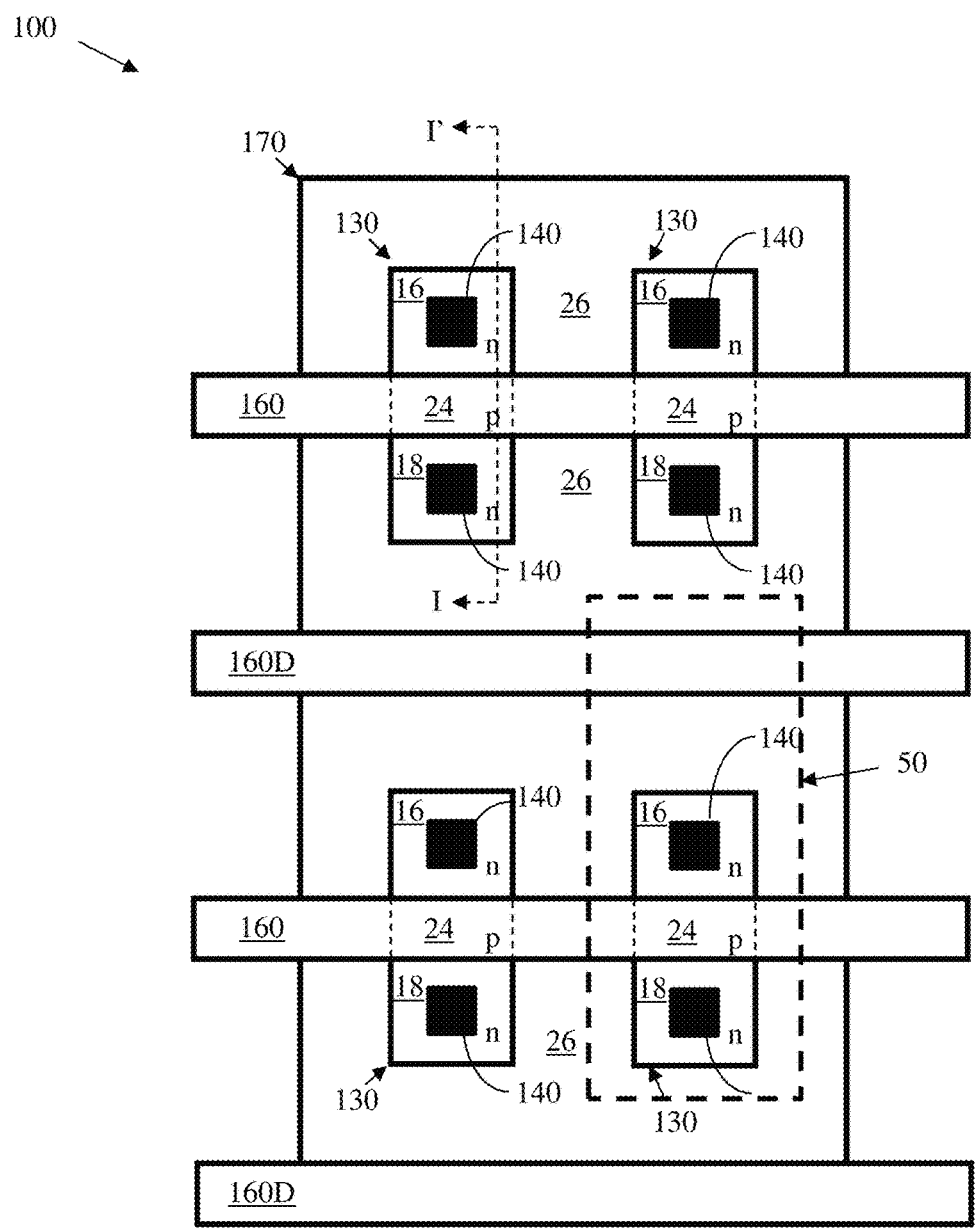
FIG. 30 schematically illustrates a layout view of a memory cell according to another embodiment of the present invention.

FIG. 30 illustrates another layout view of another memory array 100 according to another embodiment of the present invention. The memory array 100 includes an additional dummy POLY layer 160D which does not overlay a DIFF region 130 (hence being referred to as dummy layer). The dummy layer 160D for example may be a result of restrictive design rules (which guides the layout drawing of the layers) for better lithography patterning process. As shown in FIG. 30, the unit cell of the memory cell 50 comprises two POLY 160 regions, one 160D to define the dummy region and another 160 to define the transistor region (overlapping with DIFF layer 130).

Figure 31:
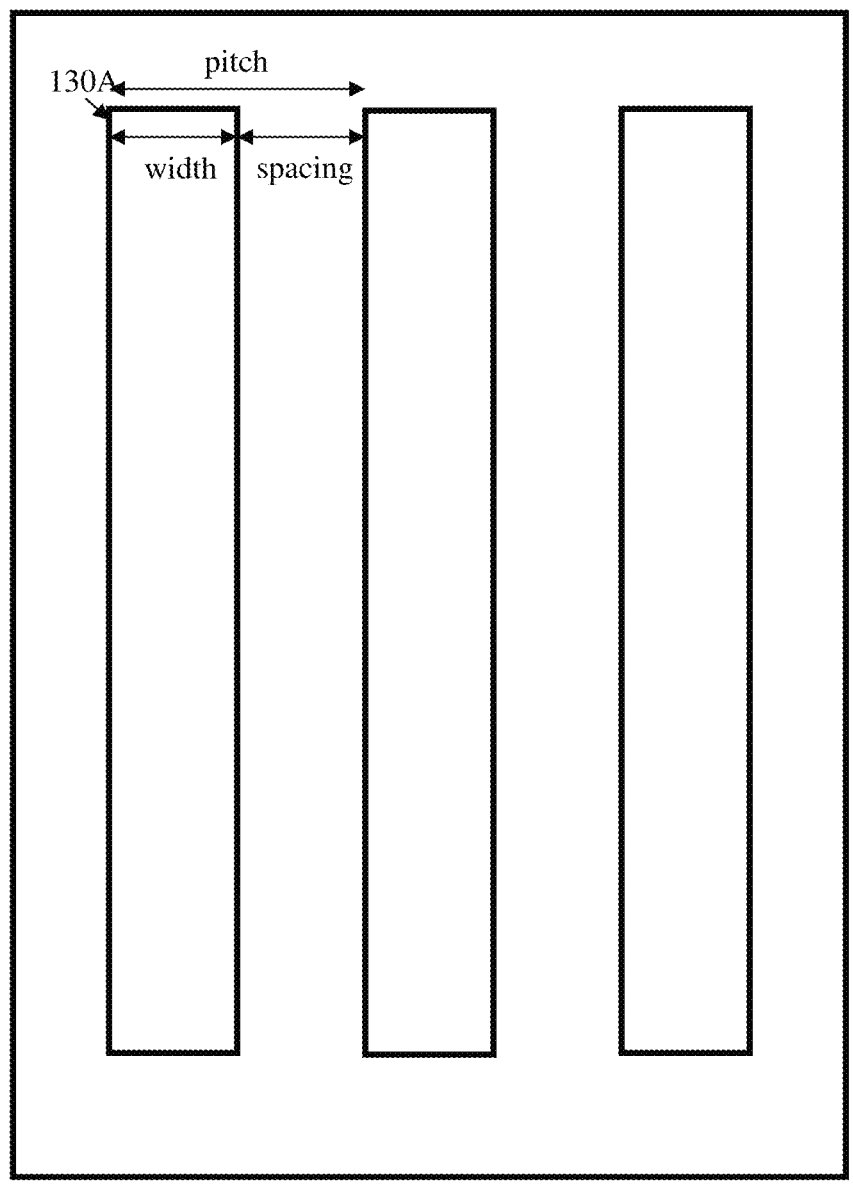
FIGS. 31-34 schematically illustrate lithography steps to form the memory cell shown in FIGS. 1C and 2-4 according an embodiment of the present invention.
Figure 32:
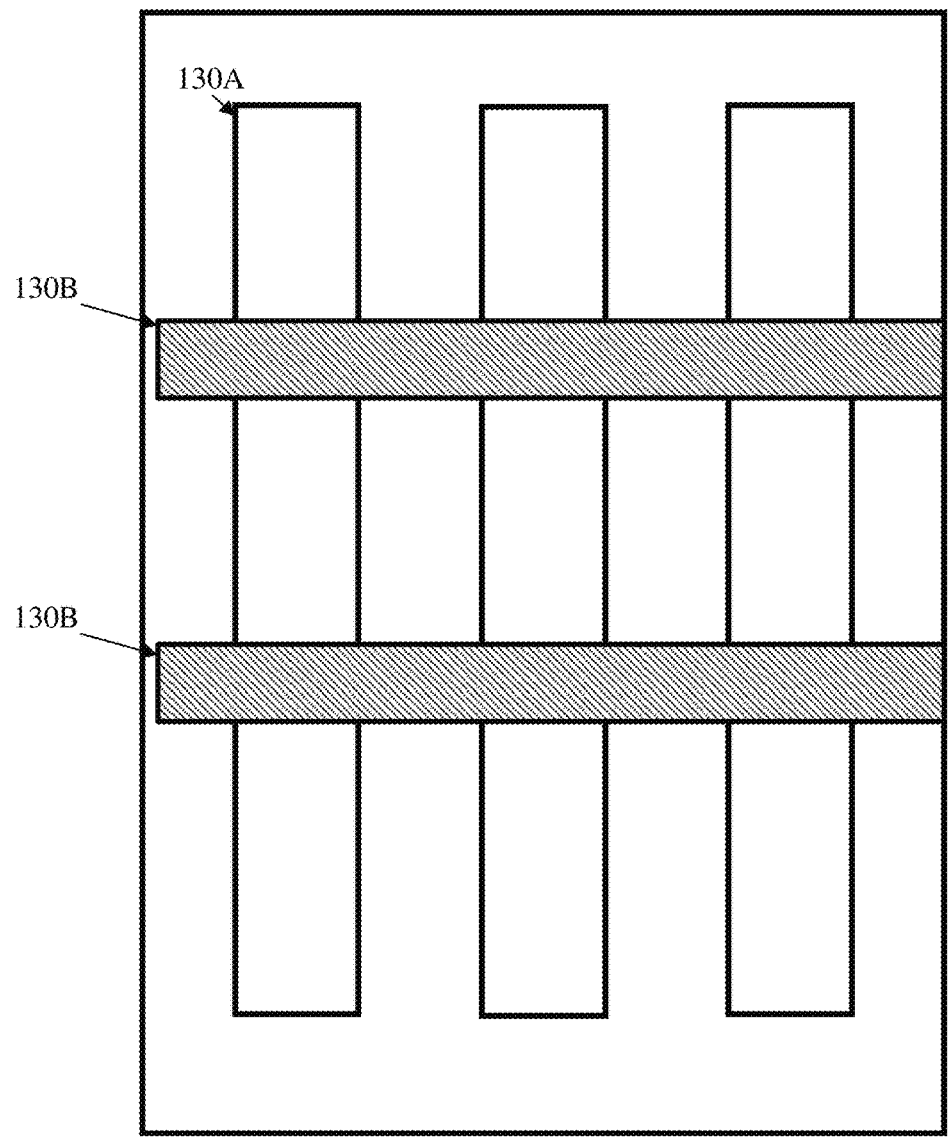
Figure 33:
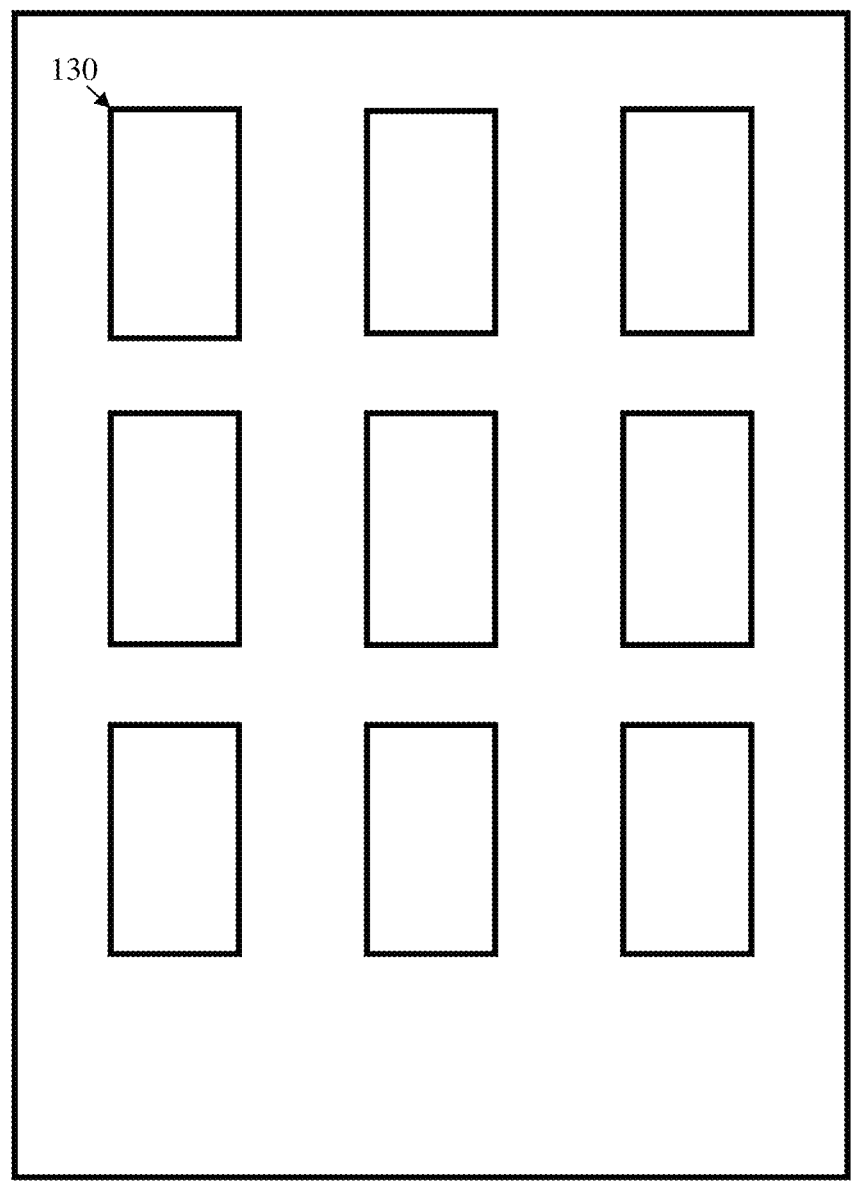
Figure 34:
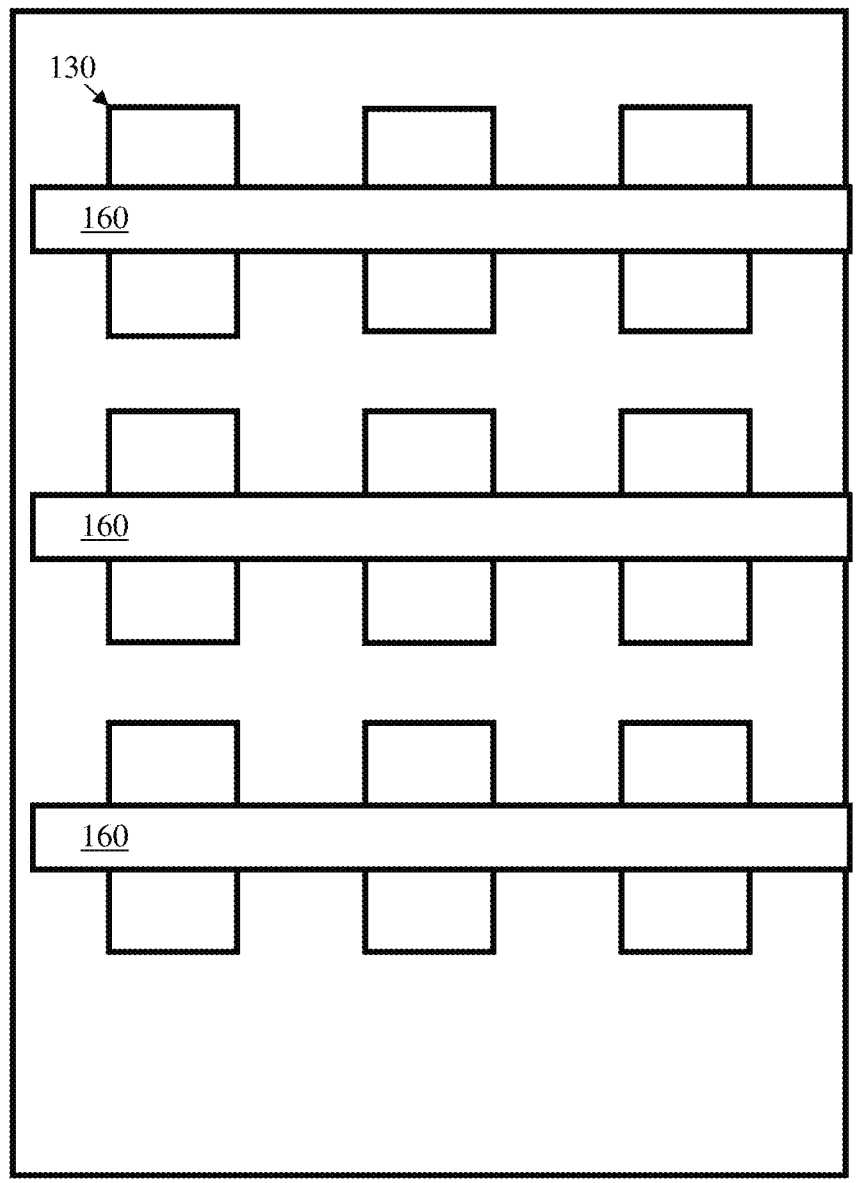

FIGS. 31 to 34 illustrate a lithography process using cut mask to form the layers constructing the memory cell 50 and memory array 100. FIG. 31 illustrates formation of DIFF layers 130A having regular line width and spacing. The DIFF layers 130A may be formed using any lithography techniques including single exposures, multiple patterning techniques such as multiple litho and multiple etch techniques or self-aligned double patterning processes or directed self-assembly for example such as described in Finders, Jo, et al. "Double patterning for 32 nm and below: an update", SPIE Advanced Lithography, International Society for Optics and Photonics, 2008 and Park, Sang-Min, et al. "Sub-10 nm nanofabrication via nanoimprint directed self-assembly of block copolymers", ACS nano 5.11 (2011): 8523-8531, which are hereby incorporated herein, in their entireties, by reference thereto. A cut mask layer 130B (see FIG. 32), which may also have regular line width and spacing, is then used to cut the patterns formed using the DIFF layers 130A resulting in the final structures shown in FIG. 33. POLY layers 160 can then be used to define the gate regions in subsequent process as shown in FIG. 34. The line formation followed by line cut may also be employed to form the POLY layers 160 (as well as other layers used in the fabrication of the memory array 100 and the integrated circuit 1000).

Figure 35:
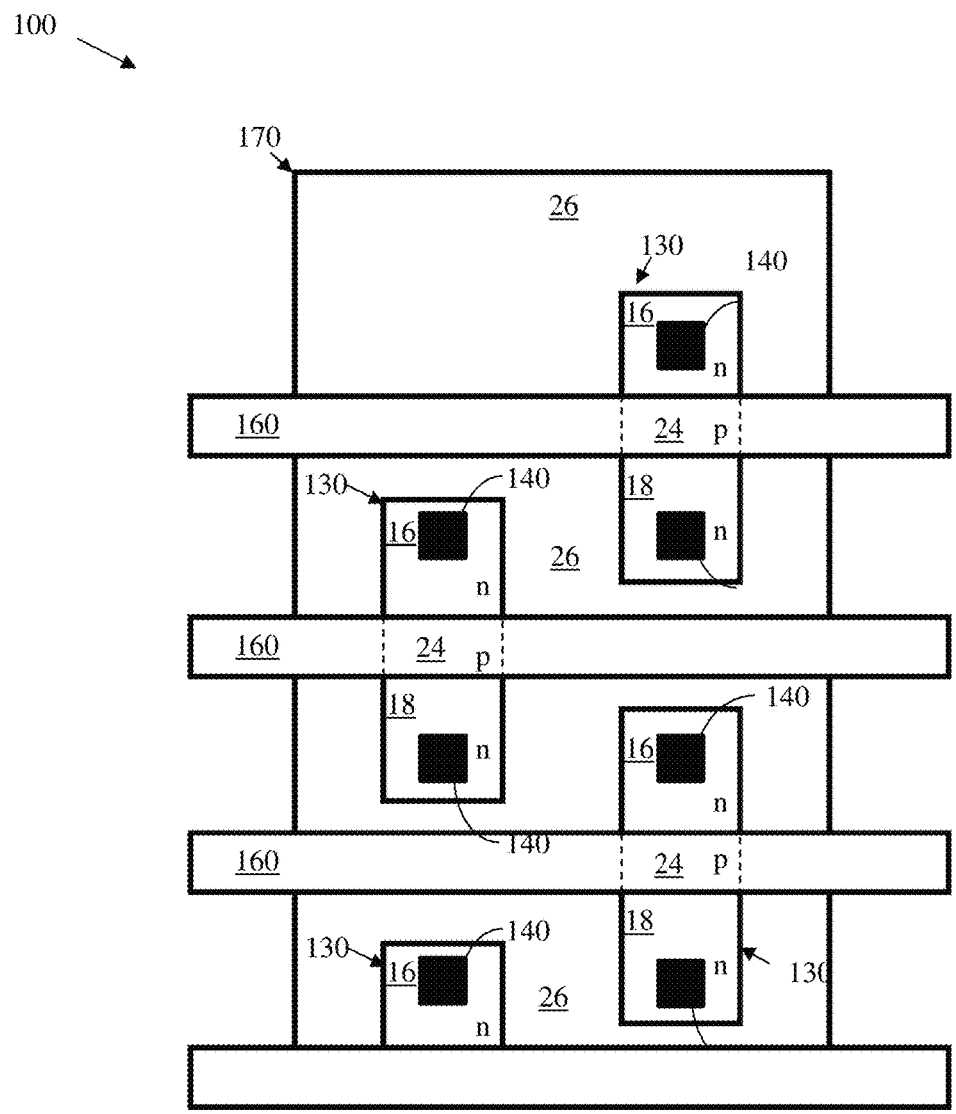
FIGS. 35-37 schematically illustrate multiple cells of the type in FIGS. 2-4 joined in an array according to another embodiment of the present invention.
Figure 36:
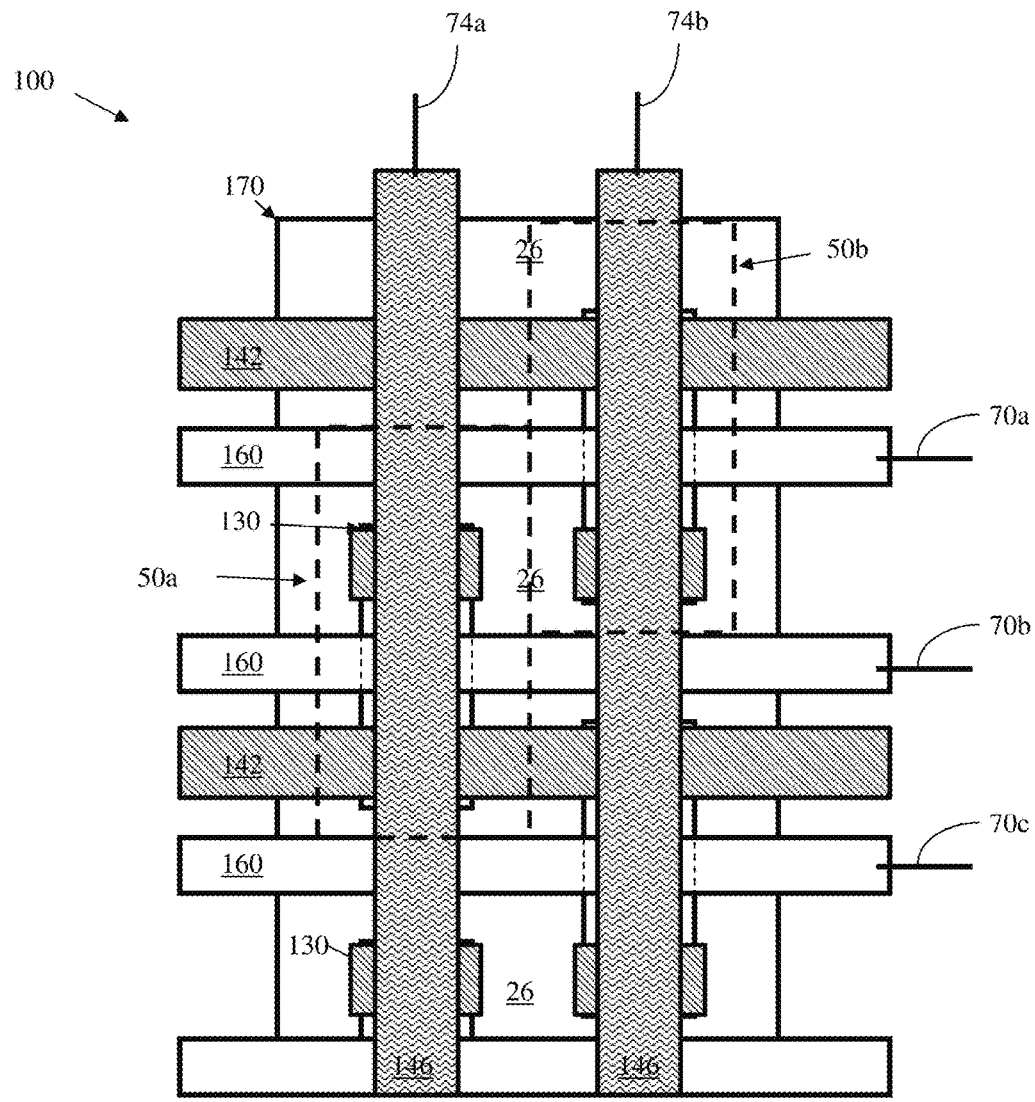
Figure 37:
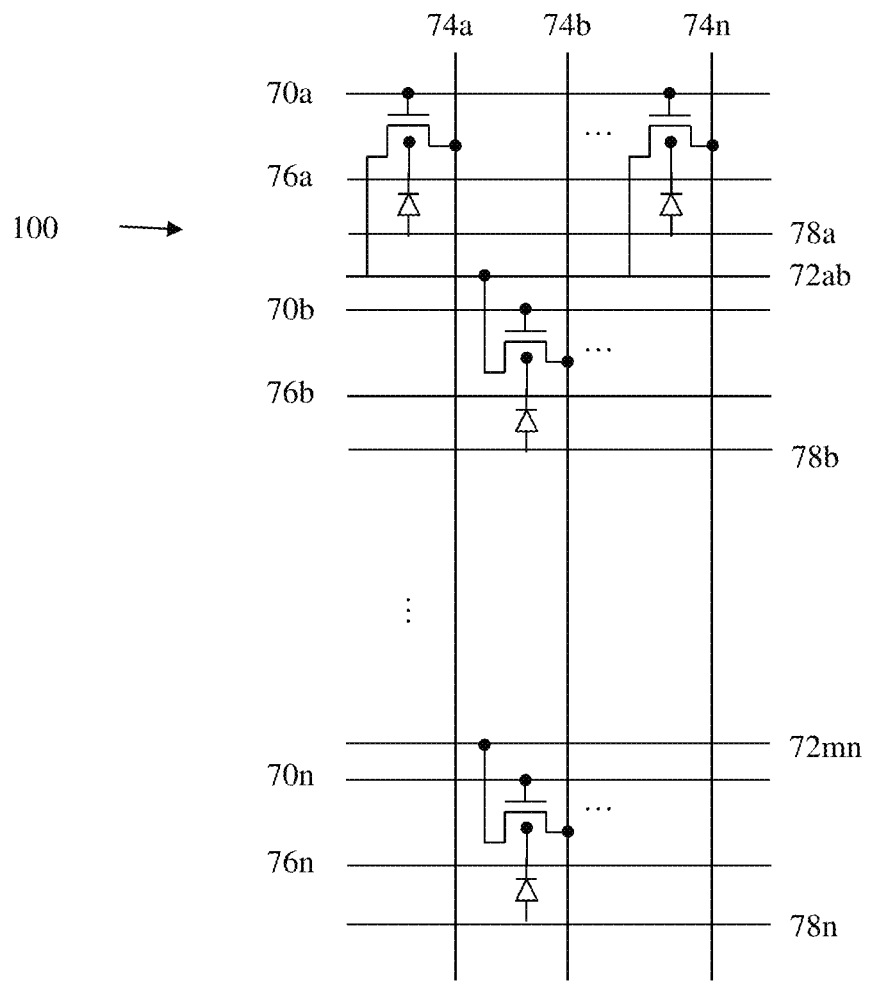

FIGS. 35 and 36 illustrate a schematic layout view of memory array 100 according to another embodiment of the present invention where the DIFF layers 130 are arranged in a staggered or zig-zag pattern. As a result, memory cells in adjacent columns do not share the same POLY layer 160. In the example illustrated in FIG. 36, the first POLY layer 160 is connected to WL terminal 70a and the second POLY layer 160 is connected to WL terminal 70b, while the first METAL2 layer 146 is connected to BL terminal 74a and the second METAL2 layer 146 is connected to BL terminal 74b. As can be seen, memory cells in adjacent columns (for example memory cells 50a and 50b) are connected to different WL terminals (memory cells 50a and 50b are connected to WL terminals 70b and 70a, respectively). This is also illustrated in the equivalent circuit representation of the memory array 100 in FIG. 37. The memory array 100 shown in FIG. 37 may also be referred to as folded memory array architecture.

The folded memory array architecture allows the use of adjacent BL as a reference. In an exemplary read operation illustrated in FIG. 38, the state of memory cell 50a is being sensed. To perform the read operation, the following bias conditions are applied to the selected memory cell 50a: a positive voltage is applied to the BW terminal 76a, zero voltage is applied to the selected SL terminal 72a, a positive voltage (or more positive than the voltage applied to unselected WL terminals) applied to the selected WL terminal 70a, while zero voltage is applied to the substrate terminal 78a. The following bias conditions are applied to the unselected memory cells: a positive voltage is applied to the BW terminal 76, zero voltage is applied to the unselected SL terminal 72, zero voltage is applied to the unselected BL terminal 74, zero voltage (or more negative than the voltage applied to the selected WL terminal 70a) is applied to the unselected WL terminal 70, while zero voltage is applied to the substrate terminal.

The selected BL terminal and the BL terminal directly adjacent to it, for example BL terminals 74a and 74b are pre-charged to a positive voltage, for example Vdd/2. After the pre-charge operation, the charge on the selected BL terminal 74a may or may not be discharged depending on the state of the memory cell 50a. If memory cell 50a is in logic-1 state having a higher conductance, then the charge on the BL terminal 74a will be discharged through the memory cell 50a. If memory cell 50a is in logic-0 state having a lower conductance, then the charge on the BL terminal 74a will be discharged slower compared to if the memory cell 50a is in logic-1 state. Because all the memory cells connected to the BL terminal 74b are unselected (all the unselected WL terminals 70 are turned off), the BL terminal 74b will not be discharged through the unselected memory cells. A sensing circuit, for example a sense amplifier, can then be used to compare the charge of the BL terminals 74a and 74b.

Figure 38:
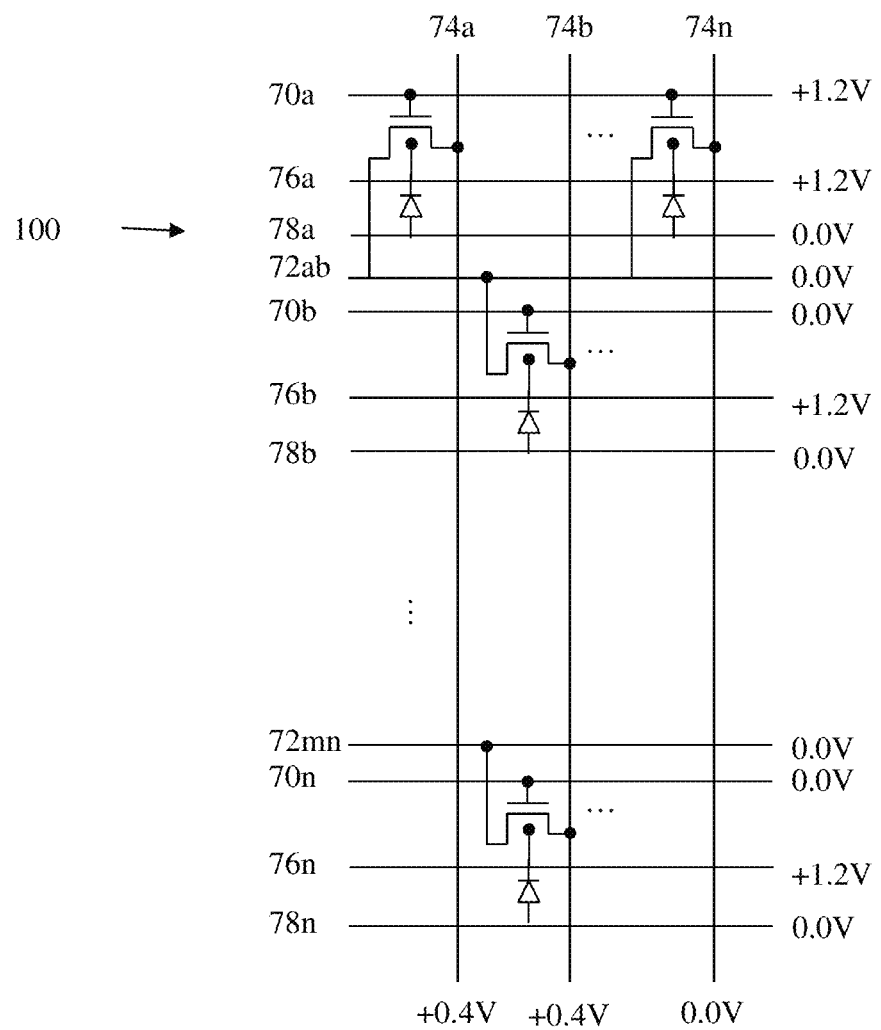
FIG. 38 schematically illustrates a read operation performed on the memory array shown in FIGS. 35-37 according to an embodiment of the present invention.

In one particular non-limiting embodiment, about 0.0 volts is applied to the selected SL terminal 72ab, about +1.2 volts is applied to the selected WL terminal 70a, about +1.2 volts is applied to BW terminal 76, and about 0.0 volts is applied to terminal 78, as illustrated in FIG. 38. The unselected SL terminals 72 remain at 0.0 volts, the unselected BL terminals 74 (other than the adjacent BL terminal 74b) are biased at 0.0 volts, and the unselected WL terminals 70 remain at 0.0 volts as illustrated in FIG. 38. The selected BL terminal 74a and the adjacent BL terminal 74b are then precharged to +0.4 volts. However, these voltage levels may vary while maintaining the relative relationships between voltage levels as generally described above.

Figure 39:
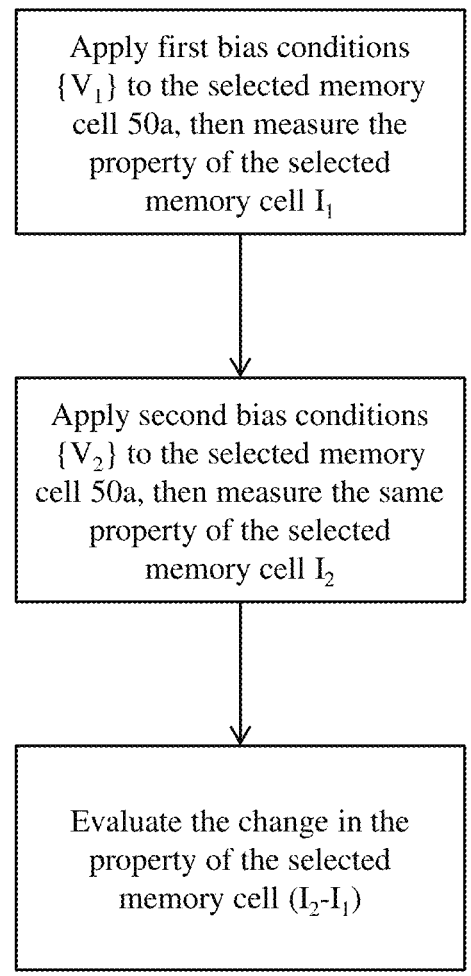
FIGS. 39-40 schematically illustrate self-reference read operation scheme according to an embodiment of the present invention.

FIG. 39 schematically illustrates a self-reference read scheme that may be used to read the state of the memory cell 50 according to an embodiment of the present invention. In this read scheme, a set of bias conditions $\{V_1\}$ is applied to the selected memory cell 50a. A property of the selected memory cell 50a, for example the drain current $I_{BL1}$ (flowing from the BL terminal 74a to the SL terminal 72a) is obtained. A second set of bias conditions is then applied to the selected memory cell 50a $\{V_2\}$ and the same property of the selected memory cell 50a is then measured again, for example the drain $I_{BL2}$. The change in the drain current $(I_{BL2}-I_{BL1})$ due to the change in the applied bias conditions $\{V_2-V_1\}$ depends on the state of the selected memory cell 50a, where $(I_{BL2}-I_{BL1})$ is greater when the selected memory cell 50a is in logic-1 state compared to when the selected memory cell 50a is in logic-0 state. Therefore, the change in the property of the selected memory cell 50a as a result of the change in the applied bias conditions may be used to sense the state of the memory cell 50.

In one particular non-limiting embodiment, the first bias conditions $\{V_1\}$ are as follows: about 0.0 volts is applied to selected SL terminal 72a, about +0.4 volts is applied to the selected BL terminal 74a, about +1.2 volts is applied to the selected WL terminal 70a, about +1.2 volts is applied to selected BW terminal 76a, and about 0.0 volts is applied to terminal 78. The unselected terminals 74 remain at 0.0 volts, the unselected terminals 72, and the unselected terminals 70 remain at 0.0 volts. A property of the selected memory cell 50a, for example the drain current $I_{BL1}$ (flowing from the BL terminal 74a to the SL terminal 72a) is obtained. A second set of bias conditions $\{V_2\}$ is then applied to the selected memory cell 50a, for example by increasing the $V_{BW}$ applied to the selected BW terminal 76a. In one particular non-limiting embodiment, the voltage applied to the selected BW terminal 76a is increased to about +1.3 volts, while the same bias conditions are applied to the other terminals: about 0.0 volts is applied to selected SL terminal 72a, about +0.4 volts is applied to the selected BL terminal 74a, about +1.2 volts is applied to the selected WL terminal 70a, and about 0.0 volts is applied to terminal 78. The same property of the selected memory cell 50a (for example the drain current) is then measured again $I_{BL2}$. The change in the drain cell current $(I_{BL2}-I_{BL1})$ is greater if the selected memory cell 50a is in logic-1 state compared to when the selected memory cell 50a is in logic-0 state. The change in drain cell current may be optimized for different process technology. In one particular non-limiting embodiment, almost no (or very small) cell current change (for example, less than 100 nA) is observed if selected memory cell 50a is in logic-0 state, and 5 μA cell current change is observed if selected memory cell 50a is in logic-1 state. However, the resulting cell current change may vary, which may be a result of different bias conditions and/or the process steps forming the memory cell 50, for example the ion implantation dose and energy forming the floating body region 24 and/or the buried region 22 and the thermal annealing step. For example, less than 500 nA cell current change may be observed for memory cell in logic-0 state and between 100 nA and 50 μA difference may be observed for memory cell in logic-1 state.

In another embodiment, the $V_{BW}$ is kept the same in the second bias conditions, and the bias conditions to the other terminals are changed. For example, second bias conditions may be applied as follows: about −0.1 volts is applied to the selected SL terminal 72a, about +0.3 volts is applied to the selected BL terminal 74a, about +1.1 volts is applied to the selected WL terminal 70a, about +1.2 volts is applied to the selected BW terminal 76a, and about 0.0 volts is applied to the substrate terminal 78. The drain current $I_{BL}$ (flowing from the BL terminal 74a to the SL terminal 72a) is then compared. The difference in the drain cell current ($I_{BL2}$−$I_{BL1}$) is greater if the selected memory cell 50a is in logic-1 state compared to when the selected memory cell 50a is in logic-0 state.

Figure 40:
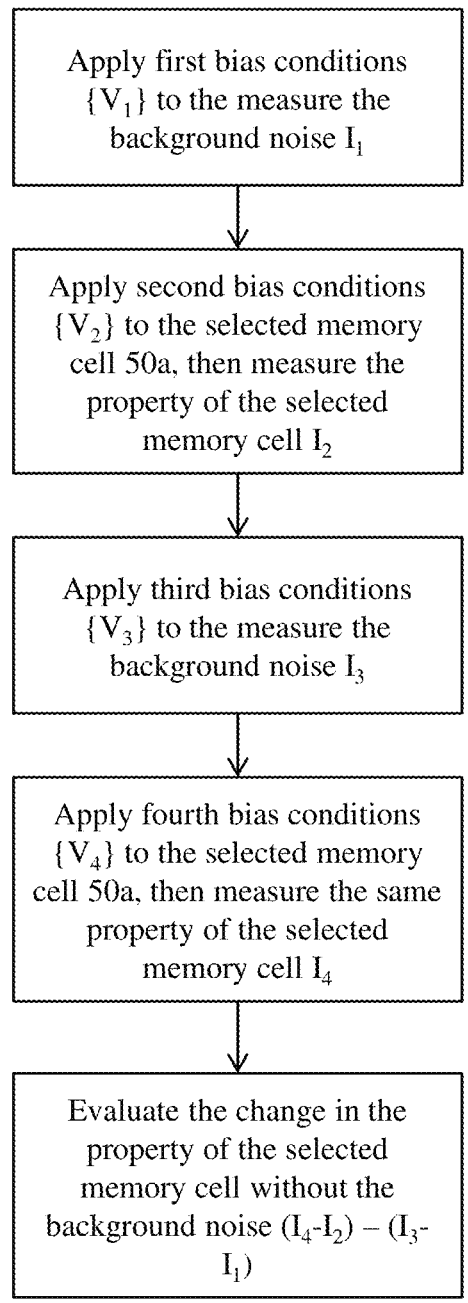

FIG. 40 schematically illustrates a self-reference read scheme that may be used to read the state of the memory cell 50 according to another embodiment of the present invention. In this scheme, four sets of bias conditions ({$V_1$}, {$V_2$}, {$V_3$}, and {$V_4$}) are applied to the selected memory cell 50a. In this read scheme, two sets of the bias conditions, for example {$V_1$} and {$V_3$}, are used to measure the background noise information. In one embodiment, in order to measure the background noise, the same bias conditions are applied to the selected and unselected cells. The other two sets of bias conditions, for example {$V_2$} and {$V_4$}, are used to measure the change in the selected cell properties (for example the drain current $I_{BL}$) due to the change in the bias conditions.

In one particular non-limiting embodiment, a first set of bias conditions {$V_1$} is as follows: about 0.0 volts is applied to selected SL terminal 72a, about +0.4 volts is applied to the selected BL terminal 74a, about 0.0 volts is applied to the selected WL terminal 70a, about +1.2 volts is applied to selected BW terminal 76a, and about 0.0 volts is applied to terminal 78. The unselected terminals 74 remain at 0.0 volts, the unselected terminals 72, and the unselected terminals 70 remain at 0.0 volts. $I_{BL1}$ can then be measured and is a measure of the current contribution from the unselected cells along the selected BL 74a.

A second set of bias conditions {$V_2$} is as follows: about 0.0 volts is applied to selected SL terminal 72a, about +0.4 volts is applied to the selected BL terminal 74a, about +1.2 volts is applied to the selected WL terminal 70a, about +1.2 volts is applied to selected BW terminal 76a, and about 0.0 volts is applied to terminal 78. The unselected terminals 74 remain at 0.0 volts, the unselected terminals 72, and the unselected terminals 70 remain at 0.0 volts. The drain current $I_{BL2}$ can then be measured.

The bias conditions applied to the memory array 100 can then be modified. For example, the $V_{BW}$ applied to the selected BW terminal 76 may be increased in {$V_3$} and {$V_4$}. Non-limiting bias conditions {$V_3$} are as follows: about 0.0 volts is applied to selected SL terminal 72a, about +0.4 volts is applied to the selected BL terminal 74a, about 0.0 volts is applied to the selected WL terminal 70a, about +1.3 volts is applied to selected BW terminal 76a, and about 0.0 volts is applied to terminal 78. The unselected terminals 74 remain at 0.0 volts, the unselected terminals 72, the unselected terminals 76 remain at +1.2 volts, and the unselected terminals 70 remain at 0.0 volts. $I_{BL3}$ can then be measured and is a measure of the current contribution from the unselected cells along the selected BL 74a when $V_{BW}$ is changed.

A non-limiting set of bias conditions {$V_4$} is as follows: about 0.0 volts is applied to selected SL terminal 72a, about +0.4 volts is applied to the selected BL terminal 74a, about +1.2 volts is applied to the selected WL terminal 70a, about +1.3 volts is applied to selected BW terminal 76a, and about 0.0 volts is applied to terminal 78. The unselected terminals 74 remain at 0.0 volts, the unselected terminals 72, the unselected terminals 76 remain at +1.2 volts, and the unselected terminals 70 remain at 0.0 volts. The drain current $I_{BL4}$ can then be measured.

The measured properties (($I_{BL4}$−$I_{BL2}$)−($I_{BL3}$−$I_{BL1}$)) reflect the state of the selected memory cell 50a while removing the background noise information due to the unselected cells along the selected BL terminal 74a. The difference in drain currents (($I_{BL4}$−$I_{BL2}$)−($I_{BL3}$−$I_{BL1}$)) is higher when the selected memory cell 50a is in the logic-1 state compared to when the selected memory cell 50a is in the logic-0 state. The change in drain cell current may be optimized for different process technology. In one particular non-limiting embodiment, almost no (or very small) cell current change (for example, less than 100 nA) is observed if selected memory cell 50a is in logic-0 state, and 5 μA cell current change is observed if selected memory cell 50a is in logic-1 state. However, the resulting cell current change may vary, which may be a result of different bias conditions and/or the process steps forming the memory cell 50, for example the ion implantation dose and energy forming the floating body region 24 and/or the buried region 22 and the thermal annealing step. For example, less than 500 nA cell current change may be observed for memory cell in logic-0 state and between 100 nA and 50 μA difference may be observed for memory cell in logic-1 state.

Figure 41:
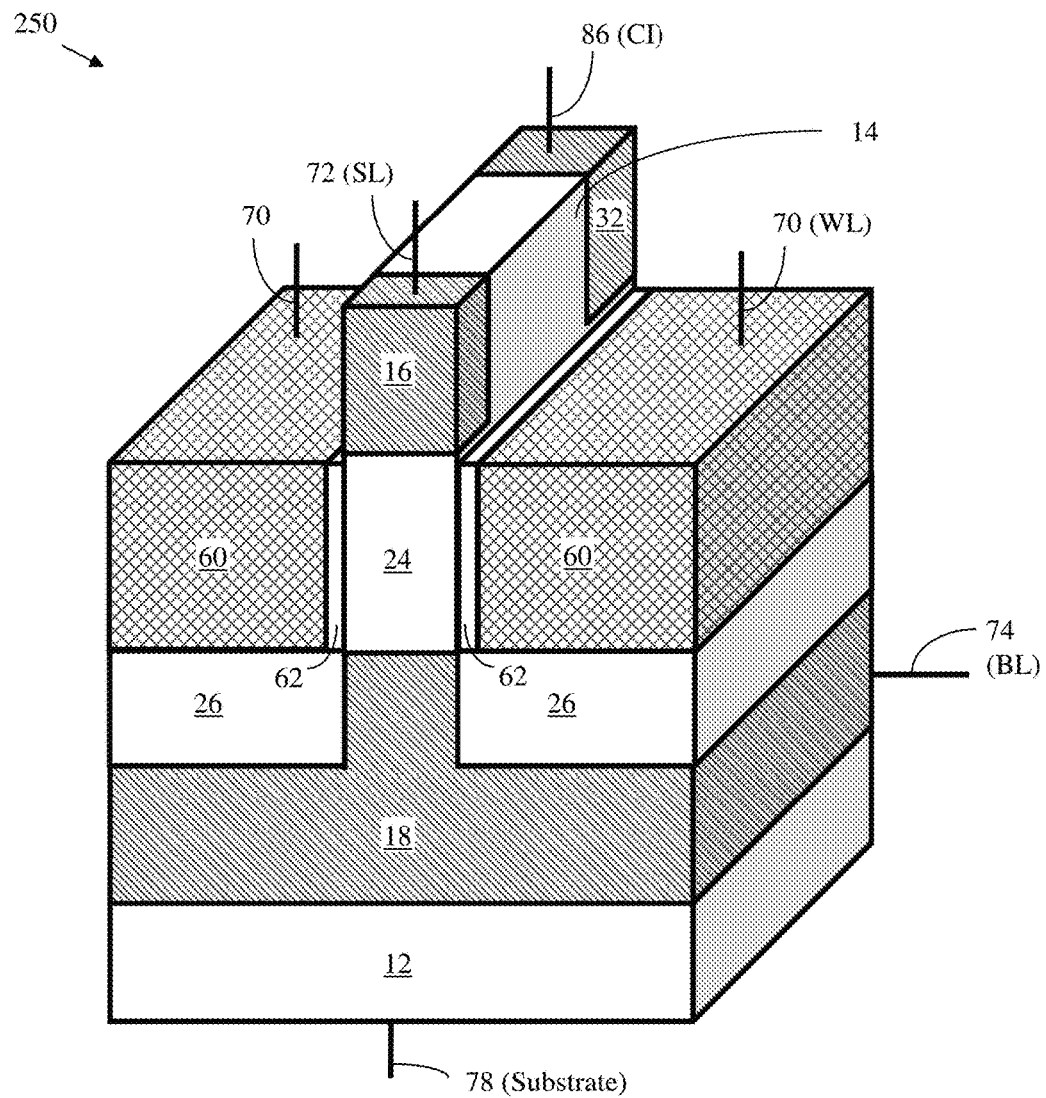
FIGS. 41-42 are schematic, cross-sectional illustrations of a vertical channel memory cell according to another embodiment of the present invention.
Figure 42:
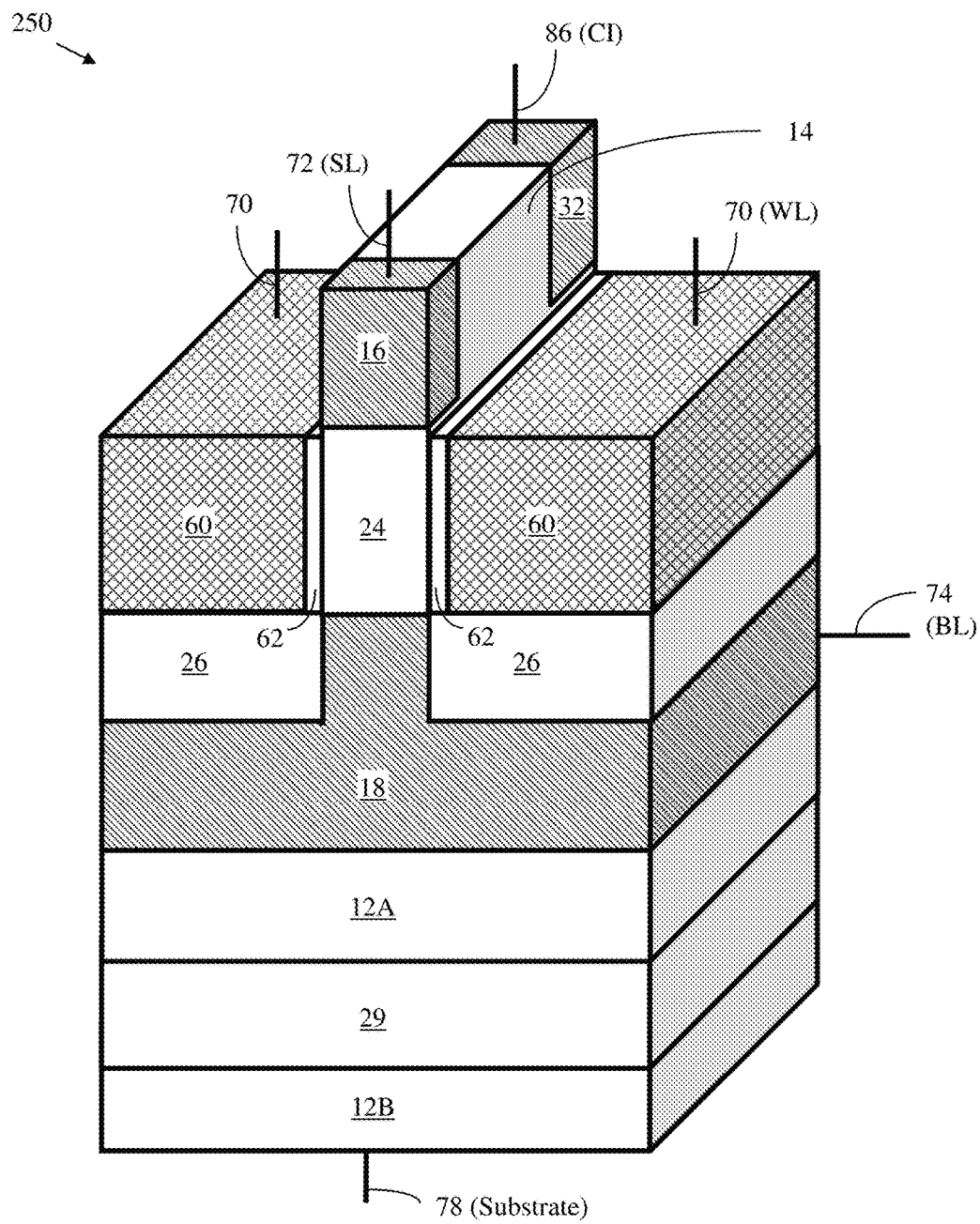

FIGS. 41 and 42 illustrate a vertical channel memory cell 250 according to another embodiment of the present invention. Memory cell 250 includes a substrate 12 of a first conductivity type such as p-type, for example (alternatively, first conductivity type could be n-type). Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment, as shown in FIG. 42, substrate 12A of a first conductivity type (for example, p-type) can be a well of the first conductivity type embedded in a well 29 of the second conductivity type, such as n-type (alternatively, second conductivity type is p-type when first conductivity type is n-type). The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 41.

Memory cell 250 also includes a bit line region 18 of a second conductivity type, such as n-type, for example; a floating body region 24 of the first conductivity type, such as p-type, for example; a source line region 16 of the second conductivity type, such as n-type, for example; and an charge injector region 22 of the second conductivity type, such as n-type, for example.

Bit line region 18 may be formed by an ion implantation process on the material of substrate 12. Alternatively, bit line region 18 can be grown epitaxially on top of substrate 12 or formed through a solid state diffusion process.

The floating body region 24 of the first conductivity type is bounded on top by source line region 16 and charge injector region 32, on the sides by insulating layer 26 (located on a plane to the front of and behind the floating body region 24—not shown in FIGS. 41-42), on the sides by dielectric layer 62 and gate 60, and on the bottom by bit line region 18. Floating body 24 may be the portion of the original substrate 12 above bit line region 18 if bit line region 18 is implanted. Alternatively, floating body 24 may be epitaxially grown. Depending on how bit line region 18 and floating body 24 are formed, floating body 24 may have the same doping as substrate 12 in some embodiments or a different doping, if desired in other embodiments.

A source line region 16 having a second conductivity type, such as n-type, for example, is provided in floating body region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A charge injector 32 having a second conductivity type, such as n-type, for example, is also provided in floating body region 24, so as to bound a portion of the top of the floating body region in a manner discussed above, and is exposed at cell surface 14. Charge injector region 32 may be formed by an implantation process on the material making up substrate 12, according to any implantation process known and typically used in the art. Alternatively, a solid state diffusion or a selective epitaxial growth process could be used to form injector region 22

A gate 60 is positioned in between the source line region 16 and the drain region 18, on the sides of the floating body region 24. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate memory cell 250 from adjacent memory cell 250. The bottom of insulating layer 26 may reside below the bit line region 18 to allow for the bit line region 18 to be continuous in one direction and discontinuous in the other direction. This requires a deeper insulating layer 28 (not shown), which insulates the floating body region 24, but allows the bit line region 18 to be discontinuous in the perpendicular direction of the cross-sectional view shown in FIGS. 41 and 42.

Cell 250 includes several terminals: word line (WL) terminal 70 electrically connected to gate 60, bit line (BL) terminal 74 electrically connected to drain region 18, source line (SL) terminal 72 electrically connected to source line region 16, charge injector (CI) terminal 86 electrically connected to charge injector region 32, and substrate (SUB) terminal 78 electrically connected to the substrate 12.

Figure 43:
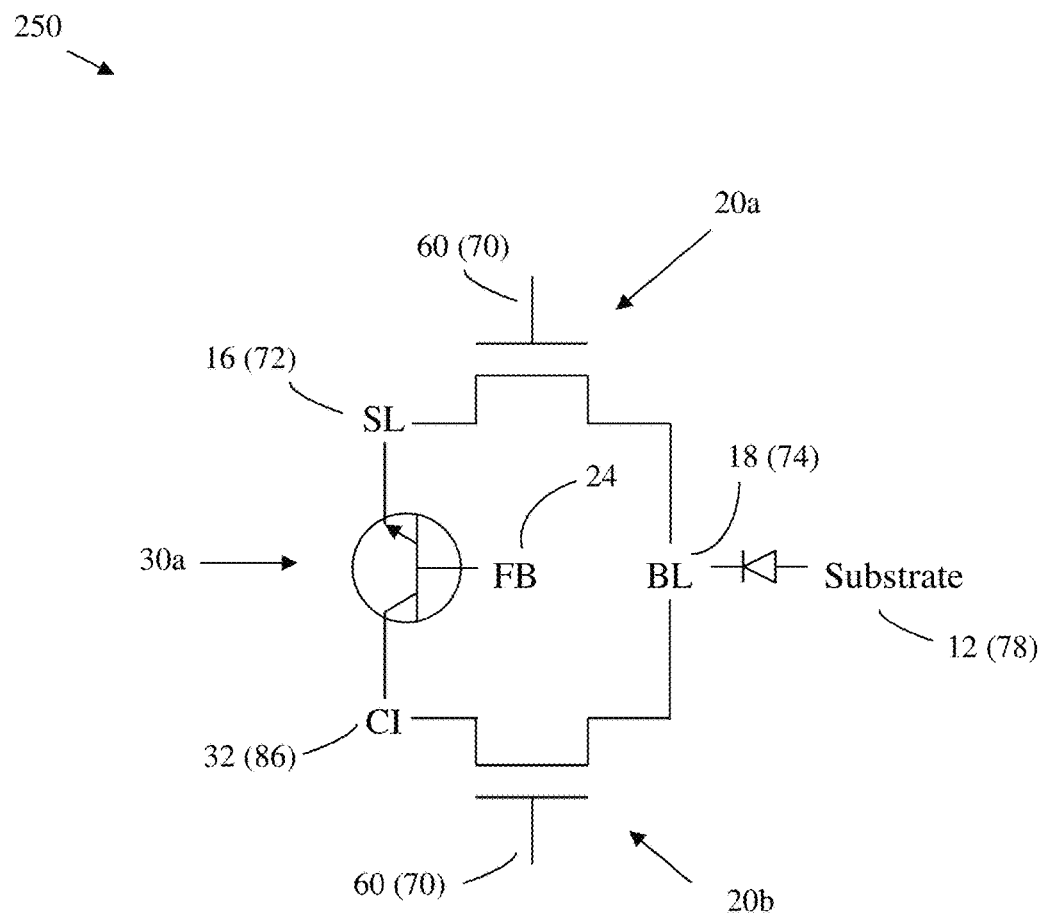
FIG. 43 illustrates an equivalent circuit representation of the memory cell shown in FIGS. 41-42.

FIG. 43 illustrates an equivalent circuit representation of memory cell 250. Inherent in cell 250 is metal-oxide-semiconductor (MOS) transistor 20a formed by source line region 16, gate 60, drain region 18, and floating body region 24. In addition, bipolar transistor 30a formed by source line region 16, floating body region 24, and injector region 32 is also inherent in cell 250. Similarly, MOS transistors 20b— formed by charge injector region 32, gate 60, drain region 18, and floating body region 24—is also inherent in cell 250, as shown in FIG. 43.

In the operation of memory cell 250, the bipolar transistor 30a and/or the transistor 20b is used to maintain the state stored in memory cell 250, while the other transistor 20a is used for the other operations, such as read and write operations.

Figure 44:
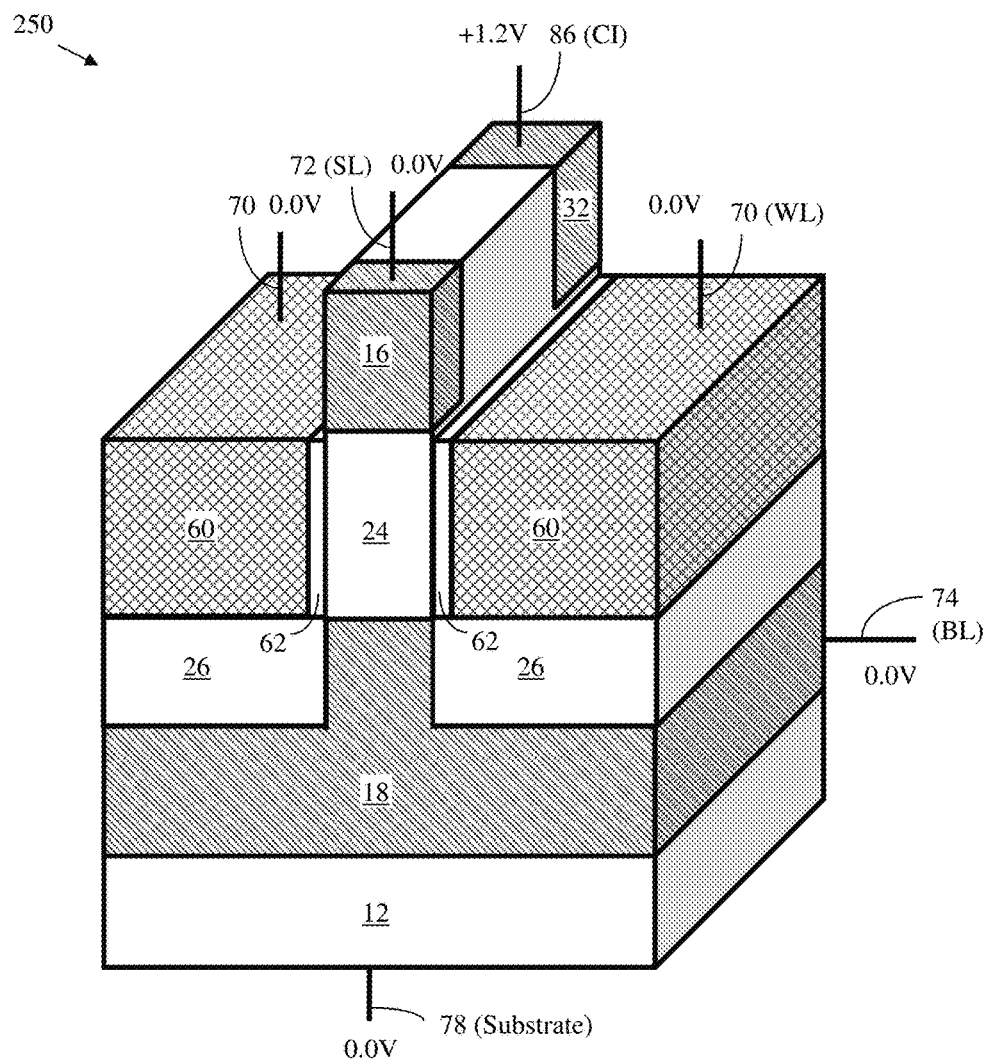
FIG. 44 illustrates bias conditions applied on the terminals of a memory cell to perform a holding operation, according to an embodiment of the present invention.

FIG. 44 illustrates a holding operation being performed on a selected memory cell 250. The holding operation is performed by applying a positive bias to the CI terminal 76, zero or low negative bias on the WL terminal 70 to turn-off the channel region between the bit line region 18 of the memory cell 250 and the injector region 22, and zero bias on the SL terminal 72, SUB terminal 78, and BL terminal 74. The positive bias applied to the charge injector region 22 connected to the CI terminal 76 will maintain the state of the memory cell 250 that it is connected to by maintaining the charge stored in the floating body region 24. The positive bias applied to the CI terminal 76 needs to generate an electric field sufficient to trigger an impact ionization mechanism when the floating body region 24 is positively charged, as will be described through the band diagram shown in FIGS. 45A and 45B.

Figure 45A:
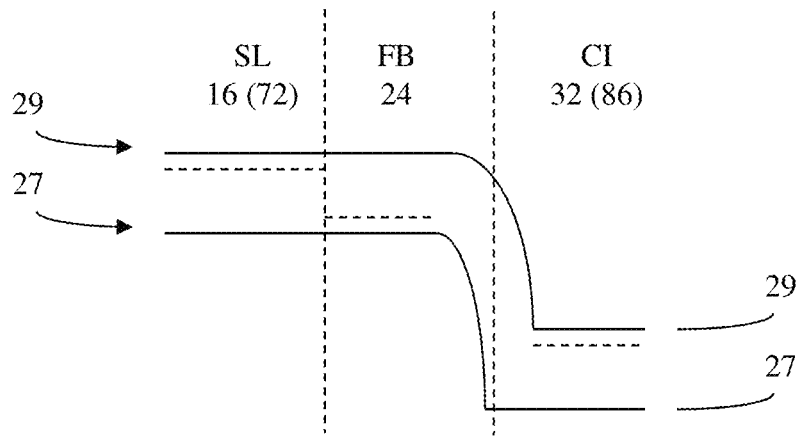
FIG. 45A shows an energy band diagram characterizing an intrinsic bipolar device when a floating body region is positively charged and a positive bias is applied to a buried well region of a memory cell according to an embodiment of the present invention.

FIG. 45A shows an energy band diagram characterizing the intrinsic n-p-n bipolar device 30a formed by source line region 16, floating body region 24, and injector region 32, when the floating body region 24 is positively charged and a positive bias voltage is applied to the charge injector region 32. The vertical dashed lines mark the different regions of the bipolar device 30a. The horizontal dashed lines indicate the Fermi levels in the various regions of the n-p-n transistor 30a. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic "1", the bipolar transistor 30a will be turned on as the positive charge in the floating body region 24 lowers the energy barrier of electron flow from the source line region 16 into the base region (floating body region 24). Once injected into the floating body region 24, the electrons will be swept into the charge injector region 32 (connected to CI terminal 86) due to the positive bias applied to the charge injector region 32. As a result of the positive bias, the electrons are accelerated and create additional hot carriers (hot hole and hot electron pairs) through an impact ionization mechanism. The resulting hot electrons flow into the CI terminal 86 while the resulting hot holes will subsequently flow into the floating body region 24. When the following condition is met: $\beta \times (M-1) \approx 1$—where $\beta$ is the forward common-emitter current gain of the bipolar transistor 30a and M is the impact ionization coefficient—the amount of holes injected into the floating body region 24 compensates for the charge lost due to p-n junction forward bias current between the floating body region 24 and the source line region 16 or bit line region 18 and due to holes recombination. This process maintains the charge (i.e. holes) stored in the floating body region 24 which will keep the n-p-n bipolar transistor 30a on for as long as a positive bias is applied to the charge injector region 32 through CI terminal 86.

If floating body 24 is neutrally charged (the voltage on floating body 24 being equal to the voltage on grounded source line region 16), a state corresponding to logic-0, no (or low) current will flow through the n-p-n bipolar device 30a. The bipolar device 30a will remain off and no impact ionization occurs. Consequently memory cells in the logic-0 state will remain in the logic-0 state.

Figure 45B:
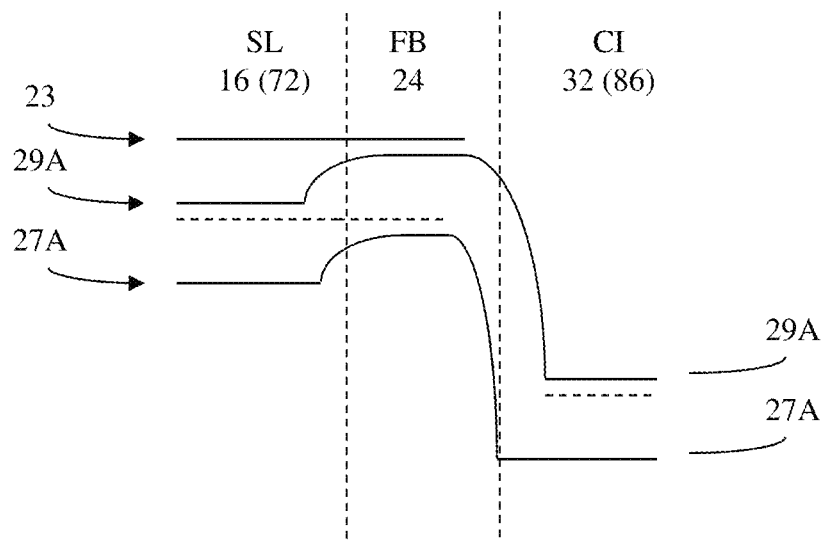
FIG. 45B shows an energy band diagram of an intrinsic bipolar device when a floating body region is neutrally charged and a positive bias is applied to a buried well region of a memory cell according to an embodiment of the present invention.

FIG. 45B shows an energy band diagram of the intrinsic bipolar device 30a when the floating body region 24 is neutrally charged and a bias voltage is applied to the charge injector region 32. In this state the energy level of the band gap bounded by solid lines 27A and 29A is different in the various regions of n-p-n bipolar device 30a. Because the potential of the floating body region 24 and the source line region 16 is equal, the Fermi levels are constant, resulting in an energy barrier between the source line region 16 and the floating body region 24. Solid line 23 indicates, for reference purposes, the energy barrier between the source line region 16 and the floating body region 24. The energy barrier prevents electron flow from the source line region 16 (connected to SL terminal 72) to the floating body region 24. Thus the n-p-n bipolar device 30a will remain off.

Figure 46:
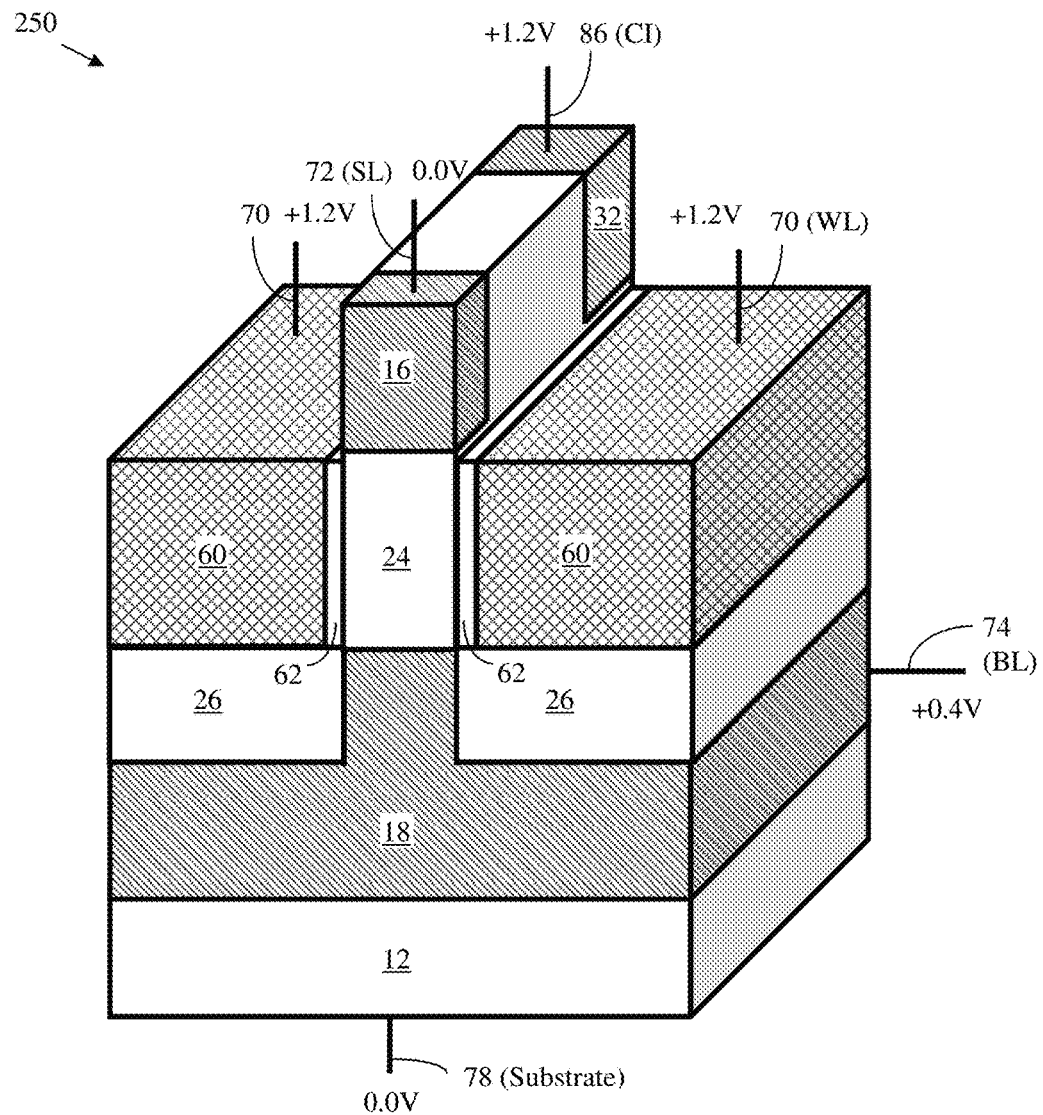
FIG. 46 illustrates bias conditions applied on the terminals of a memory cell to perform a read operation, according to an embodiment of the present invention.

FIG. 46 illustrates an exemplary set of bias conditions for performing a read operation on the memory cell 250 according to an embodiment of the present invention. The read operation is performed by applying the following bias conditions: a positive bias to the WL terminal 70, a positive bias to the BL terminal 74, zero bias to the SL terminal 72, zero or positive bias to the CI terminal 86, and zero bias to the substrate terminal 78. All unselected WL terminals 70 (not shown) have zero or negative bias applied, all unselected BL terminals 74 (not shown) have zero volts applied, all unselected SL terminals 72 (not shown) have zero volts applied, and all unselected CI terminals 86 have zero or positive bias applied.

In one embodiment, the bias conditions for the read operation for memory cell 250 are: about +1.2 volts is applied to WL terminal 70, about +0.4 volts is applied to BL terminal 74, about 0.0 volts is applied to SL terminal 72, about +1.2 volts is applied to CI terminal 86, and about 0.0 volts is applied to substrate terminal 78. In other embodiments, different voltages may be applied to the various terminals of memory cell 250 and the exemplary voltages described are not limiting. The positive voltage applied to BL terminal 74 may be less than the positive voltage applied to WL terminal 70, in which the difference in the threshold voltage of the memory cell 250 is employed to represent the state of the memory cell 250. The positive voltage applied to BL terminal 74 may also be greater than or equal to the positive voltage applied to WL terminal 70 and may generate sufficiently high electric field to trigger the bipolar read mechanism.

A sensing circuit typically connected to BL terminal 74 can be used to determine the data state of the memory cell 250. Any sensing scheme known in the art can be used in conjunction with memory cell 250.

Figure 47:
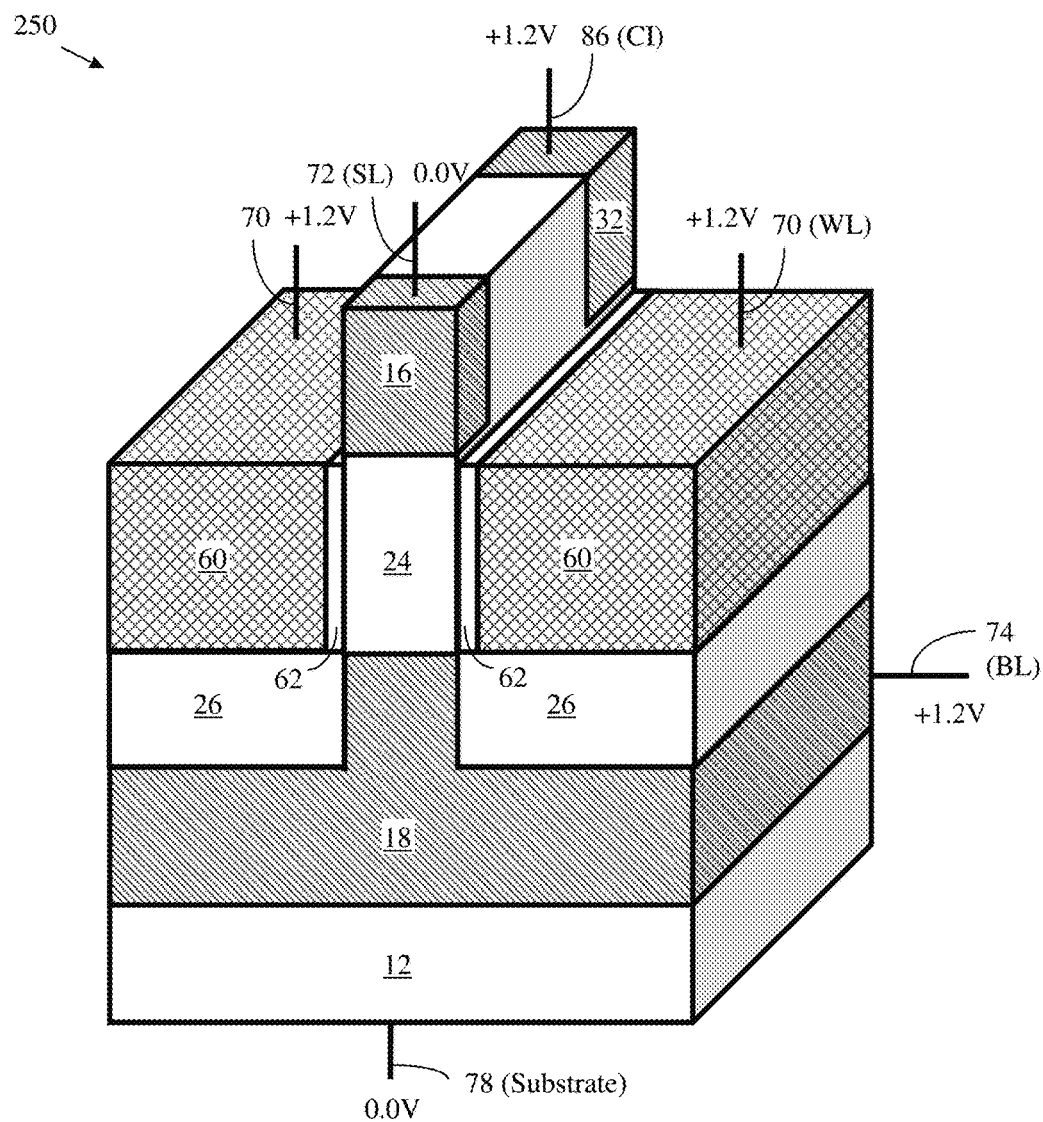
FIGS. 47 and 48 illustrate bias conditions applied on the terminals of a memory cell to perform a write logic-1 operation, according to an embodiment of the present invention.

FIG. 47 is a schematic illustration of a memory cell 250 showing exemplary bias conditions for a write logic-1 operation on the memory cell 250 through an impact ionization mechanism, according to an embodiment of the present invention. The following bias conditions are applied: a positive voltage is applied to the selected WL terminal 70, a positive voltage is applied to the selected BL terminal 74, zero voltage is applied to the selected SL terminal 72, zero or positive voltage is applied to the selected CI terminal 86, and zero voltage is applied to the substrate terminal 78. This positive voltage applied to the selected BL terminal 74 is greater than or equal to the positive voltage applied to the selected WL terminal 70 and may generate a sufficiently high electric field to trigger an impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, about 0.0 volts or +1.2 volts is applied to CI terminal 86, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to unselected CI terminal 86. These voltage levels are exemplary only and may vary from embodiment to embodiment. Thus the exemplary embodiments, features, bias levels, etc., described are not limiting.

Figure 48:
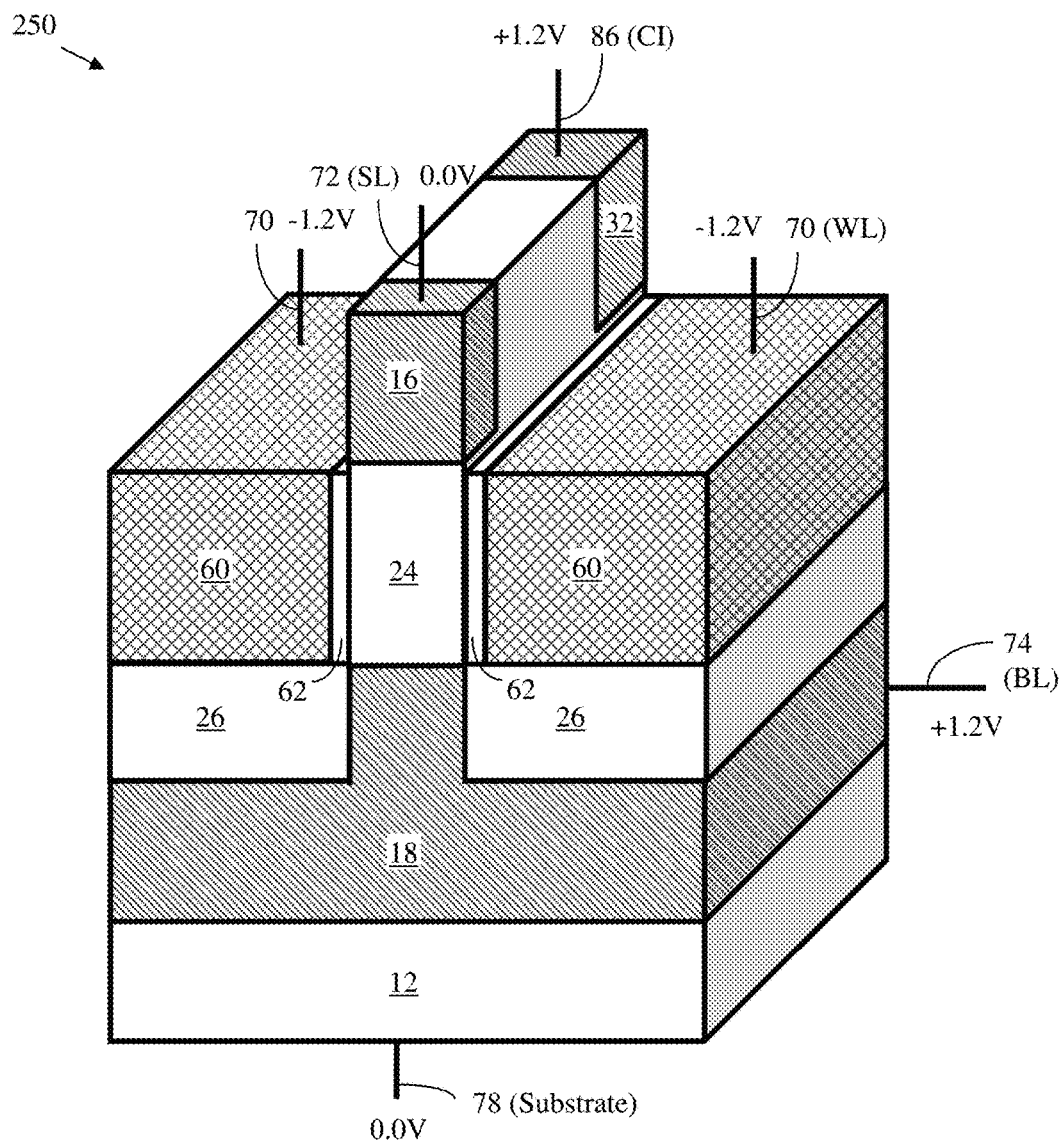

FIG. 48 is a schematic illustration showing bias conditions for a write logic-1 operation using band-to-band tunneling mechanism performed on memory cell 250 according to an embodiment of the present invention. A write logic-1 operation using band-to-band tunneling mechanism can be performed by applying the following bias conditions: a negative voltage is applied to the selected WL terminal 70, a positive voltage is applied to the selected BL terminal 74, zero voltage is applied to the selected SL terminal 72, zero or positive voltage is applied to the selected CI terminal 86, and zero voltage is applied to the substrate terminal 78.

In one particular non-limiting embodiment, about −1.2 volts is applied to the selected WL terminal 70, about +1.2 volts is applied to the selected BL terminal 74, about 0.0 volts is applied to selected SL terminal 72, about 0.0 volts or +1.2 volts is applied to selected CI terminal 86, and about 0.0 volts is applied to substrate terminal 78; while about 0.0 volts is applied to the unselected WL terminals 70, unselected BL terminals 74, unselected SL terminals 72, and substrate terminal 78, and 0.0 volts or +1.2 volts is applied to unselected CI terminals 86. These voltage levels are exemplary only may vary from embodiment to embodiment. Thus the exemplary embodiments, features, bias levels, etc., described are not limiting.

The negative bias on the gate 60 (connected to WL terminal 70) and the positive voltage on bit line region 18 (connected to BL terminal 74) create a strong electric field (for example, about $10^6$ V/cm in silicon, as described in Sze, p. 104) between the bit line region 18 and the floating body region 24 in the proximity of gate 60. This bends the energy band sharply upward near the gate 60 and bit line 18 junction overlap region, causing electrons to tunnel from the valence band of the bit line region 18 to the conduction band of the bit line region 18, leaving holes in the valence band. The electrons which tunnel across the energy band become the drain leakage current, while the holes are injected into floating body region 24 and become the hole charge that creates the logic-1 state.

Figure 49:
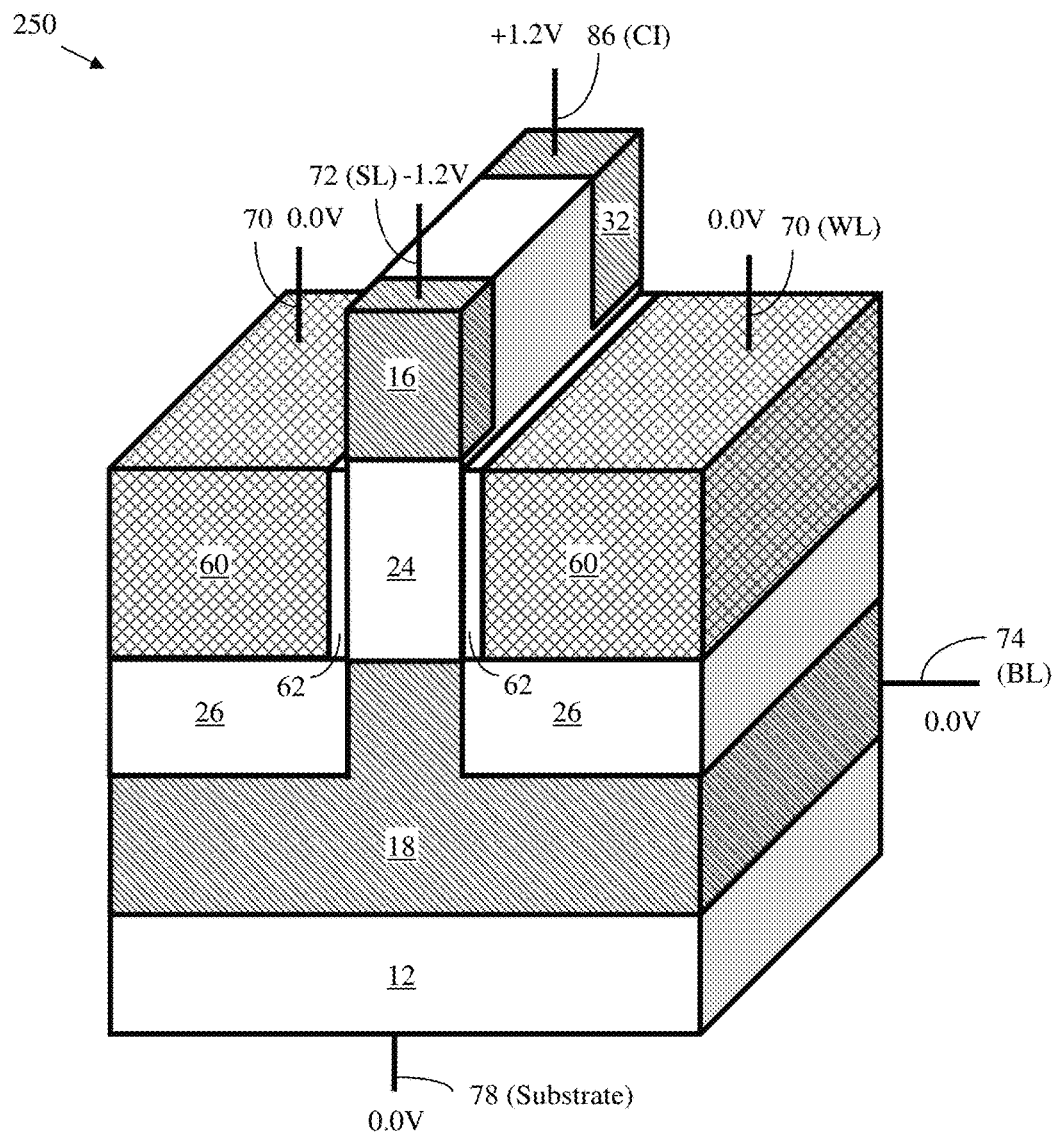
FIGS. 49 and 50 illustrate bias conditions applied on the terminals of a memory cell to perform a write logic-0 operation, according to an embodiment of the present invention.

FIG. 49 is a schematic illustration showing bias conditions for a write logic-0 operation performed on memory cell 250 according to an embodiment of the present invention. A write logic-0 operation can be performed by applying a negative voltage bias to the selected SL terminal 72, a zero voltage bias to the WL terminal 70, zero voltage bias to the BL terminal 74, zero or positive voltage bias to the CI terminal 86, and zero voltage bias to the substrate terminal 78; while zero voltage is applied to the unselected SL terminals 72, zero voltage is applied to the unselected BL terminals 74, zero voltage bias applied to the unselected WL terminals 70, zero or positive bias applied to the unselected CI terminals 86, and zero voltage bias applied to the substrate 78. Under these conditions, the p-n junction between floating body 24 and source line region 16 of the selected cell 250 is forward-biased, evacuating holes from the floating body 24. All memory cells 250 sharing the same selected SL terminal 72 will be written to simultaneously. To write arbitrary binary data to different memory cells 250, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72, about 0.0 volts is applied to WL terminal 70, about 0.0 volts is applied to BL terminal 74, about 0.0 volts or +1.2 volts is applied to CI terminal 86, and about 0.0 volts is applied to substrate terminal 78,while zero voltage is applied to the unselected SL terminals 72, zero voltage bias applied to the unselected WL terminals 70, zero or positive bias applied to the unselected CI terminal 86, zero voltage is applied to the unselected BL terminals 74 and zero voltage bias is applied to the substrate 78. These voltage levels are exemplary only may vary from embodiment to embodiment. Thus the exemplary embodiments, features, bias levels, etc., described are not limiting.

Figure 50:
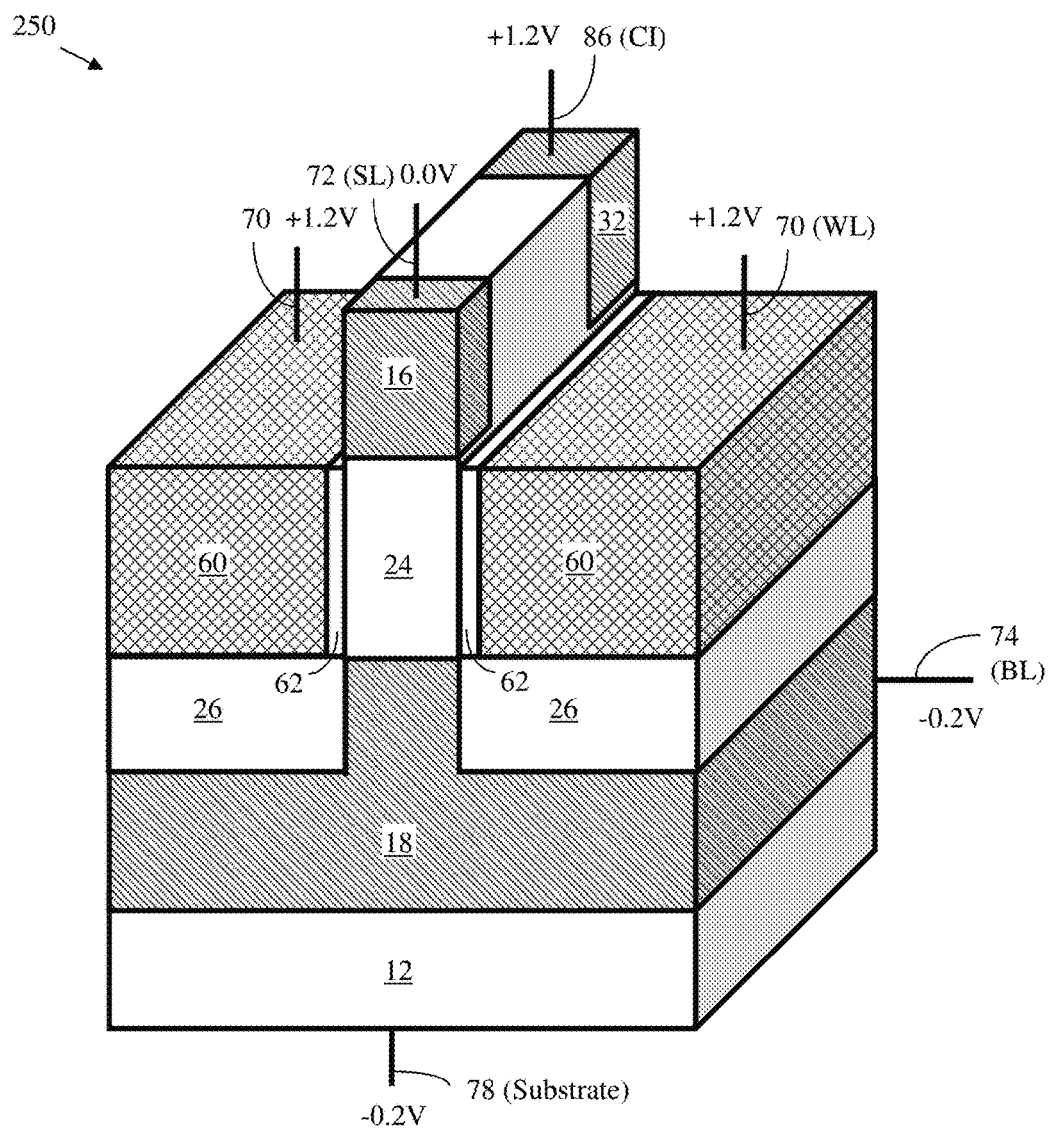

FIG. 50 is a schematic illustration showing bias conditions applied for a bit-selective write logic-0 operation performed on memory cell 250 according to an embodiment of the present invention. The bit-selective write logic-0 operation may be performed by applying a positive voltage to the selected WL terminal 70, a negative voltage to the selected BL terminal 74, zero voltage bias to the selected SL terminal 72, zero or positive voltage bias to the selected CI terminal 86, and a negative voltage to the selected substrate terminal 78; while zero voltage is applied to the unselected WL terminals 70, zero voltage is applied to the unselected BL terminals 74, zero voltage bias is applied to the unselected SL terminals 72, zero or positive voltage is applied to the unselected CI terminals 86, and zero voltage is applied to the unselected substrate terminals 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body region 24 and bit line region 18 is forward-biased, evacuating holes from the floating body 24.

To reduce undesired write logic-0 disturb to other memory cells 250 in a memory array, the applied potential can be optimized as follows: if the floating body 24 potential of state logic-1 is referred to as $V_{FB1}$, then the voltage applied to the WL terminal 70 is configured to increase the floating body 24 potential by $V_{FB1}/2$ while $-V_{FB1}/2$ is applied to BL terminal 74. Additionally, either ground or a slightly positive voltage may also be applied to the BL terminals 74 of unselected memory cells 250 that do not share the same BL terminal 74 as the selected memory cell 250a, while a negative voltage may also be applied to the WL terminals 70 of unselected memory cells 250 that do not share the same WL terminal 70 as the selected memory cell 250.

As illustrated in FIG. 50, the following exemplary bias conditions may be applied to the selected memory cell 50 to perform a bit-selective write logic-0 operation: a potential of about −0.2 volts to the selected BL terminal 74, a potential of about +1.2 volts to the selected WL terminal 70, about 0.0 volts is applied to the selected SL terminal 72, a potential of about +1.2 volts to the CI terminal 86, about −0.2 volts to the substrate terminal 78.

Figure 51:
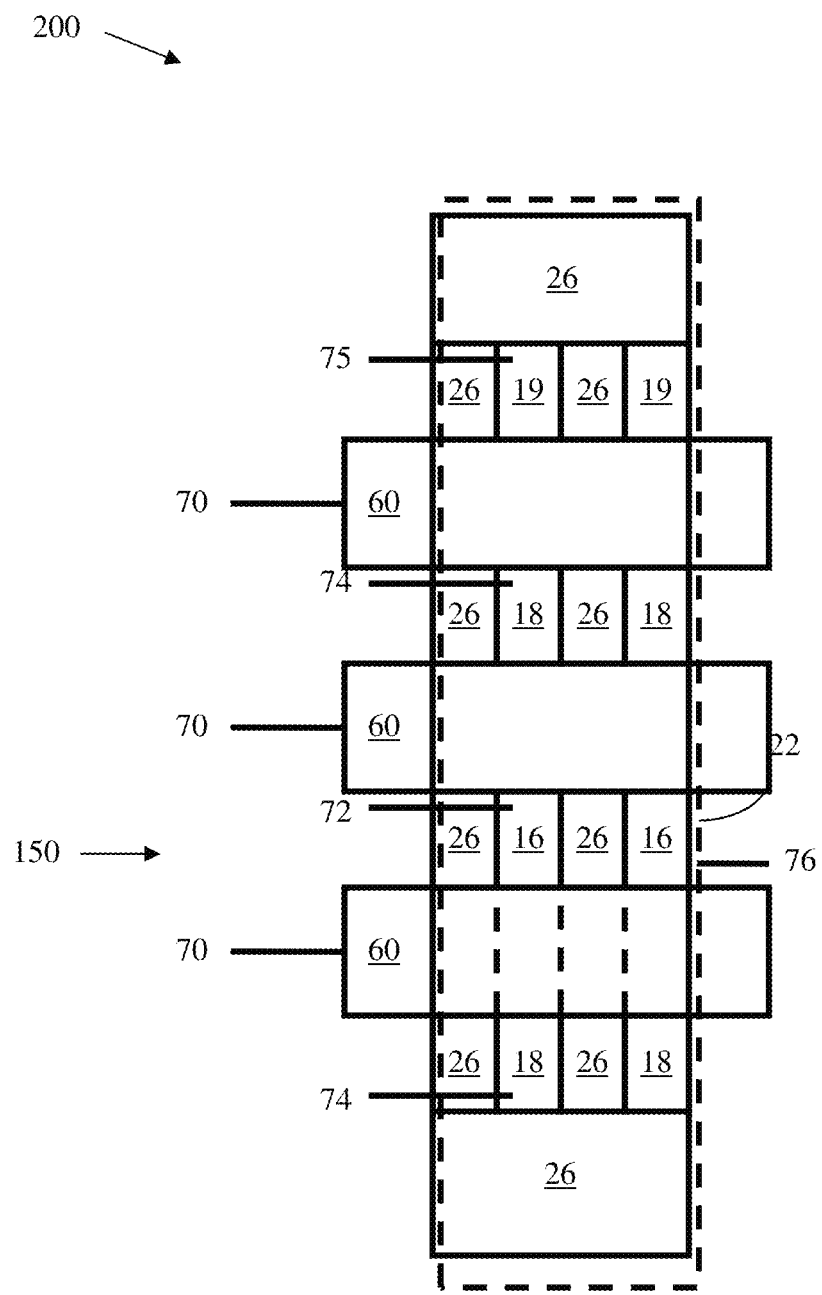
FIG. 51 is a schematic, top-view illustration of a multi-time programmable (MTP) memory cell according to another embodiment of the present invention.
Figure 52A:
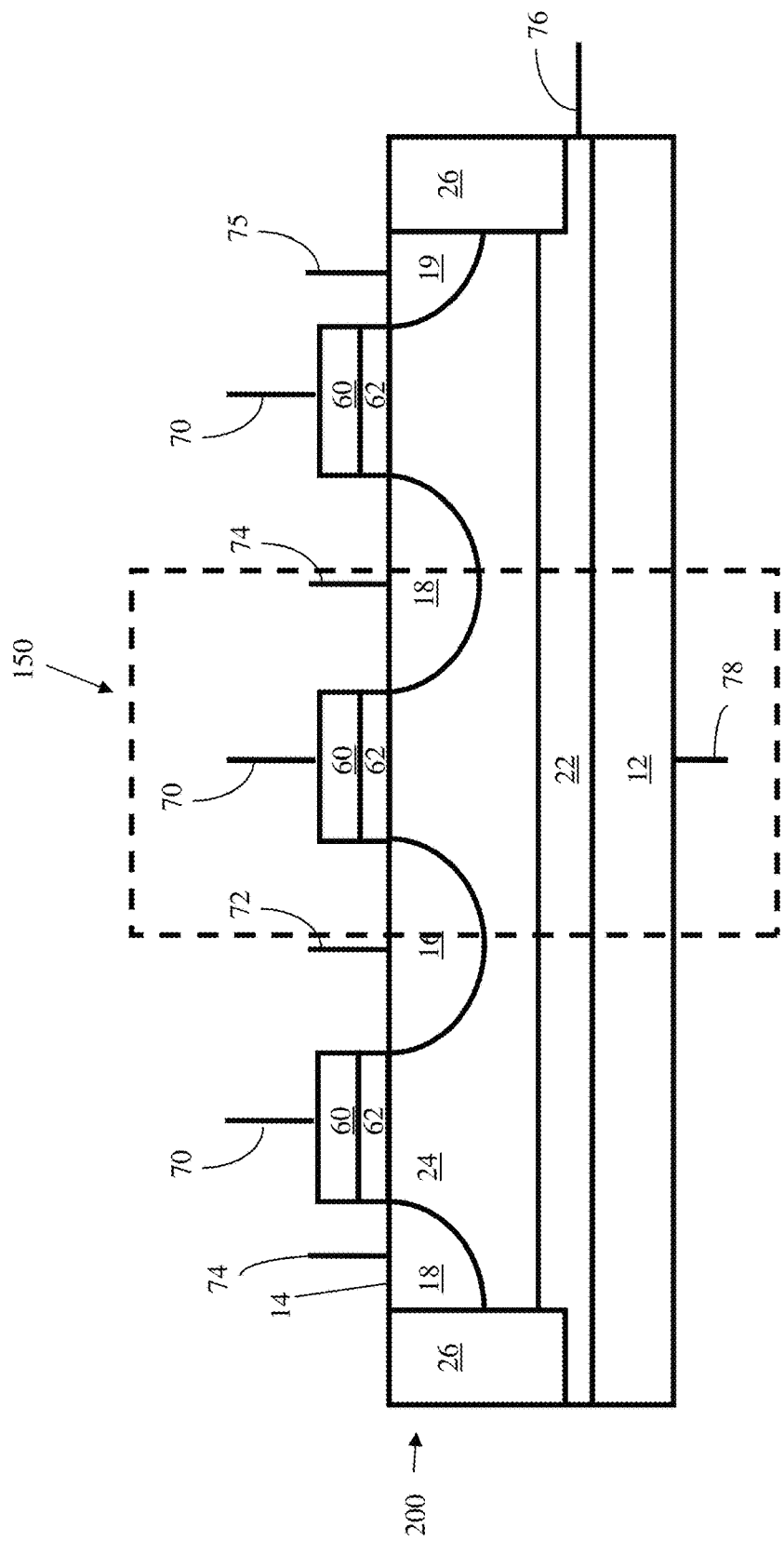
FIGS. 52A-52B are schematic, cross-sectional illustrations of an MTP memory cell shown in FIG. 51.
Figure 52B:
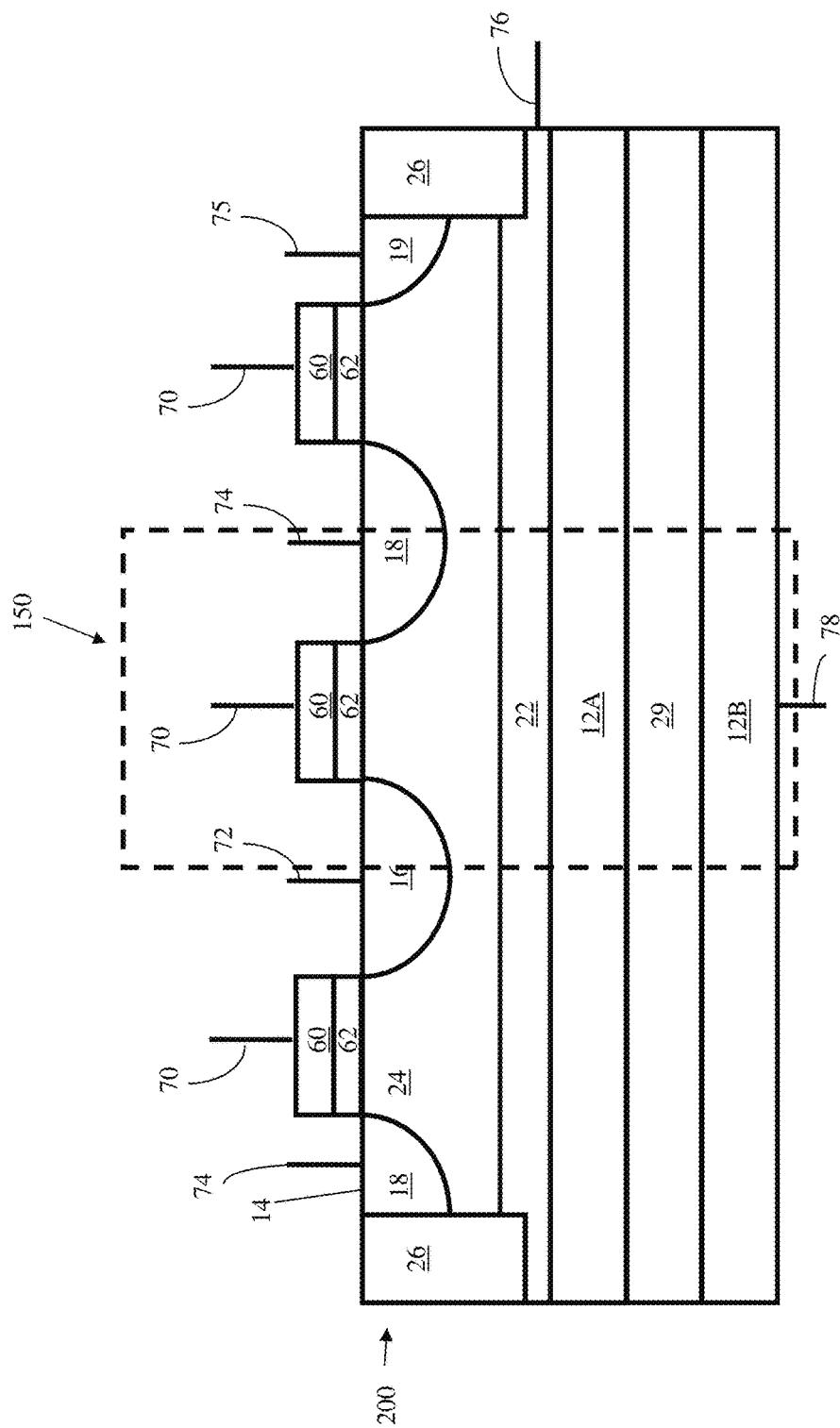

FIGS. 51 and 52A-52B illustrate a top-view and cross-sectional views, respectively, of an exemplary memory word 200, which comprises a plurality of memory cells 150 operating in a multi-time programmable mode according to another embodiment of the present invention. Two memory cells 150 are shown in the FIGS. 51 and 52A-52B. However, a memory word 200 may comprise one memory cell 150, or more than two memory cells 150, for example 16 memory cells 150.

As shown in FIG. 52A, memory cell 150 includes a substrate 12 of a first conductivity type such as p-type, for example (or, alternatively, n-type). Substrate 12 is typically made of silicon, but may also comprise, for example, germanium, silicon germanium, gallium arsenide, carbon nanotubes, and/or other semiconductor materials. In some embodiments of the invention, substrate 12 can be the bulk material of the semiconductor wafer. In another embodiment, as shown in FIG. 52B, substrate 12A of a first conductivity type (for example, p-type) can be a well of the first conductivity type embedded in a well 29 of the second conductivity type, such as n-type. The well 29 in turn can be another well inside substrate 12B of the first conductivity type (for example, p-type). In another embodiment, well 12A can be embedded inside the bulk of the semiconductor wafer of the second conductivity type (for example, n-type). These arrangements allow for segmentation of the substrate terminal, which is connected to region 12A. To simplify the description, the substrate 12 will usually be drawn as the semiconductor bulk material as it is in FIG. 51A.

Memory cell 150 also includes a buried layer region 22 of a second conductivity type, such as n-type, for example; a base region 24 of the first conductivity type, such as p-type, for example; and source/drain regions 16 and 18 of the second conductivity type, such as n-type, for example.

Buried layer 22 may be formed by an ion implantation process on the material of substrate 12. Alternatively, buried layer 22 can be grown epitaxially on top of substrate 12 or formed through a solid state diffusion process.

The base region 24 is common for all memory cells 150 in the memory word 200. The base region 24 of the first conductivity type is bounded on top by source line region 16, drain region 18, well-tap region 19, and insulating layer 62 (or by surface 14 in general), on the bottom by buried layer 22, and by insulating layer 26 at the edge of the memory word 200. Base region 24 may be the portion of the original substrate 12 above buried layer 22 if buried layer 22 is implanted. Alternatively, base region 24 may be epitaxially grown. Depending on how buried layer 22 and the base region 24 are formed, base region 24 may have the same doping as substrate 12 in some embodiments or a different doping, if desired in other embodiments.

A source line region 16 having a second conductivity type, such as n-type, for example, is provided in base region 24, so as to bound a portion of the top of the floating body region in a manner discussed above, and is exposed at surface 14. Source line region 16 may be formed by an implantation process on the material making up substrate 12, according to any implantation process known and typically used in the art. Alternatively, a solid state diffusion or a selective epitaxial growth process could be used to form source line region 16.

A bit line region 18, also referred to as drain region 18, having a second conductivity type, such as n-type, for example, is also provided in base region 24, so as to bound a portion of the top of the floating body region in a manner discussed above, and is exposed at cell surface 14. Bit line region 18 may be formed by an implantation process on the material making up substrate 12, according to any implantation process known and typically used in the art. Alternatively, a solid state diffusion or a selective epitaxial growth process could be used to form bit line region 18.

A gate 60 is positioned in between the source line region 16 and the drain region 18, above the base region 24. The gate 60 is insulated from the base region 24 by a dielectric layer 62. Dielectric layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Insulating layers 26 (like, for example, shallow trench isolation (STI)), may be made of silicon oxide, for example, though other insulating materials may be used. Insulating layers 26 insulate memory word 200 from adjacent memory word 200. The bottom of insulating layer 26 may reside inside the buried region 22 allowing buried region 22 to be continuous as shown in FIGS. 52A and 52B.

Cell 150 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate terminal 78 electrically connected to the substrate 12. Alternatively, the SL terminal 72 may be electrically connected to region 18 and BL terminal 74 may be electrically connected to region 16.

Memory word 200 also comprises a well-tap region 19 of first conductivity type, such as p-type, which is electrically connected to the well-tap (WELL) terminal 75.

The write logic-1 operation of the memory cell 150 is performed by inducing a soft breakdown of the gate dielectric layer 62. The write operation may be performed for example by applying the following bias conditions: a positive voltage to the gate electrode 60, a negative voltage to the base region 24 (through the WELL terminal 75), floating or zero voltage to both source and drain regions 16 and 18, and zero or positive voltage to the BW terminal 76, and zero voltage is applied to the substrate terminal 78.

In one particular non-limiting embodiment, about +3.0 volts is applied to the selected WL terminal 70, about −1.0 volts is applied to the WELL terminal 75, about 0.0 volts is applied to terminal SL 72, about 0.0 volts is applied to the selected BL terminal 74, about +1.2 volts is applied to terminal 76, and about 0.0 volts is applied to substrate terminal 78.

The read operation is performed by applying the following bias conditions: a positive voltage is applied to the selected WL terminal 70, a positive voltage is applied to the selected BL terminal 74, zero voltage is applied to the SL terminal 72, a positive voltage is applied to the BW terminal 76, zero voltage is applied to the substrate terminal 78, while WELL terminal 75 is left floating. A higher gate leakage current will flow from the gate 60 to the base region 24 when soft breakdown has happened on gate dielectric 62 compared to if the gate dielectric 62 has not had a soft breakdown.

Figure 52C:
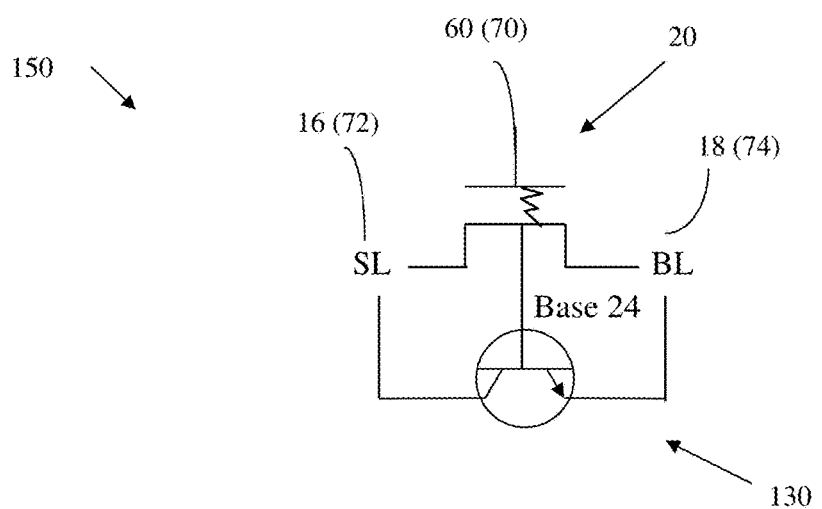
FIG. 52C illustrates an equivalent circuit representation of a memory cell of FIGS. 52A-52B.

FIG. 52C illustrates an equivalent circuit representation of the memory cell 150, which illustrates a bipolar device 130. The base current (from the gate 60) will be amplified by the bipolar device 130. As a result, a high current may be observed flowing from the BL terminal 74 to the SL terminal 72, which may be used to determine the state of the memory cell 150. A memory cell 150 where the gate dielectric 62 has had a soft breakdown will conduct a higher current (from the BL terminal 74 to the SL terminal 72). As a result, only a soft breakdown is needed, in contrast to the irreversible hard breakdown used in one-time programmable memory cell, for example as described in U.S. Pat. No. 6,667,902 to Jack Zezhong Peng, titled "Semiconductor memory cell and memory array using a breakdown phenomena in an ultrathin dielectric" and U.S. Pat. No. 7,402,855 to Wlodek Kurjanowicz, titled "Split-Channel Antifuse Array Architecture", both of which are hereby incorporated herein, in their entireties, by reference thereto. The voltage applied to the selected WL terminal 70 may be less than the threshold voltage of the memory cell 150 to reduce the current flow from the channel region near the surface 14.

In one particular non-limiting embodiment, about +0.4 volts is applied to the selected WL terminal 70, about 0.0 volts is applied to terminal SL 72, about +1.2 volts is applied to the selected BL terminal 74, about +1.2 volts is applied to terminal 76, and about 0.0 volts is applied to terminal 78, while WELL terminal 75 is left floating.

The write logic-1 operation may also be performed by first applying a positive voltage applied to the WL terminal 70, followed by a measurement of the bipolar current from the BL terminal 74 to the SL terminal 72, referred as verification process. If the soft breakdown is not observed yet, a higher voltage is applied to the WL terminal 70, followed by another verification process. Once the target bipolar current level is reached, the write operation is terminated. Because the WL voltage is applied gradually, this avoids the undesired hard breakdown of the gate dielectric 62.

The soft breakdown can be recovered by applying a voltage with opposite polarity as the write operation. This operation (which will be referred to as a reset operation or write logic-0 operation) may be performed by applying the following bias conditions: a negative voltage is applied to the selected WL terminal 70, zero voltage is applied to the selected WELL terminal 75, floating or zero voltage is applied to both source and drain regions 16 and 18, zero or positive voltage is applied to the BW terminal 76, and zero voltage is applied to the substrate terminal 78.

Memory cells 150 will still function under soft breakdown condition (in contrast to the hard breakdown of the gate dielectric 62, which effectively short the gate electrode 60 to the base region 24). As a result, the reset and write operations may be performed multiple times to the memory cells 150 and memory cells 150 may operate as multi time programmable memory device.

In order to reduce the effect of a neighboring cell, the read operation may be limited to only one selected memory cell 150 for each memory word 200.

From the foregoing it can be seen that a memory cell having an electrically floating body has been described. While the foregoing written description of the invention enables one of ordinary skill to make and use what is That which is claimed is:

1. A method of operating an array of semiconductor memory cells, the array comprising at least two memory sub-arrays, each memory sub-array comprising:
   a plurality of said semiconductor memory cells arranged in at least one column and at least one row, each said semiconductor memory cell comprising:
      a floating body region configured to be charged to a level indicative of a state of the memory cell;
      a first region in electrical contact with said floating body region, located at a surface of said floating body region;
      a second region in electrical contact with said floating body region, located at a surface of said floating body region, spaced apart from said first region;
      a gate positioned between said first region and said second region; and
      a third region in electrical contact with said floating body region, located below said floating body region;
   said method comprising:
   selecting said third region of at least one of said semiconductor memory cells in at least one of said at least two memory sub-arrays; and
   operating said at least one of said memory sub-arrays independently of operation of a remainder of said at least two memory sub-arrays not selected.

2. The method of operating an array of semiconductor memory cells of claim 1, wherein said selecting at least one of said at least two memory sub-arrays is performed by applying a first bias condition to said at least one of said memory sub-arrays and a second bias condition to at least one of said at least two memory sub-arrays not selected, wherein said first bias condition is different from said second bias condition.

3. The method of operating an array of semiconductor memory cells of claim 1, further comprising applying a bias to said third region within one of said at least two memory sub-arrays to maintain states of said semiconductor memory cells in said one of said at least two memory sub-arrays.

4. The method of operating an array of semiconductor memory cells of claim 1, further comprising applying a first ramp rate for reading said state of a memory cell in said array and applying a second ramp rate for writing said state to said memory cell, wherein said first ramp rate is different from said second ramp rate.

5. The method of operating an array of semiconductor memory cells of claim 4, wherein said first ramp rate is lower than said second ramp rate.

6. A method of operating an array of semiconductor memory cells, the array comprising a plurality of said semiconductor memory cells arranged in at least one column and at least one row, each said semiconductor memory cell comprising:
   a floating body region configured to be charged to a level indicative of a state of the memory cell; and
   a buried well region contacting said floating body region;
   said method comprising:
   selecting at least one of said at least one column or at least one row; and
   selecting at least one of said buried well regions; and
   disabling at least one of said plurality of said semiconductor cells not located in the at least one column or at least one row having been selected;
   wherein said disabling comprises removing a bias from said buried well region contacting said floating body region of said at least one of said plurality of said semiconductor cells not located in the at least one column or at least one row having been selected.

7. The method of claim 6, comprising maintaining a bias to said at least one of said buried well regions that was selected.

8. The method of claim 6, further comprising performing an operation on at least one of said semiconductor memory cells having been selected by said selecting.

9. The method of claim 6, further comprising applying a bias to said buried well region to maintain states of said semiconductor memory cells that have not been disabled.

10. The method of claim 6, further comprising applying a first ramp rate for reading said state of a memory cell, and a second ramp rate for writing said memory cell, wherein said first ramp rate is different from said second ramp rate.

11. The method of claim 10, wherein first ramp rate is lower than said second ramp rate.

* * * * *